(12) United States Patent
Lai et al.

(10) Patent No.: US 11,600,234 B2
(45) Date of Patent: Mar. 7, 2023

(54) DISPLAY SUBSTRATE AND DRIVING METHOD THEREOF

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Weilin Lai, Beijing (CN); Yucheng Chan, Beijing (CN); Jianbang Huang, Beijing (CN); Dachao Li, Beijing (CN); Shengji Yang, Beijing (CN); Pengcheng Lu, Beijing (CN); Kuanta Huang, Beijing (CN); Xiaochuan Chen, Beijing (CN); Xue Dong, Beijing (CN); Hui Wang, Beijing (CN); Yanming Wang, Beijing (CN); Chen Xu, Beijing (CN); Dacheng Zhang, Beijing (CN); Yongfa Dong, Beijing (CN); Qing Wang, Beijing (CN); Hui Tong, Beijing (CN); Yunlong Li, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 243 days.

(21) Appl. No.: 16/814,119

(22) Filed: Mar. 10, 2020

(65) Prior Publication Data
US 2020/0211477 A1 Jul. 2, 2020

Related U.S. Application Data

(63) Continuation-in-part of application No. 15/521,612, filed as application No. PCT/CN2016/101999 on Oct.
(Continued)

(30) Foreign Application Priority Data

Oct. 15, 2015 (CN) .......................... 201510665742.0

(51) Int. Cl.
*H01L 27/32* (2006.01)
*G09G 3/3291* (2016.01)
(Continued)

(52) U.S. Cl.
CPC ......... *G09G 3/3291* (2013.01); *G09G 3/3258* (2013.01); *G09G 3/3266* (2013.01); *H01L 27/3276* (2013.01)

(58) Field of Classification Search
CPC .... G09G 3/3258; G09G 3/3266; H01L 27/32; H01L 27/322; H01L 27/323; H01L 27/324; H01L 27/326; H01L 27/327
(Continued)

(56) References Cited

U.S. PATENT DOCUMENTS 5,592,318 A 1/1997 Majima et al.
5,830,787 A 11/1998 Kim
(Continued)

FOREIGN PATENT DOCUMENTS

CN 1530878 A 9/2004
CN 101833186 A 9/2010
(Continued)

OTHER PUBLICATIONS

Japanese Office Action in Japanese Application No. 2017-521204, dated Jan. 20, 2021 with English translation.
(Continued)

*Primary Examiner* — Fazli Erdem
(74) *Attorney, Agent, or Firm* — Collard & Roe, P.C.

(57) ABSTRACT

A display substrate and a driving method thereof are provided. The display substrate includes a base substrate con-
(Continued)

taining a monocrystalline silicon layer, a thickness of the monocrystalline silicon layer being less than that of the base substrate; an array circuit layer, disposed on the base substrate and including a plurality of transistors, each of which has an active layer inside the monocrystalline silicon layer; and a plurality of light-emitting elements, located at a side of the array circuit layer away from the base substrate. The array circuit layer includes a scan driving circuit, a data driving circuit and a plurality of pixel sub-circuits, and the plurality of pixel sub-circuits are connected to the plurality of light-emitting elements, respectively, to form a plurality of sub-pixels.

44 Claims, 33 Drawing Sheets

Related U.S. Application Data 13, 2016, now Pat. No. 10,622,427, and a continuation-in-part of application No. PCT/CN2019/102314, filed on Aug. 23, 2019, and a continuation-in-part of application No. PCT/CN2019/102293, filed on Aug. 23, 2019, and a continuation-in-part of application No. PCT/CN2019/102307, filed on Aug. 23, 2019, and a continuation-in-part of application No. PCT/CN2019/102308, filed on Aug. 23, 2019, and a continuation-in-part of application No. PCT/CN2019/102309, filed on Aug. 23, 2019, and a continuation-in-part of application No. PCT/CN2019/102310, filed on Aug. 23, 2019, and a continuation-in-part of application No. PCT/CN2019/102819, filed on Aug. 27, 2019.

(51) Int. Cl.
*G09G 3/3258* (2016.01)
*G09G 3/3266* (2016.01)

(58) Field of Classification Search
USPC .......................................................... 257/40
See application file for complete search history.

(56) References Cited

U.S. PATENT DOCUMENTS

| | | | |
|---|---|---|---|
| 5,898,322 A | 4/1999 | Kubota et al. | |
| 5,960,268 A | 9/1999 | Aihara | |
| 6,040,208 A | 3/2000 | Honeycutt et al. | |
| 6,274,421 B1 | 8/2001 | Hsu et al. | |
| 7,336,270 B2 | 2/2008 | Sato | |
| 7,361,534 B2 | 4/2008 | Pelella | |
| 7,432,146 B2 | 10/2008 | Yamamoto | |
| 7,723,725 B2 | 5/2010 | Yamazaki et al. | |
| 7,838,883 B2 | 11/2010 | Yamazaki et al. | |
| 8,017,945 B2 | 9/2011 | Yamazaki et al. | |
| 8,513,678 B2 | 8/2013 | Yamazaki | |
| 8,772,766 B2 | 7/2014 | Yamazaki et al. | |
| 9,023,678 B2 | 5/2015 | Heo et al. | |
| 9,236,408 B2 | 1/2016 | Yamazaki | |
| 9,401,112 B2 | 7/2016 | Ohara et al. | |
| 9,431,574 B2 | 8/2016 | Yamazaki | |
| 9,711,549 B2 | 7/2017 | Yamazaki et al. | |
| 9,721,509 B2 | 8/2017 | Kim et al. | |
| 9,748,292 B2 | 8/2017 | Yamazaki | |
| 9,859,439 B2 | 1/2018 | Miyairi | |
| 9,875,690 B2 | 1/2018 | Wang et al. | |
| 10,050,062 B2 | 8/2018 | Sasagawa et al. | |
| 10,147,747 B2* | 12/2018 | Toriumi | H01L 23/53295 |
| 10,796,641 B2 | 10/2020 | Yang et al. | |
| 11,037,529 B2 | 6/2021 | Wang | |
| 11,322,082 B2 | 5/2022 | Hu et al. | |
| 2002/0084463 A1 | 7/2002 | Sanford et al. | |
| 2002/0179908 A1 | 12/2002 | Arao | |
| 2003/0025659 A1 | 2/2003 | Kondo et al. | |
| 2003/0030144 A1 | 2/2003 | Ono et al. | |
| 2003/0153155 A1 | 8/2003 | Wang et al. | |
| 2005/0056832 A1 | 3/2005 | Yamazaki et al. | |
| 2005/0173761 A1 | 8/2005 | Takafuji et al. | |
| 2005/0245046 A1 | 11/2005 | Takafuji et al. | |
| 2006/0170634 A1 | 8/2006 | Kwak et al. | |
| 2006/0205166 A1 | 9/2006 | Ishikiriyama | |
| 2007/0164290 A1 | 7/2007 | Yamazaki et al. | |
| 2007/0295961 A1 | 12/2007 | Kim | |
| 2008/0142807 A1 | 6/2008 | Choe et al. | |
| 2008/0169757 A1 | 7/2008 | Chang et al. | |
| 2008/0191603 A1 | 8/2008 | Kubota | |
| 2008/0210928 A1 | 9/2008 | Abe et al. | |
| 2009/0114926 A1 | 5/2009 | Yamazaki | |
| 2009/0152625 A1 | 6/2009 | Lee et al. | |
| 2010/0025664 A1 | 2/2010 | Park | |
| 2011/0233553 A1 | 9/2011 | Sakakura et al. | |
| 2012/0007848 A1 | 1/2012 | Han et al. | |
| 2012/0105421 A1 | 5/2012 | Tsai et al. | |
| 2012/0235973 A1 | 9/2012 | Yoo | |
| 2013/0001601 A1 | 1/2013 | Lee et al. | |
| 2013/0328753 A1 | 12/2013 | Tsuge | |
| 2014/0034982 A1 | 2/2014 | Yamazaki | |
| 2014/0131717 A1 | 5/2014 | Qi et al. | |
| 2014/0159021 A1 | 6/2014 | Song et al. | |
| 2014/0299867 A1 | 10/2014 | Ono et al. | |
| 2014/0312334 A1 | 10/2014 | Yamazaki et al. | |
| 2014/0361276 A1 | 12/2014 | Hsu et al. | |
| 2014/0367652 A1 | 12/2014 | Cho et al. | |
| 2015/0108470 A1* | 4/2015 | Yamazaki | H01L 27/1225 257/43 |
| 2015/0108475 A1* | 4/2015 | Ando | H01L 21/0217 257/43 |
| 2015/0115224 A1 | 4/2015 | Kou | |
| 2015/0270326 A1 | 9/2015 | Hekmatshoartabari et al. | |
| 2015/0348997 A1 | 12/2015 | Sasagawa et al. | |
| 2016/0172431 A1 | 6/2016 | Huang et al. | |
| 2016/0181350 A1 | 6/2016 | Lee | |
| 2016/0275870 A1 | 9/2016 | Kimura et al. | |
| 2016/0293105 A1 | 10/2016 | Wang et al. | |
| 2016/0327842 A1 | 11/2016 | Qiao et al. | |
| 2016/0351589 A1 | 12/2016 | Sasagawa et al. | |
| 2016/0372711 A1 | 12/2016 | Song et al. | |
| 2017/0047004 A1 | 2/2017 | Yoon et al. | |
| 2017/0092707 A1 | 3/2017 | Wang | |
| 2017/0193879 A1 | 7/2017 | Wang | |
| 2017/0236885 A1 | 8/2017 | Koshihara et al. | |
| 2017/0301293 A1 | 10/2017 | Zhu et al. | |
| 2018/0102092 A1 | 4/2018 | Kubota et al. | |
| 2018/0151827 A1 | 5/2018 | Kang et al. | |
| 2018/0212011 A1 | 7/2018 | Lai et al. | |
| 2019/0251905 A1 | 8/2019 | Yang et al. | |
| 2019/0386074 A1 | 12/2019 | Li et al. | |
| 2020/0082757 A1 | 3/2020 | Yuan et al. | |
| 2021/0233968 A1 | 7/2021 | Yang et al. | |

FOREIGN PATENT DOCUMENTS

| | | |
|---|---|---|
| CN | 101980330 A | 2/2011 |
| CN | 102760841 A | 10/2012 |
| CN | 102983155 A | 3/2013 |
| CN | 103022079 A | 4/2013 |
| CN | 203026507 U | 6/2013 |
| CN | 103403787 A | 11/2013 |
| CN | 103440840 A | 12/2013 |
| CN | 103515413 A | 1/2014 |
| CN | 104025707 A | 9/2014 |
| CN | 104201190 A | 12/2014 |
| CN | 104240633 A | 12/2014 |
| CN | 104299572 A | 1/2015 |
| CN | 104332561 A | 2/2015 |
| CN | 104380368 A | 2/2015 |
| CN | 104681624 A | 6/2015 |
| CN | 105185816 A | 12/2015 |
| CN | 105225633 A | 1/2016 |
| CN | 204966501 U | 1/2016 |

(56) References Cited

FOREIGN PATENT DOCUMENTS

| | | |
|---|---|---|
| CN | 105304679 A | 2/2016 |
| CN | 106159100 A | 11/2016 |
| CN | 205789046 U | 12/2016 |
| CN | 107086237 A | 8/2017 |
| CN | 107103878 A | 8/2017 |
| CN | 107424570 A | 12/2017 |
| CN | 107591125 A | 1/2018 |
| CN | 107768385 A | 3/2018 |
| CN | 107799577 A | 3/2018 |
| CN | 109036279 A | 12/2018 |
| CN | 109119027 A | 1/2019 |
| CN | 109215549 A | 1/2019 |
| CN | 109509430 A | 3/2019 |
| CN | 109904347 A | 6/2019 |
| CN | 110071229 A | 7/2019 |
| EP | 1 096 571 A2 | 5/2001 |
| JP | H06-347828 A | 12/1994 |
| JP | 2001-195016 A | 7/2001 |
| JP | 2001-332383 A | 11/2001 |
| JP | 2007-156058 A | 6/2007 |
| JP | 2008-153191 A | 7/2008 |
| JP | 2009-003435 A | 1/2009 |
| JP | 2009-016410 A | 1/2009 |
| JP | 2011-181938 A | 9/2011 |
| KR | 10-2008-0101732 A | 11/2008 |
| KR | 10-1645404 B1 | 8/2016 |
| KR | 10-2017-0005252 A | 1/2017 |

OTHER PUBLICATIONS

Chinese Office Action in Chinese Application No. 201980001517.3 dated Sep. 1, 2021 with English translation.
U.S. Office Action in U.S. Appl. No. 16/916,671 dated Oct. 1, 2021.
Japanese Office Action in Japanese Patent Application No. 2017-521204, dated Jun. 8, 2020 with English translation.
International Search Report of PCT/CN2019/102314 in Chinese, dated May 27, 2020, with English translation.
Notice of Transmittal of the International Search Report of PCT/CN2019/102314 in Chinese, dated May 27, 2020.
Written Opinion of the International Searching Authority of PCT/CN2019/102314 in Chinese, dated May 27, 2020 with English translation.
International Search Report of PCT/CN2019/102293 in Chinese, dated Apr. 26, 2020, with English translation.
Notice of Transmittal of the International Search Report of PCT/CN2019/102293 in Chinese, dated Apr. 26, 2020.
Written Opinion of the International Searching Authority of PCT/CN2019/102293 in Chinese, dated Apr. 26, 2020 with English translation.
International Search Report of PCT/CN2019/102307 in Chinese, dated May 26, 2020, with English translation.
Notice of Transmittal of the International Search Report of PCT/CN2019/102307 in Chinese, dated May 26, 2020.
Written Opinion of the International Searching Authority of PCT/CN2019/102307 in Chinese, dated May 26, 2020 with English translation.
International Search Report of PCT/CN2019/102819 in Chinese, dated May 26, 2020, with English translation.
Notice of Transmittal of the International Search Report of PCT/CN2019/102819 in Chinese, dated May 26, 2020.
Written Opinion of the International Searching Authority of PCT/CN2019/102819 in Chinese, dated May 26, 2020 with English translation.
English translation of International Search Report of PCT/CN2016101999, dated Jan. 18, 2017.
English Translation of Notice of Transmittal of the International Search Report of PCT/CN2016101999 dated Jan. 18, 2017.
English Translation of Written Opinion of the International Searching Authority of PCT/CN2016101999 dated Jan. 18, 2017.
English Translation International Preliminary Report on Patentability of PCT/CN2016101999, dated Apr. 17, 2018 and Written Opinion of the International Searching Authority of PCT/CN2016101999, dated Jan. 18, 2017 with English translation.
Non-Final Office Action of U.S. Appl. No. 15/521,612, dated Jul. 6, 2018.
Non-Final Office Action of U.S. Appl. No. 15/521,612, dated Mar. 29, 2019.
Final Office Action of U.S. Appl. No. 15/521,612, dated Jan. 14, 2019.
Final Office Action of U.S. Appl. No. 15/521,612, dated Oct. 1, 2019.
Extended European Search Report in EP Application No. 16852868.5 dated May 9, 2019.
Korean Office Action in KR Application No. 10-2017-7009789 dated Aug. 20, 2018 with English Translation.
Korean Notice of Allowance in KR Application No. 10-2019-7009729 dated May 8, 2019 with English Translation.
Office Action in U.S. Appl. No. 16/959,398 dated Nov. 26, 2021.
Office Action in U.S. Appl. No. 16/812,619 dated Jan. 7, 2022.
Indian Office Action in Indian Application No. 202017056357 dated Mar. 29, 2022 with English translation.
Indian Office Action in Indian Application No. 202017056072 dated Apr. 7, 2022 with English translation.
U.S. Final Office Action in U.S. Appl. No. 16/916,671 dated Feb. 24, 2022.
U.S. Non-Final Office Action in U.S. Appl. No. 16/959,757 dated May 27, 2022.
U.S. Office Action in U.S. Appl. No. 16/812,619 dated May 16, 2022.
Chinese Office Action in Chinese Application No. 201980001452.2 dated May 11, 2022 with English translation.
Extended European Search Report in European Application No. 19931503.7 dated May 30, 2022.
Extended European Search Report in European Application No. 19933233.9 dated Jul. 13, 2022.
Extended European Search Report in European Application No. 19932239.7 dated Aug. 1, 2022.
Extended European Search Report in European Application No. 19933232.1 dated Sep. 6, 2022.

* cited by examiner

DISPLAY SUBSTRATE AND DRIVING METHOD THEREOF

CROSS-REFERENCES TO RELATED APPLICATION

This application is a continuation in part application of Ser. No. 15/521,612 filed on Apr. 24, 2017, wherein that application is a national stage application of PCT/CN2016/101999 filed on Oct. 13, 2016, wherein the international application claims priority under 35 U.S.C 119 to CN 201510665742.0 filed on Oct. 15, 2015. This application is also a continuation in part application of PCT/CN2019/102314 filed on Aug. 23, 2019. This application is also a continuation in part application of PCT/CN2019/102293 filed on Aug. 23, 2019. This application is also a continuation in part application of PCT/CN2019/102307 filed on Aug. 23, 2019. This application is also a continuation in part application of PCT/CN2019/102308 filed on Aug. 23, 2019. This application is also a continuation in part application of PCT/CN2019/102309 filed on Aug. 23, 2019. This application is also a continuation in part application of PCT/CN2019/102310 filed on Aug. 23, 2019. This application is also a continuation in part application of PCT/CN2019/102819 filed on Aug. 27, 2019. The disclosures of all of these applications are hereby incorporated herein by reference in their entirety.

TECHNICAL FIELD

The disclosure relates a display substrate and a driving method thereof.

BACKGROUND

With an increasingly high need among customers for audio and video electronics products, the development of high-resolution and high-quality display devices has become a trend among manufacturers.

Due to its advantages such as self-illumination, high brightness, wide viewing angle, fast response time, and allowance to manufacture R, G and B full-color components, AMOLED has been regarded as one important next-generation display panel technology. In current markets, there have been audio panels and mobile phones employing small and medium size AMOLED as display panels, and it is expected that application of AMOLED can be expanded to other fields, especially the large-area display panels including mobile products, notebook computers, monitors, wall-hanging TV, etc.

The AMOLED technologies have transitioned from amorphous silicon thin film transistor (TFT) glass substrates to polycrystalline silicon thin film transistor glass substrates, and especially to low-temperature polycrystalline silicon thin film transistor glass substrates, currently the mainstream technology. The "low temperature" refers to a fabrication process temperature of below 600° C. During this process, excimer lasers are employed as a heat source; after passing through the projection system, laser beams with uniform energy distribution are produced, which project on the glass substrate with an amorphous-silicon structure. Atoms of the amorphous silicon thin film are rearranged upon absorption of the laser energy, so as to form a polysilicon structure with reduced defects, which has a high electron mobility of 50-300 $cm^2$/v-sec.

As such, the thin film transistor components can be manufactured to be smaller, resulting in increased aperture ratio, improved light transmittance of the panel, and reduced power consumption. Therefor compared with the amorphous silicon technology, a low-temperature polycrystalline silicon thin film transistor display has a carrier mobility rate of more than a hundred times, has a lower power consumption, a higher brightness, and a higher resolution, and is also lighter, thinner, smaller, of higher quality, and easier to implement integration of the driving circuit module.

As for the integration of the driving circuit module as mentioned above, a scan (gate) drive circuit, or a scan (gate) driver, is integrated at a glass substrate along with a TFT array, through a process called GOA (Gate driver On Array) or GOP (Gate driver On Panel).

The GOA technology integrates scan drive circuit into an array substrate, to thereby remove the need for a dedicated scan drive integrated circuit. As such, GOA technology can potentially save materials, simplify manufacturing processes, and reduce manufacturing cost.

SUMMARY

At least one embodiment of the disclosure provides a display substrate comprising: a base substrate, comprising a monocrystalline silicon layer, a thickness of the monocrystalline silicon layer being less than that of the base substrate; an array circuit layer, disposed on the base substrate and comprising a plurality of transistors, each of which has an active layer inside the monocrystalline silicon layer; and a plurality of light-emitting elements, located at a side of the array circuit layer away from the base substrate, wherein the display substrate comprises a display area and a peripheral area located at a periphery of the display area, the peripheral area comprises a first peripheral area and a second peripheral area, and the array circuit layer comprises a scan driving circuit located in the first peripheral area and a data driving circuit located in the second peripheral area, and a plurality of pixel sub-circuits located in the display area, and the plurality of pixel sub-circuits are connected to the plurality of light-emitting elements, respectively, to form a plurality of sub-pixels, the array circuit layer comprises a plurality of scan lines and a plurality of data lines, the scan driving circuit is connected to the plurality of pixel sub-circuits through the plurality of scan lines, and the data driving circuit is connected to the plurality of pixel sub-circuits through the plurality of data lines, wherein the array circuit layer comprises the active layer in the monocrystalline silicon layer, and a first insulating layer, a first conductive layer, a second insulating layer, and a second conductive layer that are sequentially disposed on the base substrate, the first conductive layer comprises a gate electrode of each of the plurality of transistors, the second conductive layer comprises a source electrode of each of the plurality of transistors and a drain electrode of each of the plurality of transistors, a plurality of first vias are provided in the second insulating layer, and the source electrode and the drain electrode of each of the plurality of transistors are connected to the active layer in the monocrystalline silicon layer through the plurality of first vias, respectively.

In one example, the base substrate is a monocrystalline silicon substrate, and the monocrystalline silicon layer is a portion of the monocrystalline silicon substrate at a side close to the plurality of light-emitting elements.

In one example, the display substrate further comprises: a first reflective electrode, located at a side of each of the light-emitting elements close to the base substrate, wherein the light-emitting element comprises a first electrode layer, an organic light-emitting functional layer, and a second electrode layer that are sequentially stacked in a direction from a position close to the base substrate to a position away from the base substrate, an orthographic projection of the first reflective electrode on the base substrate is at least partially overlapped with an orthographic projection of the first electrode layer on the base substrate; and a third insulating layer, located between the first reflective electrode and the first electrode layer, wherein the third insulating layer is a light transmission layer.

In one example, the display substrate further comprises: a plurality of second reflective electrodes located in the peripheral area of the display substrate and a light-blocking layer located at a side of the plurality of second reflective electrodes away from the base substrate, wherein the second reflective electrode is provided in the same layer as the first reflective electrode.

In one example, the third insulating layer comprises a first opening exposing the first reflective electrode, and at least a portion of the first electrode layer passes through the first opening to be electrically connected to the first reflective electrode; or the first reflective electrode is separated from the first electrode layer by the third insulating layer and is insulated from the first electrode layer.

In one example, each of the first reflective electrode and the second reflective electrode comprise a metal layer and at least one protective layer that is stacked with the metal layer and is disposed at a side of the metal layer close to the base substrate.

In one example, the third insulating layer is a silicon nitride layer, and the silicon nitride layer is in direct contact with the first reflective electrode.

In one example, a deposition temperature of the silicon nitride layer is in a range of 70-100° C.

In one example, the deposition temperature of the silicon nitride layer is in a range of 80-85° C.

In one example, a thickness of the silicon nitride layer is in a range of 50-100 Å.

In one example, a material of the first reflective electrode comprises a metal material containing silver or aluminum.

In one example, a thickness of the first reflective electrode is in a range of 300-500 Å.

In one example, a surface roughness of a structure including the first reflective electrode, the silicon nitride layer and the first electrode layer is less than 3.0 nm.

In one example, the pixel sub-circuit comprises a driving circuit, a voltage transmission circuit and a data writing circuit; the driving circuit comprises a control terminal, a first terminal and a second terminal; the voltage transmission circuit is configured to apply a reset voltage and a first power voltage to the first terminal of the driving circuit respectively in response to a transmission control signal; the data writing circuit is configured to write a data signal to the control terminal of the driving circuit in response to a scan signal and store the written data signal; the driving circuit is configured to control a voltage on the second terminal of the driving circuit based on the data signal on the control terminal of the driving circuit and a voltage on the first terminal of the driving circuit, and generate a driving current for driving the light-emitting element to emit light based on the voltage on the second terminal of the driving circuit; and the data writing circuit comprises two switching transistors of different types.

In one example, the array circuit layer further comprises a voltage control circuit located in the peripheral area of the array substrate, and the voltage control circuit is configured to supply the reset voltage to the voltage transmission circuit in response to a reset control signal and supply the first power voltage to the voltage transmission circuit in response to a light-emitting control signal.

In one example, the voltage control circuit comprises a first control sub-circuit and a second control sub-circuit, the first control sub-circuit is configured to apply the reset voltage to the voltage transmission circuit in response to the reset control signal, and the second control sub-circuit is configured to apply the first power voltage to the voltage transmission circuit in response to the light-emitting control signal.

In one example, the first control sub-circuit comprises a first switching transistor, and the second control sub-circuit comprises a second switching transistor; a gate electrode of the first switching transistor is connected to a reset control signal terminal to receive the reset control signal, a first electrode of the first switching transistor is connected to a reset voltage terminal to receive the reset voltage, and the second electrode of the first switching transistor is connected to a first node; and a gate electrode of the second switching transistor is connected to a light-emitting control signal terminal to receive the light-emitting control signal, a first electrode of the second switching transistor is connected to a first power supply terminal to receive the first power voltage, and the second electrode of the second switching transistor is connected to the first node.

In one example, the voltage transmission circuit comprises a third switching transistor, a gate electrode of the third switching transistor is connected to a transmission control signal terminal to receive the transmission control signal, a first electrode of the third switching transistor is connected to the first node, and a second electrode of the third switching transistor is connected to a second node.

In one example, the driving circuit further comprises the driving transistor, a gate electrode of the driving transistor is served as the control terminal of the driving circuit to be connected to a fourth node, a first electrode of the driving transistor is served as the first terminal of the driving circuit to be connected to the second node, and the second electrode of the driving transistor is served as the second terminal of the driving circuit to be connected to a third node.

In one example, the two switching transistors of different types in the data writing circuit comprise a fourth switching transistor and a fifth transistor, and the data writing circuit further comprises a storage capacitor; a gate electrode of the fourth switching transistor is connected to a scan signal terminal to receive the scan signal, a first electrode of the fourth switching transistor is connected to a data signal terminal to receive the data signal, and a second electrode of the fourth switching transistor is connected to the fourth node; a gate electrode of the fifth switching transistor is configured to receive an inverted signal of the scan signal, a first electrode of the fifth switching transistor is connected to the data signal terminal to receive the data signal, and a second electrode of the fifth switching transistor is connected to the fourth node; and a first terminal of the storage capacitor is connected to the fourth node, and a second terminal of the storage capacitor is connected to a first voltage terminal to receive a first voltage.

In one example, a first electrode layer of the light-emitting element is coupled to the third node, and a second electrode layer of the light-emitting element is connected to a second power supply terminal to receive a second power voltage.

In one example, the pixel sub-circuit further comprises: a current transmission circuit, wherein the current transmission circuit is configured to transmit the driving current generated by the driving circuit to the light-emitting element.

In one example, the current transmission circuit comprises a sixth switching transistor; a gate electrode of the sixth switching transistor is connected to a second voltage terminal to receive a second voltage, a first electrode of the sixth switching transistor is connected to the third node, and a second electrode of the sixth switching transistor is coupled to a first electrode layer of the light-emitting element, and the second electrode layer of the light-emitting element is connected to a second power terminal to receive a second power supply voltage; and the sixth switching transistor is substantially maintained in an on state under control of the second voltage.

In one example, the pixel sub-circuit comprises a driving transistor, a first transistor, and a second transistor; the driving transistor comprises a control electrode, a first electrode, and a second electrode, and is configured to control a driving current passing through a first electrode of the driving transistor and a second electrode of the driving transistor for driving the light-emitting element to emit light based on a voltage on the control electrode of the driving transistor; the first transistor is connected to the control electrode of the driving transistor, and is configured to write the data signal to the control electrode of the driving transistor in response to a first scan signal; the second transistor is connected to the control electrode of the driving transistor, and is configured to write the data signal to the control electrode of the driving transistor in response to a second scan signal; and a direction from a first electrode of the first transistor to a second electrode of the first transistor is a first direction, and a direction from a first electrode of the second transistor to a second electrode of the second transistor is a second direction, a direction from the first electrode of the driving transistor to the second electrode of the driving transistor is a fourth direction, wherein at least one selected from the group consisting of the first direction and the second direction is intersected with the fourth direction.

In one example, both the first direction and the second direction are intersected with the fourth direction.

In one example, the first direction and the second direction are both perpendicular to the fourth direction.

In one example, the pixel circuit further comprises a third transistor connected to the first electrode of the driving transistor and configured to apply a first power voltage to the first electrode of the driving transistor in response to a light-emitting control signal, and a direction from a first electrode of the third transistor to a second electrode of the third transistor is a third direction.

In one example, the first direction, the second direction and the third direction are all perpendicular to the fourth direction.

In one example, the first transistor comprises a first active region extending along the first direction, the second transistor comprises a second active region extending along the second direction, and the third transistor comprises a third active region extending along the third direction, and the driving transistor comprises a fourth active region extending along the fourth direction.

In one example, the base substrate comprises a silicon-based base substrate, the first active region, the second active region, the third active region and the fourth active region are all doped regions in the silicon-based substrate.

In one example, a doping type of the first active region is opposite to that of the second active region.

In one example, wherein a line connecting one edge of the first active region in the first direction with one edge of the second active region in the second direction is parallel with the fourth direction; and a line connecting the other edge of the first active region in the first direction with the other edge of the second active region in the second direction is parallel with the fourth direction.

In one example, the first transistor comprises a first doped region in contact with the first electrode of the first transistor and a second doped region in contact with the second electrode of the first transistor, and the first doped region of the first transistor and the second doped region of the first transistor are spaced apart from each other, have the same doping type, and are both located inside the monocrystalline silicon layer; the first transistor further comprises a drift doped region in contact with the first doped region, and the drift doped region of the first transistor and the second doped region of the first transistor are spaced apart from each other, have the same doping type, and are both located inside the monocrystalline silicon layer; an orthographic projection of the gate electrode of the first transistor on the base substrate is partially overlapped with an orthographic projection of the drift doped region of the first transistor on the base substrate, and the orthographic projection of the first doped region on the base substrate is located in the orthographic projection of the drift doped region of the first transistor on the base substrate; and a doping concentration of the drift doped region of the first transistor is lower than that of the first doped region of the first transistor.

In one example, the first insulating layer comprises a first portion close to the first doped region of the first transistor and a second portion away from the second doped region of the first transistor.

In one example, a thickness of the first portion of the first insulating layer is greater than that of the second portion of the first insulating layer, and the thickness is a thickness in a direction perpendicular to the base substrate.

In one example, the first transistor comprises a first active region, the second transistor comprises a second active region, the driving transistor comprises a fourth active region, and a doping concentration of a channel region of at least one selected from the group consisting of the first active region and the second active region is greater than that of a channel region of the fourth active region.

In one example, a doping concentration of a channel region of each of the first active region and the second active region is greater than that of the channel region of the fourth active region.

In one example, the pixel sub-circuit further comprises a third transistor connected to the first electrode of the driving transistor and configured to apply a first power voltage to the first electrode of the driving transistor in response to a light-emitting control signal; and the third transistor comprises a third active region, and a doping concentration of a channel region of the fourth active region is less than that of the channel region of the third active region.

In one example, the channel region of the fourth active region has a doping concentration 4 orders of magnitude less than that of the channel region of the third active region.

In one example, the doping concentration of the channel region of the third active region is in a range from $1\times10^{17}$ cm$^{-3}$ to $9\times10^{17}$ cm$^3$, and the doping concentration of the channel region of the fourth active region is in a range from $1\times10^{13}$ cm$^3$ to $9\times10^{13}$ cm$^3$.

In one example, the doping concentration of the channel region of each of the first active region and the second active region is three orders of magnitude greater than that of the third active region.

In one example, the doping concentration of the channel region of the third active region is in a range from $1\times10^{17}$ $cm^{-3}$ to $9\times10^{17}$ $cm^3$, and the doping concentration of the channel region of each of the first active region and the second active region is in a range from $1\times10^{20}$ $cm^{-3}$ to $9.9\times10^{20}$ $cm^{-3}$.

In one example, each of the plurality of transistors has a channel width less than 5 nm.

In one example, the display substrate further comprises a planarization layer covering the second conductive layer and the second insulating layer, the light-emitting elements are disposed a side of the planarization layer away from the base substrate, and an anode electrode of each of the light-emitting elements is connected to a source or drain electrode of at least one of the plurality of transistors through a second via in the planarization layer.

At least one embodiment of the disclosure provides a display device, comprising the display substrate as mentioned above and a cover plate at a side of the light-emitting elements away from the base substrate.

At least one embodiment of the disclosure provides a driving method of a display substrate as mentioned above, comprising: a reset phase, a data writing phase, and a light-emitting phase; in the reset phase, inputting the reset control signal and the transmission control signal, turning on the voltage control circuit and the voltage transmission circuit, and applying the reset voltage to the first terminal of the driving circuit through the voltage control circuit and the voltage transmission circuit, so as to reset the light-emitting element; in the data writing phase, inputting the scan signal, turning on the data writing circuit, writing the data signal into the control terminal of the driving circuit through the data writing circuit, and storing, by the data writing circuit, the data signal that is written; in the light-emitting phase, inputting the light-emitting control signal and the transmission control signal, turning on the voltage control circuit, the voltage transmission circuit and the driving circuit, applying the first power voltage to the first terminal of the driving circuit through the voltage control circuit and the voltage transmission circuit, so that the driving circuit controls the voltage on the second terminal of the driving circuit based on the data signal on the control terminal of the driving circuit and the first power voltage on the first terminal of the driving circuit, and generates the driving current based on the voltage on the second terminal of the driving circuit to drive the light-emitting element to emit light.

In one example, after the light-emitting phase, the driving method further comprises: a non-light-emitting phase; in the non-light-emitting phase, stopping inputting the transmission control signal, and turning off the voltage transmission circuit, so that the first power supply voltage is not applied to the first terminal of the driving circuit, and the light-emitting element stops emitting light.

In one example, the driving method further comprises: controlling a display grayscale level of the light-emitting element by adjusting a magnitude of the data signal and a duration of the transmission control signal in the light-emitting phase.

In one example, controlling the display grayscale level of the light-emitting element by adjusting the magnitude of the data signal and the duration of the transmission control signal in the light-emitting phase comprises: in a case where a target display grayscale of the light-emitting element is less than a preset value, keeping the magnitude of the data signal unchanged and adjusting the duration of the transmission control signal in the light-emitting phase, so that the display grayscale of the light-emitting element meets the target display grayscale; in a case where a target display grayscale of the light-emitting element is not less than a preset value, keeping the duration of the transmission control signal in the light-emitting phase unchanged and adjusting the magnitude of the data signal, so that the display grayscale of the light-emitting element meets the target display grayscale.

In one example, a plurality of voltage control circuits are provided, each of the plurality of voltage control circuits is coupled to the pixel sub-circuits in the sub-pixels of at least one row, and the driving method comprises: within a display period of one frame, enabling sub-pixels of all rows to enter the reset phase, the data writing phase, and the light-emitting phase row by row, in the reset phase of the sub-pixels of each row, inputting the reset control signal and the transmission control signal, turning on the voltage control circuit and the voltage transmission circuit, and applying the reset voltage to the first terminal of the driving circuit to reset the light-emitting element through the voltage control circuit and the voltage transmission circuit; in the data writing phase of the sub-pixels of each row, inputting the scan signal, turning on the data writing circuit, writing the data signal to the control terminal of the driving circuit through the data writing circuit, and storing, by the data writing circuit, the data signal that is written; in the light-emitting phase of the sub-pixels of each row, inputting the light-emitting control signal and the transmission control signal, turning on the voltage control circuit, the voltage transmission circuit, and the driving circuit, and applying the first power voltage to the first terminal of the driving circuit through the voltage control circuit and the voltage transmission circuit, so that the driving circuit controls the voltage on the second terminal of the driving circuit based on the data signal on the control terminal of the driving circuit and the first power voltage on the first terminal of the driving circuit, and generates the driving current based on the voltage on the second terminal of the driving circuit to drive the light-emitting element to emit light.

In one example, the driving method further comprises: during the display period of one frame, enabling sub-pixels of all rows to enter a non-light-emitting phase row by row; in the non-light-emitting phase of the sub-pixels of each row, stopping inputting the transmission control signal, and turning off the voltage transmission circuit, so that the first power voltage is not applied to the first terminal of the driving circuit, and the light-emitting elements of sub-pixels of the row stop emitting light.

In one example, the driving method further comprises: during the display period of one frame, enabling the sub-pixels of all rows to enter a non-light-emitting phase at the same time; in the non-light-emitting phase of the sub-pixels of all rows, stopping inputting the transmission control signal, and turning off the voltage transmission circuit, so that the first power voltage is not applied to the first terminal of the driving circuit, and the light-emitting elements of sub-pixels of all rows stop emitting light at the same time.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1A:
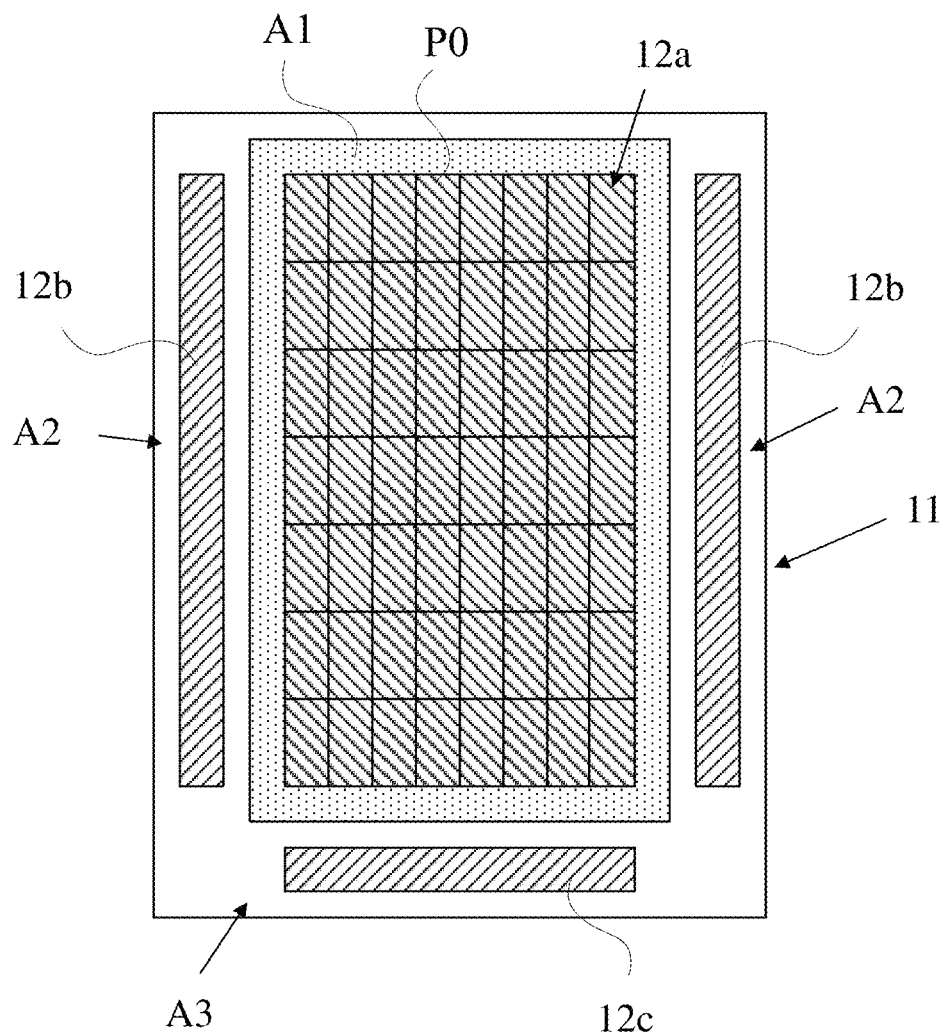
FIG. 1A is a plain view illustrating an array substrate according to some embodiments of the disclosure.

In the following, as shown in the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Current Gate Driver On Array (GOA, also called Gate Driver On Panel, GOP) technologies integrate the scan drive circuit into an array substrate by manufacturing the scan drive circuit in an array process, followed by mask patterning and yellow light fabrication process.

However, current GOA technologies do not normally integrate into the array substrate circuits other than the scan drive circuits, mainly because structures of the other circuits, such as a data drive circuit, are more complex than the structure of the scan drive circuit. The more complex circuits can occupy relatively large areas if manufactured over a glass substrate, and consequently will reduce the size of the display area. In addition, the data drive circuits should be able to process a large amount of display data accurately and quickly. As such, there are strict requirements for the performance of the components (especially the reaction speed). Therefore, the array substrate in existing technologies generally cannot satisfy the performance requirements of integrating other circuits with the array substrate.

If scan drive circuits and data drive circuits are to be simultaneously manufactured and integrated in an array substrate by current amorphous silicon or polycrystalline silicon GOA technologies, a relatively large area on the array substrate will need to be occupied. It is because the thin film transistors (TFTs) manufactured by the amorphous silicon or polycrystalline silicon technologies cannot achieve smaller sizes, and thus leading to a squeezed display area on the display panel. As such, only scan drive circuits can be integrated in an array substrate, whereas the data drive circuits are fabricated on an integrated circuit (IC), which is attached on a side of the array substrate, so as to leave a relatively large display area.

Figure 1B:
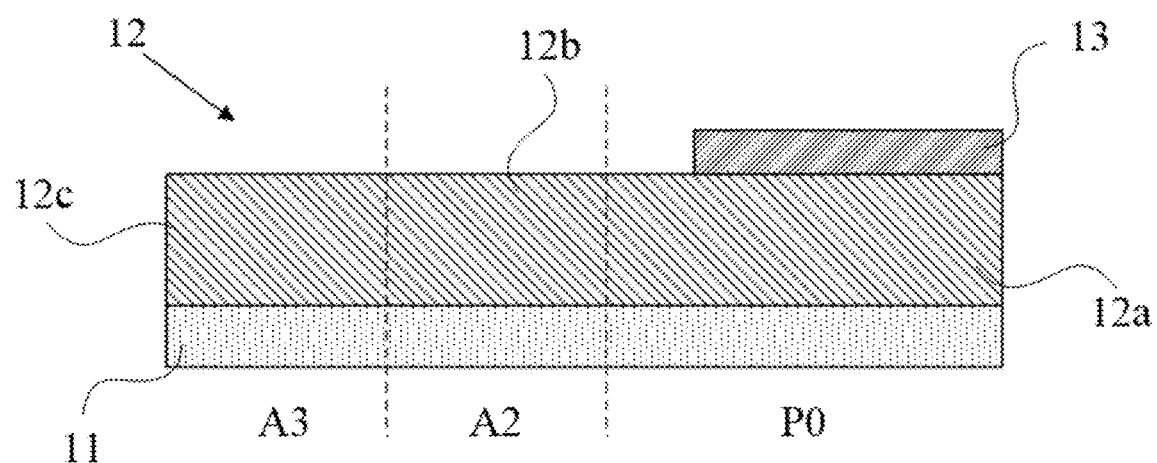
FIG. 1B is a cross-sectional view of an array substrate according to some embodiments of the disclosure.

FIG. 1A and FIG. 1B are structural diagrams of an array substrate according to some embodiments of the disclosure. As shown in FIG. 1A and FIG. 1B, the array substrate comprises a monocrystalline silicon substrate 11, an array circuit layer 12, and an anode conductive layer 13. A central display area A1, a first peripheral area A2, and a second peripheral area A3 are configured over the monocrystalline silicon substrate 11. The central display area A1 comprises a plurality of pixel regions P0. The configuration of the plurality of pixel regions P0 in the central display area A1 can be determined based on the needs of specific display applications. For example, each pixel region is used to form a sub-pixel, and each sub-pixel may include a light emitting element and a sub-pixel circuit for controlling the light emitting element, which will be described in detail in the following.

An array circuit layer 12 is formed over the monocrystalline silicon substrate 11 and comprises a plurality of transistors formed in an active region at the monocrystalline silicon substrate 11. Here, "an array circuit layer 12 is formed over the monocrystalline silicon substrate 11" means that at least a part of the array circuit layer is formed over the monocrystalline silicon. As mentioned in the following description, a part of the array circuit layer 12, i.e., the active layers of the transistors can be formed within the monocrystalline silicon substrate. In the array circuit layer 12, a scan drive circuit 12b is formed within the first peripheral area A2, a data drive circuit 12c is formed within the second peripheral area A3, and a pixel circuit (sub-pixel circuit) 12a is formed in each of the pixel regions P0. In addition, an anode conductive layer 13 is formed over the array circuit layer 12 in each of the pixel regions P0, and is configured to output the drive current of an organic light-emitting layer in each of the pixel regions P0, and to reflect the light from the organic light-emitting layer.

It can be appreciated that the scan drive circuit 12b, the data drive circuit 12c, and the pixel circuit 12a are coordinated with one another to output the drive current of the anode conductive layer 13, each comprising a portion of the above-described plurality of transistors to realize their respective circuit functionality. To achieve such functionality, the array circuit layer 12 can further comprise circuit connection lines and other electronic components that are necessary.

The array substrate disclosed herein can be employed to form an organic light-emitting diode (OLED) display, and thus the specific structure of the array substrate can be configured as part of an OLED display apparatus. For example, the digital circuit structure of the data drive circuit can be realized by employing logic gate circuits comprising transistors, and the shift register unit of the scan drive circuit can be realized by employing existing transistor circuits.

Compared with existing OLED display apparatuses, the array substrate according to some embodiments disclosed herein employs a monocrystalline silicon substrate as the substrate, and the active region of a plurality of transistors in the array circuit layer 12 that comprises the scan drive circuit 12b, the data drive circuit 12c, and the pixel circuit 12a is formed in the monocrystalline silicon substrate 11. For example, the active layer of each transistor can be formed with the material of monocrystalline silicon.

Because the carrier mobility of monocrystalline silicon can be >600 $cm^2$/V-sec, the transistors in the data drive circuit and in the scan drive circuit can have sufficiently high performance, and their sizes can be reduced compared with existing technologies while ensuring the performance. As such, the data drive circuit and the scan drive circuit do not occupy a large area of the substrate, and instead, the area outside the display area can be reduced, thereby increasing the display area.

Figure 2:
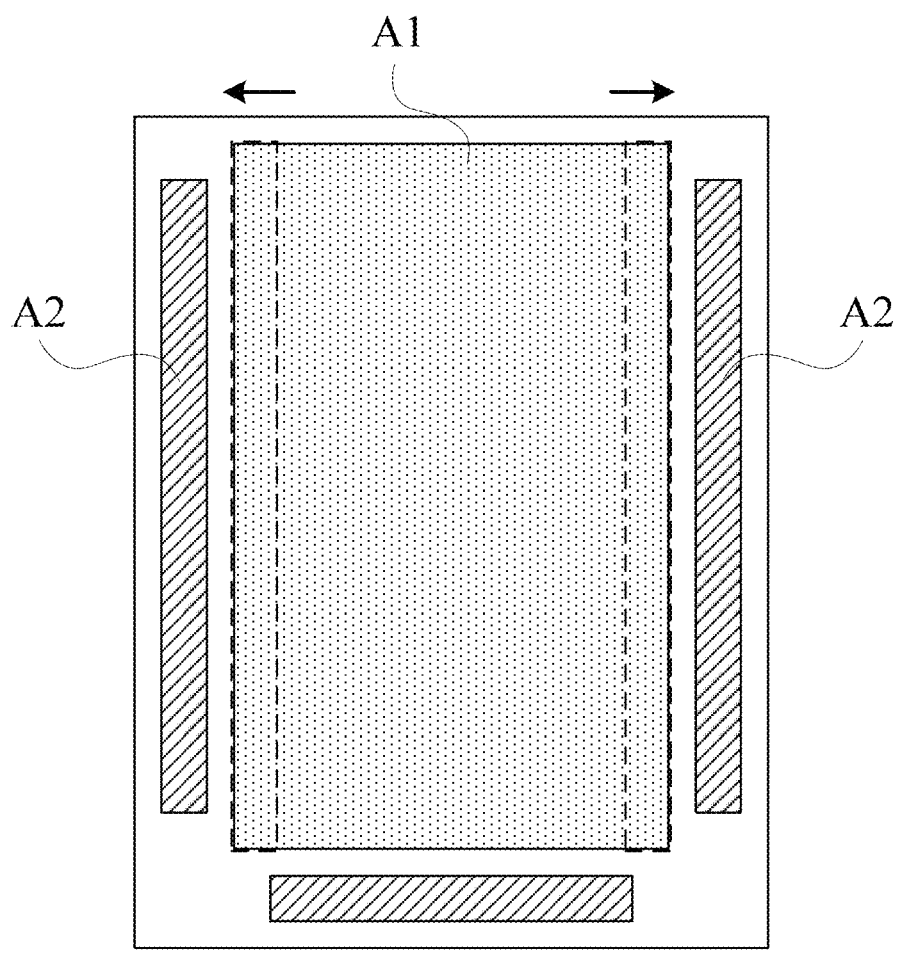
FIG. 2 is a schematic diagram illustrating the effect of increasing the display area according to some embodiments of the disclosure.

For example, FIG. 2 is a schematic view showing the effect of an increased display area according to some embodiments of the disclosure. As shown in FIG. 2, because the monocrystalline silicon substrate is employed and the active region of the transistors is formed in the monocrystalline silicon substrate, compared with existing technologies, the sizes of the transistors in the scan drive circuit can be reduced while still ensuring the performance For example, if the transistors have the same performance, a channel length of a transistor formed by using monocrystalline silicon as an active layer may be $\frac{1}{1000}$ of a channel length of a transistor formed by using amorphous silicon as the active layer, or may be $\frac{1}{10}$ of a channel length of a transistor formed by using polysilicon as the active layer.

As such, the area of the first peripheral area A2 configured to form the scan drive circuit therein can be reduced, and under the condition that the substrate area is not altered, the central display area A1 can be expanded towards both sides along the direction of the arrows, thereby increasing the area in the dotted box, and benefiting the narrowing of the border regions where the first peripheral area A2 is located. As described above, because a size of the transistor formed by using monocrystalline silicon can be reduced with the same performance, the area occupied by the corresponding driving circuits can also be reduced. For example, in the case where the area of a gate driving circuit is reduced, a width of a first peripheral region can be reduced. As illustrated by FIG. 2, in a direction indicated by the arrow, the size of the first peripheral region A2 can be reduced, accordingly, a size of a middle display region A1 can be increased, thereby increasing the area of the middle display region. For example, in a direction from the first peripheral region to the middle display region, a ratio of a total size of the first peripheral region (for example, in the case where only one first peripheral region is located on a side of the middle region, and the total size is the size of one first peripheral region; in the case where two first peripheral regions are respectively located at both sides of the middle region, the total size is a sum of the sizes of two first peripheral regions) to a size of the middle display region can go infinitely to 0, that is, a completely borderless display can be achieved.

Figure 3:
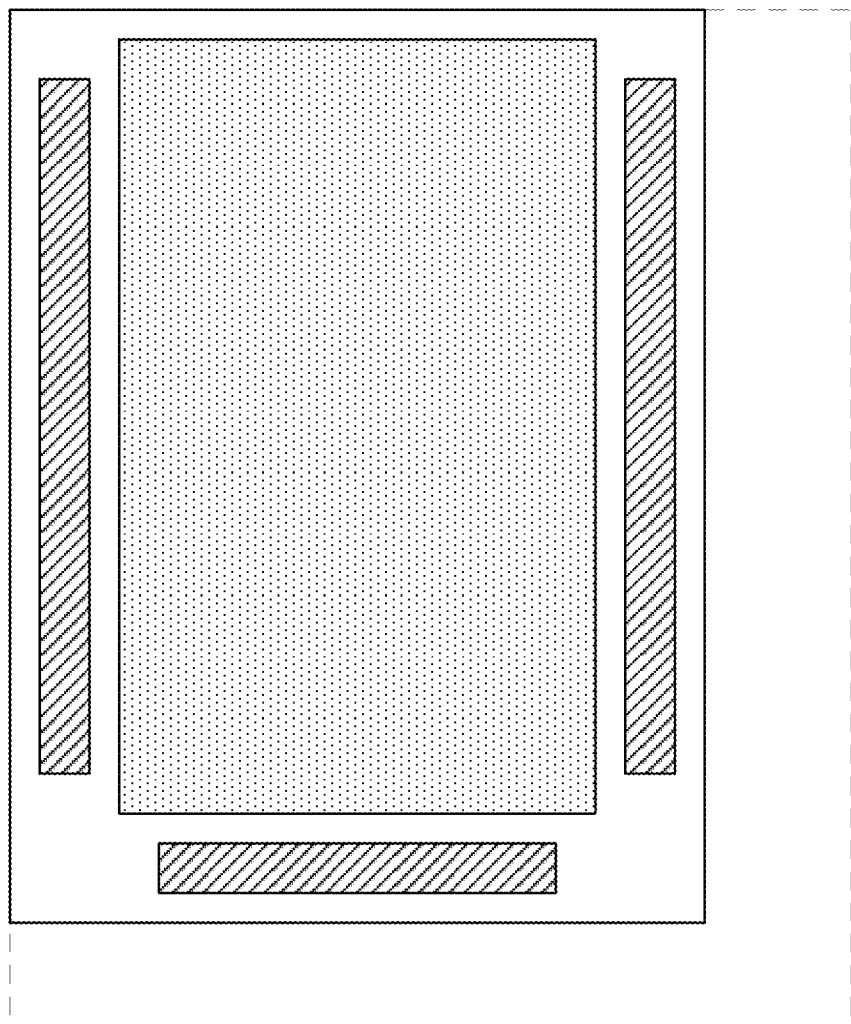
FIG. 3 is a schematic diagram illustrating the effect of reducing the size of the device according to some embodiments of the disclosure.

FIG. 3 is a schematic view illustrating the effect of reducing the size of the device according to some embodiments of the disclosure. As shown in FIG. 3, the sizes of all transistors in the pixel circuit and in the scan drive circuit can be reduced compared with existing technologies, therefore the area they occupy over the substrate can be reduced as a whole under the condition that the circuit performance is ensued and the number of pixels is not changed.

Furthermore, the data drive circuit formed over the monocrystalline silicon substrate does not occupy a large area over the substrate under the condition that the transistors have good performance. As such, the size of the display apparatus formed by the array substrate according to the embodiments of the disclosure can be smaller compared with a conventional display apparatus, whose size is shown by the dotted box in FIG. 3.

Because the transistors as disclosed herein are manufactured on a monocrystalline silicon substrate, compared with display apparatus in which the transistors are manufactured by the a-Si process and the p-Si process, the sizes of the transistors in each of the pixel regions in the display apparatus manufactured by the process in this disclosure can be reduced while still ensuring the performance, therefore more pixel units can be configured in an area of the same size to achieve higher resolution. As described above, the size of the transistor in each pixel region is reduced. For example, a size of a monocrystalline silicon transistor included in a pixel circuit according to an embodiment of the present disclosure may reach a nanometer level, for example, a width of the transistor may be lower than 5 nm.

Figure 4A:
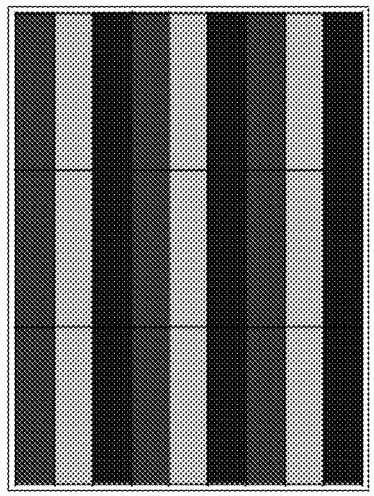
FIG. 4A illustrates a display resolution of a display apparatus manufactured with an amorphous-Si process.
Figure 4B:
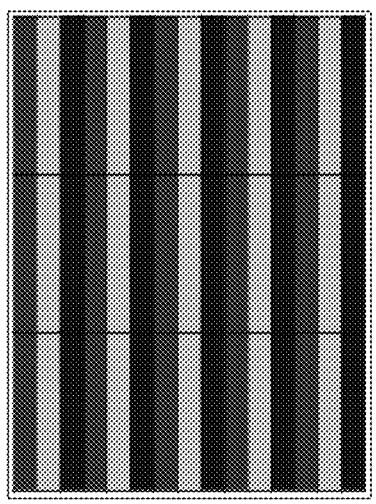
FIG. 4B illustrates a display resolution of a display apparatus manufactured with a poly-Si process.
Figure 4C:
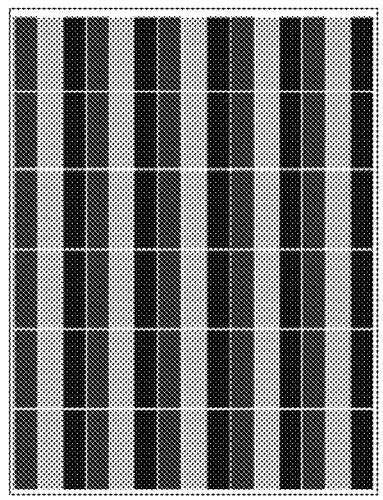
FIG. 4C illustrates a display resolution of a display apparatus manufactured with a process according to some embodiments of the disclosure, for a comparison with FIGS. 4A and 4B.

FIG. 4A, FIG. 4B and FIG. 4C are schematic diagrams comparing the resolutions of display apparatus fabricated by an amorphous silicon (a-Si) process (FIG. 4A), a polycrystalline silicon (p-Si) process (FIG. 4B), and the process according to one embodiment of the disclosure (c-Si, FIG. 4C).

Figure 5:
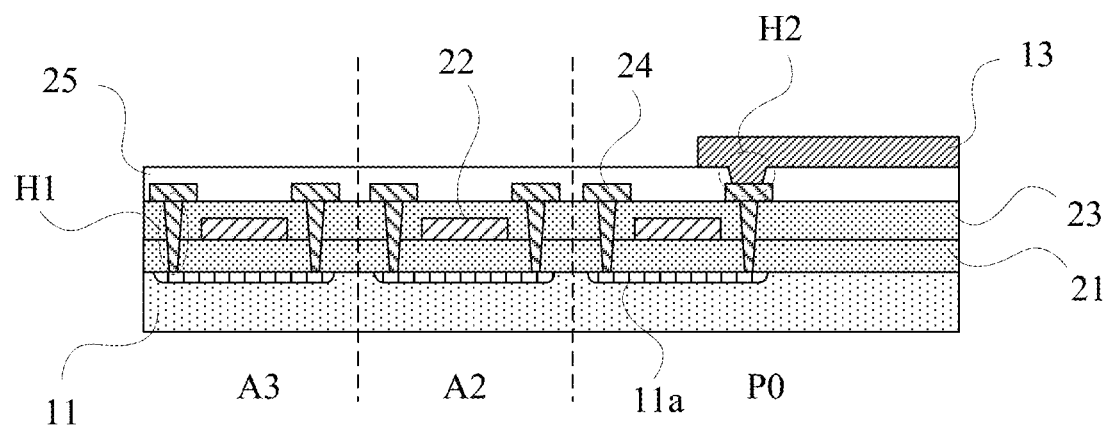
FIG. 5 is a cross-sectional view of the structure of an array substrate according to some embodiments of the disclosure.

FIG. 5 is a cross-sectional view of the structure of an array substrate according to some embodiments of the disclosure, which is an example illustrating the structure of the above-described array circuit layer 12. As shown in FIG. 5, the array circuit layer 12 specifically comprises: a first insulating layer 21, formed over the monocrystalline silicon substrate 11; a first metal layer 22, formed over the first insulating layer; a second insulating layer 23 that covers the first metal layer 22 and the first insulating layer 21; a second metal layer 24 formed over the second insulating layer 23; and a planarization layer 25 that covers the second metal layer 24 and the second insulating layer 23.

The first metal layer 22 comprises patterns for gate electrodes of a plurality of transistors. The second metal layer 24 comprises patterns for the source electrodes and drain electrodes of a plurality of transistors. An active region 11a is formed within the formation area of a plurality of transistors inside the monocrystalline silicon substrate 11.

A plurality of first vias H1 are formed through the first insulating layer 21 and the second insulating layer 23, so that the patterns of the source electrodes and the patterns of the drain electrodes of the plurality of transistors can come into contact with the active region 11a in the monocrystalline silicon substrate 11 through the plurality of first vias H1.

As such, the first insulating layer 21 and the second insulating layer 23 can function as the gate insulating layers of the above-described plurality of transistors which ensure that the gate electrodes and the active region are insulated from each other, and that the gate electrodes and the source electrodes or drain electrodes are insulated from each other.

As shown in FIG. 5, the source electrodes and the drain electrodes can contact with the active region 11a at different locations, so as to form a channel area that can generate source and drain current in the active region 11a, and to configure the gate electrodes at the corresponding locations of the channel area to realize the functionality of the transistors. The specific types of the above-described transistors need to be determined according to the compositions of the active region 11a, and they can be all P-type transistors (TFTs) in order for the manufacturing process to be uniform to reduce the manufacturing costs and improve the stability of the performance of the transistors. It can be understood, after determining the transistors as N-type or P-type, ways to connect the source electrodes and the drain electrodes can be determined according to specific applications by those skilled in the art and are be repeated herein.

In addition, in each pixel region, second vias H2 are arranged in the planarization layer 25, and are employed to connect the patterns of the source electrodes or the drain electrodes of at least one transistor in the second metal layer 24 to the anode conductive layer 13. That is, there is at least one transistor in the pixel circuit 12a in a pixel region P0 that is connected to the anode conductive layer 13, and the source electrodes or the drain electrodes of the transistors can be connected to the anode conductive layer 13 through the second vias H2 inside the planarization layer 25, so as to realize the output of the drive current of the organic light-emitting layer.

It can be appreciated that the specific number of the above-described plurality of transistors can be determined according to the specific circuit structure of the selected scan drive circuit 12b, data drive circuit 12c and pixel circuit 12a.

Figure 6:
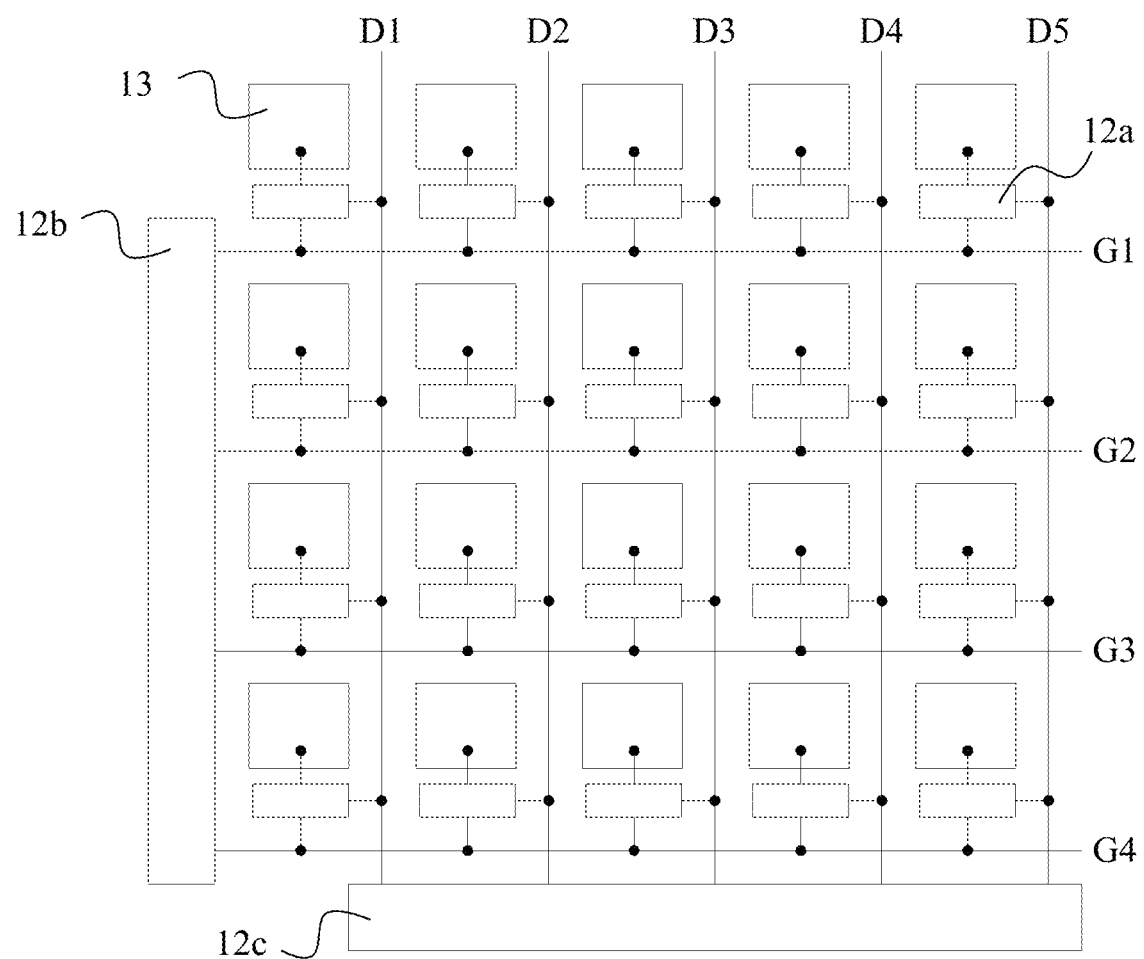
FIG. 6 is a schematic view of electrical connections of an array substrate according to some embodiments of the disclosure.

On the other hand, as an illustration of the circuit connection relationship in the array circuit layer 12, FIG. 6 is a schematic view of the circuit connection relationship of an array substrate according to one embodiment of the disclosure. As shown in FIG. 6, the above-described scan drive circuit 12b is connected to multiple rows of scan lines as shown by G1, G2, G3, G4; the above-described data drive circuit 12c is connected to multiple columns of data lines as shown by D1, D2, D3, D4, D5; and the above-described plurality of pixel regions P0 are defined by the intersection of rows of scan lines and columns of data lines formed in the central display area A1.

The pixel circuit 12a in each of the pixel regions P0 is coupled to one row of scan line and one column of data line respectively. The pixel circuit 12a is employed to generate the drive current flowing to the anode conductive layer 13 according to the data voltage from the data lines under the control of the signals of the scan lines. Thus, under the coordination of the scan drive circuit 12b, the data drive circuit 12c, and the pixel circuit 12a, the array circuit layer 12 can realize the output of the drive current of the anode conductive layer 13 in each of the pixel regions P0.

It can be appreciated that the number of the scan lines, the number of the data lines, the number of the pixel regions, the number of the signal output terminals of the scan drive circuit 12b, and the number of the output terminals of the data voltage of the data drive circuit 12c can be configured according to specific applications.

Figure 7:
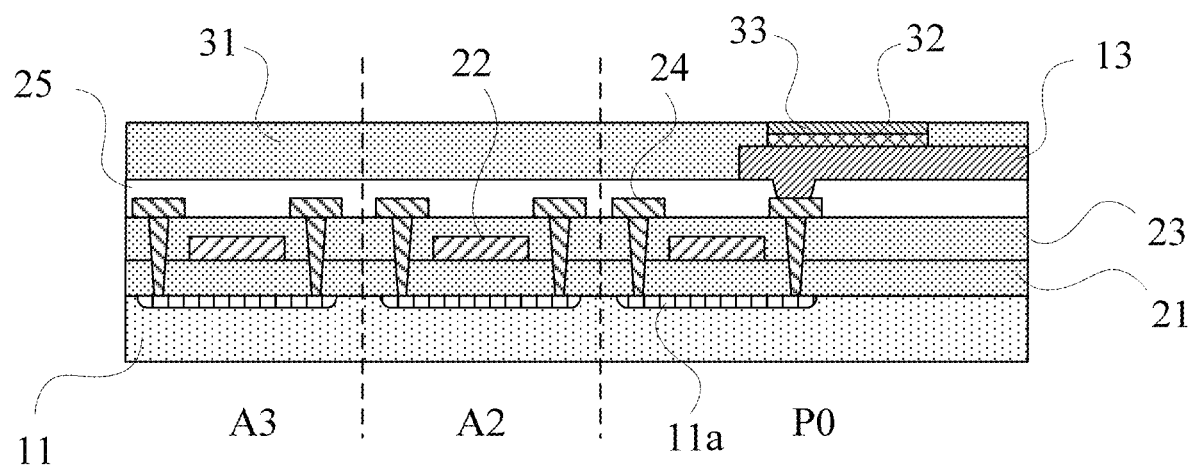
FIG. 7 is a cross-sectional view of a display apparatus according to some embodiments of the disclosure.

In addition, in the cross-sectional structure as shown in FIG. 5, the first metal layer 22 can comprise patterns of multiple rows of scan lines; and the second metal layer 24 can comprise patterns of multiple columns of data lines, so as to realize the circuit connection relationships via same-layer connections as shown in FIG. 7.

The second metal layer 24 can also comprise patterns of the above-described multiple rows of scan lines, and the first metal layer 22 may also comprise patterns of the above-described multiple columns of data lines, thus solving the issues of increased thickness of the patterns of the gate electrodes under certain situations, or the issues of overly large coupling capacitance between the metal layers under some other situations. In this embodiment, the circuit connection relationships as shown in FIG. 6 can be achieved by configuration of new connection vias in the second insulating layer 23.

In any of the above-described array substrates, it can be appreciated that the formation area of any one of the transistors in the plurality of transistors over the array substrate can be smaller than a first preset value. It should be noted that the first preset value represents the upper limit of all transistors, and can have different values according to different width-to-length ratios of the channel.

In specific implementations, the first preset value can be determined by measuring the actual parameters of the monocrystalline silicon substrate. It can be appreciated that, compared with a-Si and p-Si, the first preset value in embodiments of the disclosure has a smaller first preset value, thereby increasing the display area, reducing the size of the device, and improving the display resolution.

On the basis of any one of the above-described array substrates, the disclosure further provides a display apparatus comprising any one of the above-described array substrates. It should be noted that the display apparatus disclosed herein can be any products or components that has a display function, such as a display panel, an electronic paper, a cell phone, a tablet computer, a television, a notebook computer, a digital phone frame, and a navigation system.

It can be understood that the display apparatus disclosed herein can also achieve integrated manufacturing of the scan drive circuit and the data drive circuit over the substrate, and can further reduce the area outside the display area, increase the display area, and reduce the size of the device without affecting the functionality of the circuits and numbers of the pixels, which is beneficial to the improvement of the display resolution.

As a specific example, FIG. 7 is a cross-sectional view of a display apparatus according to some embodiments of the disclosure. As shown in FIG. 7, on the basis of the structure of the array substrate as shown in FIG. 5, the display apparatus further comprises a pixel defining layer 31 that covers the planarization layer 25 and the anode conductive layer 13. The pixel defining layer 31 is provided with an opening area, configured to expose the anode conductive layer 13 in the pixel region P0, and is also provided with an organic light-emitting layer 32, whose one side is in contact with the anode conductive layer 13 in the opening area, and whose another side is provided with a transparent cathode conductive layer 33 that is in contact with the organic light-emitting layer 32.

It should be appreciated that in each of the pixel regions P0, the anode conductive layer 13 can provide a drive current to the organic light-emitting layer 32, and the cathode conductive layer 33 can provide a corresponding bias electric potential, so as to enable the organic light-emitting layer 32 to emit light with corresponding luminance depending on the strength of the drive current. Since the anode conductive layer 13 can also reflect the light from the organic light-emitting layer 32, the majority of the light emitted from the organic light-emitting layer 32 can emit through the transparent cathode conductive layer 33 to form a top-emitting OLED (TEOLED) display.

The display apparatus of the embodiments of the disclosure can further comprise other structures that are not shown in the drawings, which include, for example, package structures that have functions of supporting, connecting and protection, and power supply circuits used for supplying power.

Figure 8:
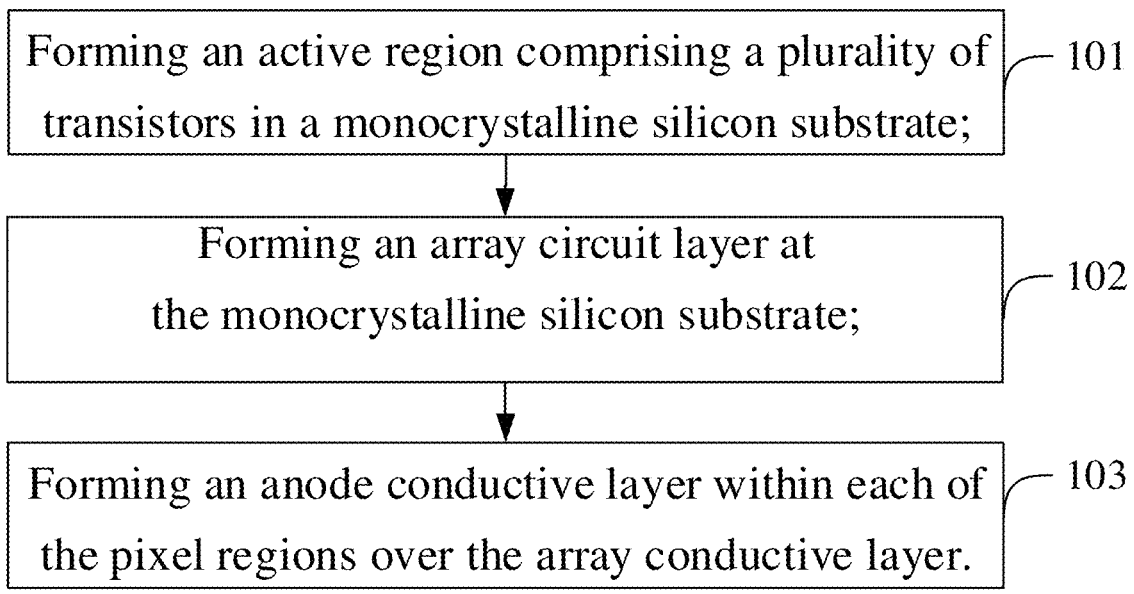
FIG. 8 is a flow chart illustrating the steps of a method for manufacturing an array substrate according to some embodiments of the disclosure.

For any one of the above-described array substrates, FIG. 8 is a flow chart illustrating the manufacturing method of an array substrate according to some embodiments of the disclosure. As shown in FIG. 8, the method comprises:

101: forming an active region of a plurality of transistors in a monocrystalline silicon substrate;

102: forming an array circuit layer over the monocrystalline silicon substrate;

103: forming an anode conductive layer within each of the pixel regions over the array conductive layer.

It can be appreciated that the manufacturing method disclosed herein can be employed for manufacturing any one of the above-described array substrates.

In some embodiment, Step 101 of forming an active region of a plurality of transistors in a monocrystalline silicon substrate comprises the following sub-steps (not shown in the figures):

101a: forming a mask pattern over the monocrystalline silicon substrate, wherein the mask pattern covers areas outside the active region of the plurality of transistors;

101b: conducting ion implantation to the monocrystalline silicon substrate under covering by the mask pattern, so as to form an active region of a plurality of transistors that is located in the monocrystalline silicon substrate;

101c: removing the mask pattern.

Figure 9:
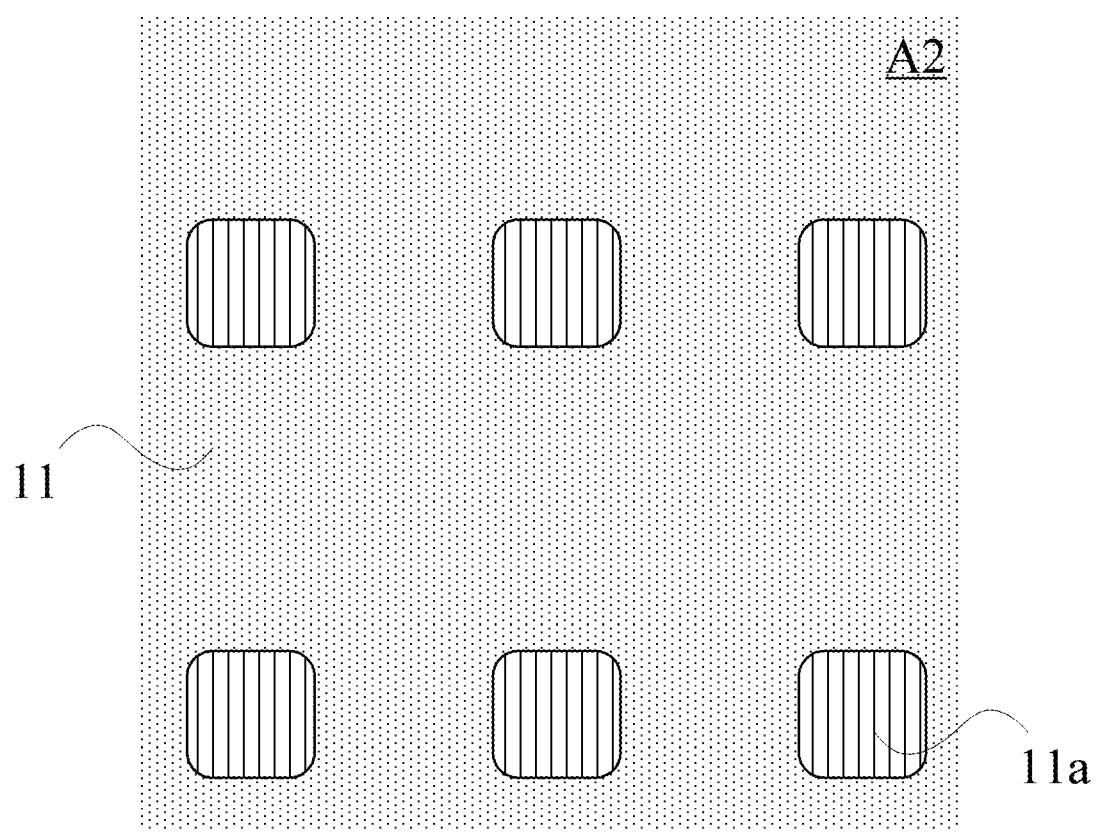
FIG. 9 is a schematic view of an active region in a first peripheral area according to some embodiments of the disclosure.

As a specific example, FIG. 9 is a diagram illustrating the active region inside the first peripheral area according to some embodiments of the disclosure. As shown in FIG. 9, inside a portion of the first peripheral area A2, an active region 11a of six transistors is configured over the monocrystalline silicon substrate 11. It can be appreciated, the active region 11a of any one of the transistors can occupy a certain area of the monocrystalline silicon substrate 11 as shown in FIG. 9, and has a certain depth on the direction of thickness of the monocrystalline silicon substrate 11 as shown in FIG. 5. At least one type of N-type or P-type ion is mixed in the active region 11a depending on the type of the transistors. For example, the active region 11a is formed by doping a part of the monocrystalline silicon substrate 11.

It can be appreciated, the above-described step 101a can comprise forming a mask pattern that is arranged over the monocrystalline silicon substrate 11 outside the active region 11a shown in FIG. 9. For example, the mask pattern can be a photoresist layer formed through a photolithographic process, and the multiple opening areas configured in the photoresist layer that expose the area over the monocrystalline silicon substrate that is employed to form the active region 11a. As such, the active region 11a of each of the transistors can be formed in these areas through an ion implantation process in step 101b s, and the above-described mask pattern can be removed through the removal of the photoresist layer in step 101c.

Figure 10:
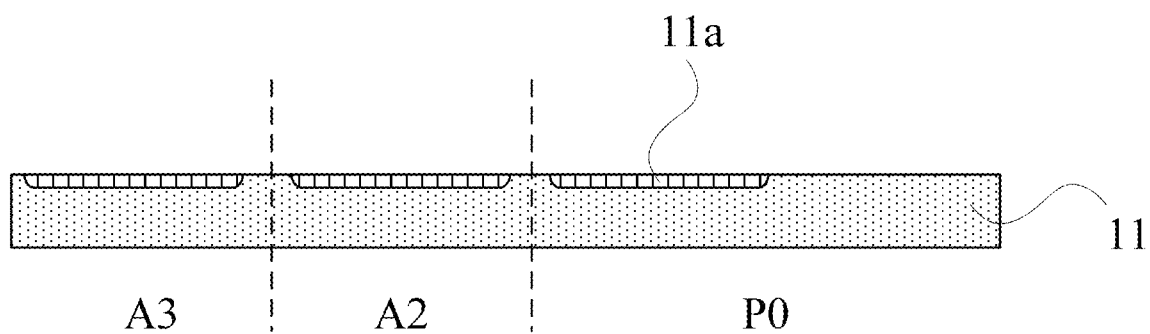
FIG. 10 is a cross-sectional view of the structure of a monocrystalline silicon substrate after fabrication of the active region according to some embodiments of the disclosure.

The structure of the above-described monocrystalline silicon substrate 11 that has been formed through the above-described process is shown in FIG. 10. In FIG. 10, the central display area A1, the first peripheral area A2, and the second peripheral area A3 are already configured over the monocrystalline silicon substrate 11 according to the method as shown in FIG. 1A. The central display area A1 comprises a plurality of pixel regions P0. The formation area of a plurality of transistors is already preset, the active region 11a of each transistor is formed through step 101, and other structures can be manufactured on this basis. As shown in FIG. 10, the active region (active layer) for each transistor has a thickness smaller than that of the substrate 11, i.e., only a part of the substrate on the surface is used to form the active region of the active layer of each transistor.

In some embodiment, the above-described step 102 of forming an array circuit layer over the monocrystalline silicon substrate can specifically comprise the following sub-steps (not shown in the figures):

102a: forming a first insulating layer over the monocrystalline silicon substrate;

102b: forming a first metal layer on the first insulating layer, wherein the first metal layer comprises a gate electrode pattern including a plurality of transistors;

102c: forming a second insulating layer over the first metal layer and the first insulating layer, wherein the second insulating layer covers the first metal layer and the first insulating layer;

102d: forming a plurality of first vias in the first insulating layer and the second insulating layer;

102e: forming a second metal layer inside the plurality of first vias and on the second insulating layer, wherein the second metal layer comprises a source electrode pattern and a drain electrode pattern of a plurality of transistors; the source electrode pattern and the drain electrode pattern of the plurality of transistors come into contact with the active regions in the monocrystalline silicon substrate through a plurality of first vias.

Optionally, step 102 can further comprise the following sub-step (not shown in the figures):

102f: forming a planarization layer over the second metal layer and the second insulating layer, wherein the planarization layer covers the second metal layer and the second insulating layer; in each of the pixel regions, a second via is formed in the planarization layer and configured to connect the source electrode or the drain electrode of at least one transistor in the second metal layer to the anode conductive layer.

FIGS. 11-16 are schematic views of the structures of the array circuit layer in the manufacturing process.

Figure 11:
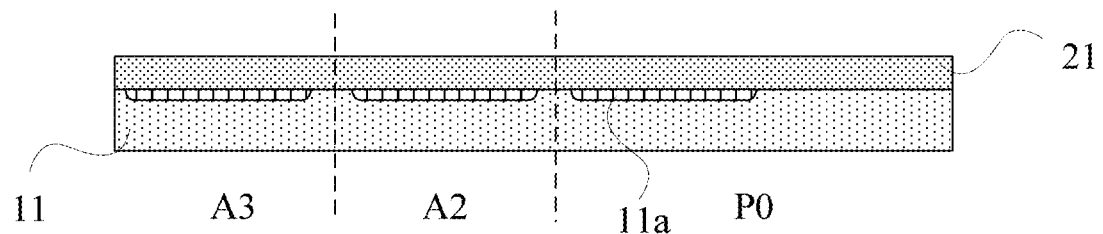
FIG. 11 is a cross-sectional view of an array circuit layer in a first fabrication process.

FIG. 11 shows the structure formed after step 102a. As shown in FIG. 11, a first insulating layer 21 is formed over the structure as shown in FIG. 10 in step 102a. The first insulating layer 21 can comprise a silicon oxide (SiOx) layer, disposed at a bottom, and a silicon nitride (SiNx) layer, disposed at a top, and can be formed through a double deposition process.

Figure 12:
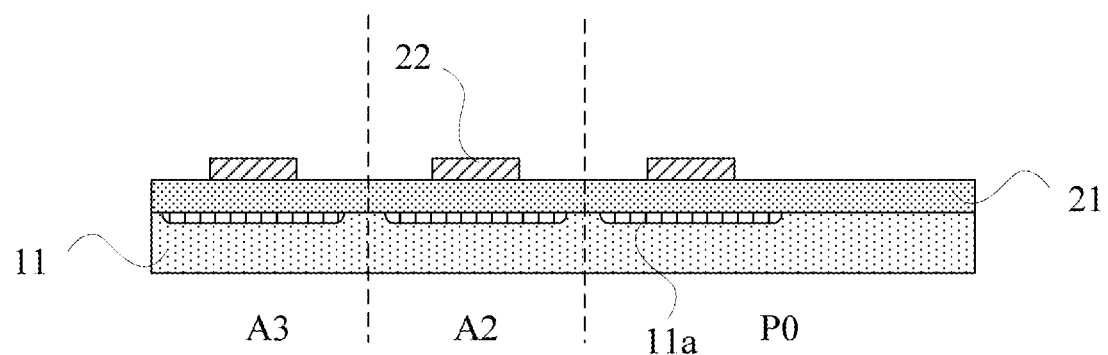
FIG. 12 is a cross-sectional view of an array circuit layer in a second fabrication process.

FIG. 12 shows the structure formed after step 102b. As shown in FIG. 12, the first metal layer 22 comprising the gate electrode pattern is formed over the structure as shown in FIG. 11 in step 102b. It can be appreciated that the formation area of the gate electrode pattern corresponds to the formation area of the active region 11a. Specifically, the first metal layer 22 can be formed through a patterning process: for example, a layer of metal can be deposited first, then this layer of metal is etched employing a photoresist pattern as a mask to form the pattern in the first metal layer 22.

Figure 13:
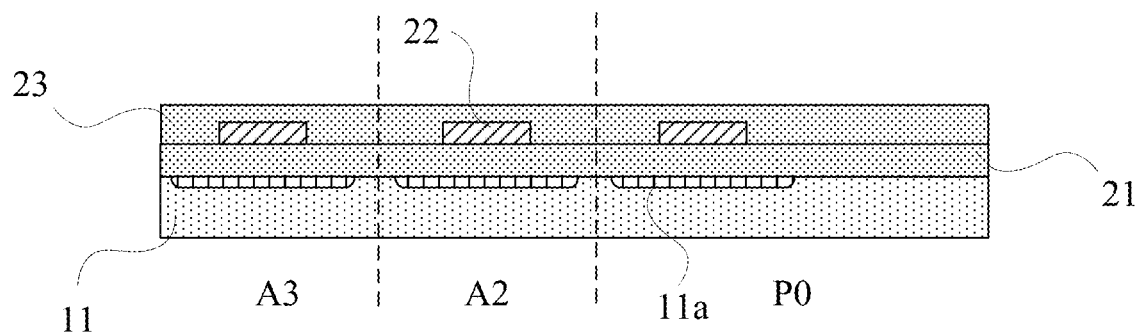
FIG. 13 is a cross-sectional view of an array circuit layer in a third fabrication process.

FIG. 13 shows the structure formed after step 102c. As shown in FIG. 13, a second insulating layer 23 is formed over the structure as shown in FIG. 12 in step 102c. For example, the first insulating layer 23 can comprise a silicon oxide (SiOx) layer, disposed at a bottom, and a silicon nitride (SiNx) layer, disposed at a top, and can be formed through a double deposition process.

Figure 14:
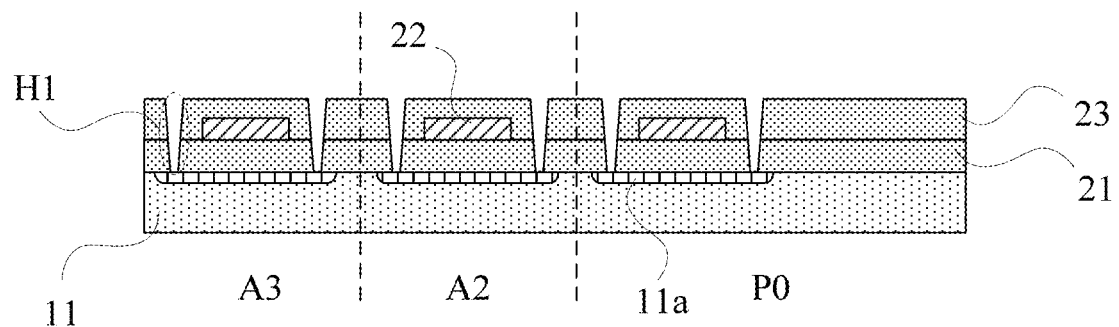
FIG. 14 is a cross-sectional view of an array circuit layer in a fourth fabrication process.

FIG. 14 shows the structure formed after step 102d. As shown in FIG. 14, a plurality of first vias H1 are formed in the first insulating layer 21 and the second insulating layer 23 as shown in FIG. 13. Specifically, it can be formed through methods such as etching. It can be appreciated, that after the formation of the first vias H1, a portion of the active region 11a is exposed such that it can be connected to the source electrodes and the drain electrodes.

Figure 15:
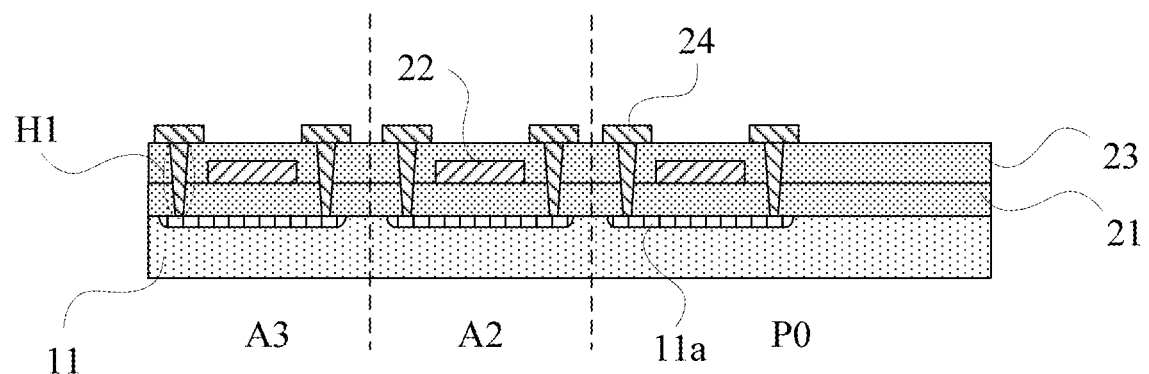
FIG. 15 is a cross-sectional view of an array circuit layer in a fifth fabrication process.

FIG. 15 shows the structure formed after step 102e. As shown in FIG. 12, a second metal layer 24 is formed inside the plurality of vias H1 and over the second insulating layer 23 as shown in FIG. 14, and specifically by a patterning process of the metal deposition. The second metal layer 24 comprises a source electrode pattern and a drain electrode pattern of a plurality of transistors, and the source electrode pattern and the drain electrode pattern come into contact with the active region 11a inside the monocrystalline silicon substrate 11 through a plurality of first vias H1. As such, the fundamental structure of the above-described plurality of transistors is formed.

Figure 16:
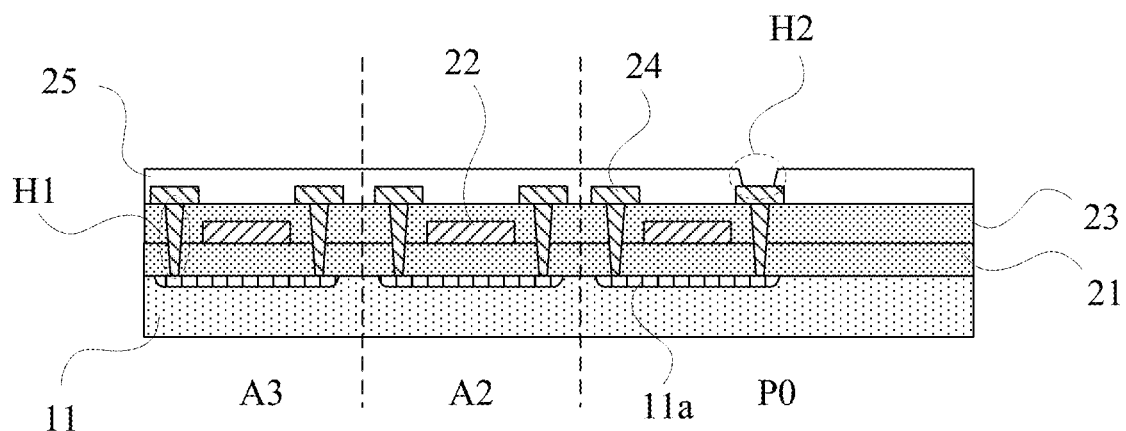
FIG. 16 is a cross-sectional view of an array circuit layer in a sixth fabrication process.

FIG. 16 shows the structure formed after step 102f. As shown in FIG. 16, a planarization layer 25 is formed over the second metal layer 24 and the second insulating layer 23 as shown in FIG. 15 in step 102f, so as to smoothen the surface of the array circuit layer 12. The planarization layer 25 covers the second metal layer 24 and the second insulating layer 23, and therein the second vias H2, employed to connect the source electrode or drain electrode of at least one transistor in the second metal layer 24 to the anode conductive layer 13 in each of the pixel regions P0 can be formed. The planarization layer 25 and the second vias H2 can be formed by existing technologies and it will not be repeated herein.

After formation of the planarization layer 25 in the array circuit layer as shown in FIG. 16, extra steps can be taken to form the various components of the display apparatus as shown in FIG. 7.

In a first extra step, by patterning and deposition, an anode conductive layer 13 can be formed in each of the pixel regions P0, such that the anode conductive layer 13 comes into contact with the source electrode or drain electrode of at least one transistor in the second metal layer 24 through the second vias H2, as illustrated in FIG. 5.

In a second extra step, by patterning and deposition, a pixel defining layer 31 can be formed over the planarization layer 25 such that the pixel defining layer 31 covers the planarization layer 25 whereas the anode conductive layer 13 is exposed (figure not shown).

In a third extra step, by evaporation, an organic light-emitting layer 32 can be formed over the anode conductive layer 13, and further by evaporation, a cathode conductive layer 33 can be formed over the organic light-emitting layer 32 (figure not shown).

In a fourth extra step, by encapsulation, a cover glass is disposed over the first peripheral area, the second peripheral area, and the display area to ultimately form a display panel (figure not shown).

It should be noted that the array substrates or display apparatus having other alternative structures can also be manufactured by the manufacturing method disclosed herein.

In the above-mentioned embodiments, although the case where a gate electrode is made in the first metal layer is described as an example, the embodiments according to the present disclosure are not limited thereto. For example, the material of the gate electrode may be any one or any combination of ones selected from the group consisting of polysilicon, silicide, and metal, or any other suitable conductive material. As for the source drain layer, in addition to the metal material, the embodiments according to the present disclosure are also not particularly limited. For example, the material of the source drain layer may be a composite material of metal material and other materials.

Figure 17:
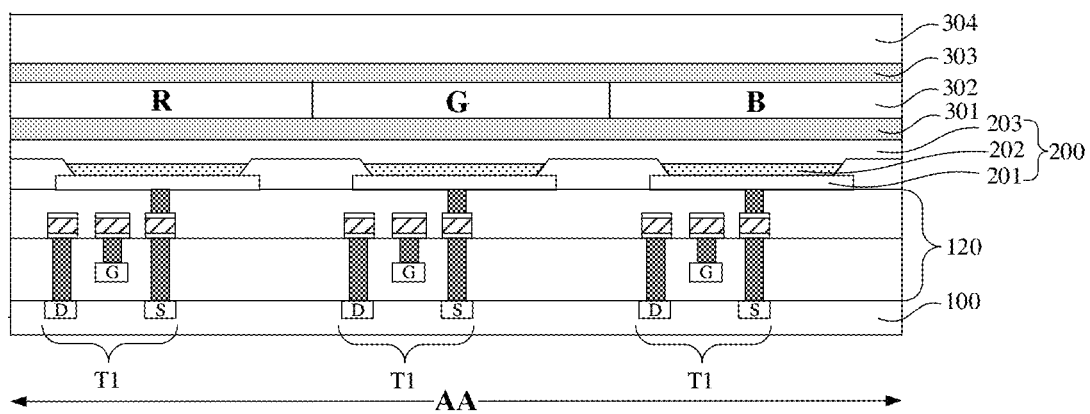
FIG. 17 is a schematic cross-sectional view of a silicon-based OLED display device according to an embodiment of the present disclosure.

FIG. 17 is a schematic cross-sectional view of a silicon-based OLED display device according to an embodiment of the present disclosure. As shown in FIG. 17, the silicon-based OLED display device includes a pixel circuit layer formed on a base substrate (e.g., a monocrystalline silicon substrate) 100 and a plurality of light emitting elements 200 formed on the pixel circuit layer 12. Here, the pixel circuit layer being formed on the monocrystalline silicon substrate means that the active layer of at least one transistor in the pixel circuit layer is formed in the monocrystalline silicon substrate. For example, the components indicated by "D" and "S" located in the substrate 100 are the drain region and source region of the transistor, respectively, and the region between the source region and drain region belongs to the channel region of the transistor. Therefore, the active layer of the transistor is formed in the base substrate. For example, the source region S and the drain region D can be obtained by doping specific regions of the monocrystalline silicon substrate, which will be described in more details in the following embodiments. In addition, the component indicated by "G" is a gate electrode. The performance of the transistor whose active layer is formed by using a partial region of the monocrystalline silicon substrate can be remarkably improved compared with that of a transistor whose active layer is formed by polycrystalline silicon or amorphous silicon. For example, each light emitting element 200 includes a first electrode 201 (e.g., serving as an anode), an organic light emitting functional layer 202 and a second electrode 203 (e.g., serving as a cathode) which are sequentially stacked. For example, the first electrode 201 can be electrically connected to the source region S of the transistor T1 in the corresponding pixel circuit through a tungsten via (via a connection portion corresponding to the source region S). It can be understood that the positions of the source region S and the drain region D can be interchanged, that is, the first electrode 201 can also be electrically connected to the drain region D. For example, the organic light emitting functional layer 202 can include an organic light emitting layer, and can further include one or more selected from the group consisting of an electron injecting layer, an electron transporting layer, a hole injecting layer, and a hole transporting layer. For example, the second electrode 203 is a transparent electrode; and for example, the second electrode 203 is a common electrode, that is, the plurality of light emitting elements 200 share an entire layer of the second electrode 203. For example, the emission color of the light emitting element 200 can be white, but is not limited thereto.

As shown in FIG. 17, the silicon-based OLED display device further includes a first encapsulation layer 301, a color filter layer 302, a second encapsulation layer 303 and a cover plate 304 which are sequentially disposed on the plurality of light emitting elements 200. For example, the first encapsulation layer 301 and the second encapsulation layer 302 can be polymer or/and ceramic thin film encapsulation layers, but are not limited thereto. For example, the color filter layer 302 includes a red filter unit R, a green filter unit G and a blue filter unit R, but is not limited thereto. For example, a filter unit, a corresponding light emitting element and a corresponding pixel circuit can be divided into a sub-pixel; For example, the red filter unit R, the green filter unit G and the blue filter unit R correspond to a red sub-pixel, a green subpixel and a blue subpixel, respectively. For example, the color filter layer 302 can be formed of materials commonly used in the prior art. For example, the cover plate 304 can be a glass cover plate, but is not limited thereto.

For example, the light emitting element 200 including the first electrode 201, the organic light emitting functional layer 202 and the second electrode 203, the first encapsulation layer 301, the color filter layer 302, the second encapsulation layer 303, and the cover plate 304 can all be fabricated in a panel factory in the industry downstream.

It should be noted that FIG. 17 merely exemplarily shows the structure of a display region (also referred to as active area, AA) of the silicon-based OLED display device.

Figure 18:
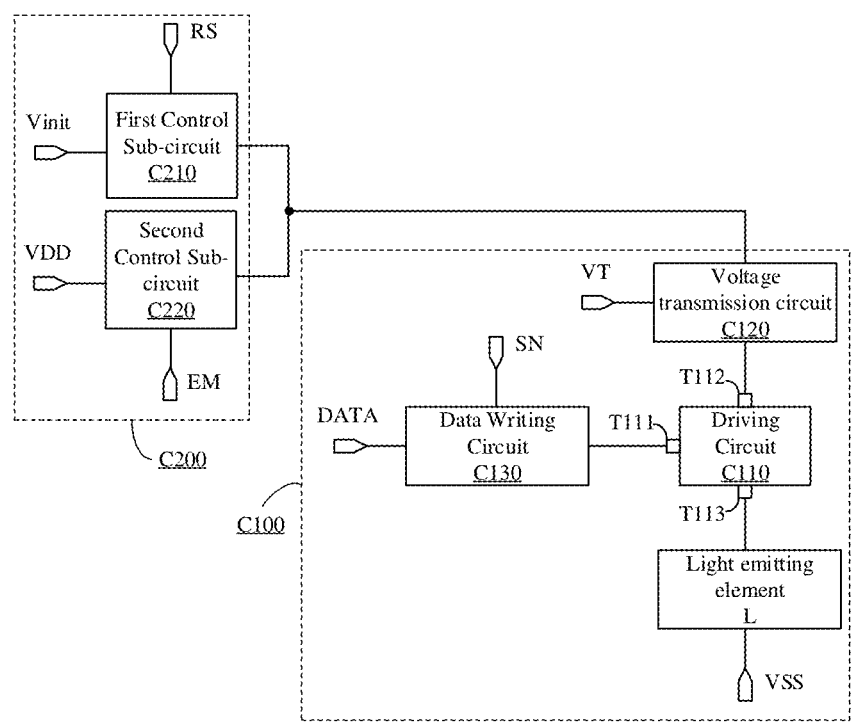
FIG. 18 is a schematic block diagram of a pixel circuit according to at least one embodiment of the present disclosure.

FIG. 18 is a schematic block diagram of a pixel circuit according to at least one embodiment of the present disclosure. As shown in FIG. 18, the pixel circuit includes a voltage control circuit C200 and a pixel sub-circuit C100.

For example, the voltage control circuit C200 is configured to provide a reset voltage Vinit to the pixel sub-circuit C100 in response to a reset control signal RS (e.g., to provide the reset voltage Vinit to a voltage transmission circuit C120 in the pixel sub-circuit C100 which is to be described in the following), and to provide a first power voltage VDD to the pixel sub-circuit C100 in response to a light emitting control signal EM (e.g., to provide the first power voltage VDD to the voltage transmission circuit C120 in the pixel sub-circuit C100 which is to be described in the following). For example, the first power voltage VDD can be a driving voltage, such as a high voltage.

For example, as shown in FIG. 18, the voltage control circuit C200 includes a first control sub-circuit C210 and a second control sub-circuit C220.

For example, the first control sub-circuit C210 is configured to provide the reset voltage Vinit to the pixel sub-circuit C100 in response to the reset control signal RS, for example, to provide the reset voltage Vinit to the voltage transmission circuit C120 in the pixel sub-circuit C100 which is to be described in the following. For example, in some examples, in a reset phase, the first control sub-circuit C210 is turned on in response to the reset control signal RS, so that the reset voltage Vinit is provided to the pixel sub-circuit C100 and a reset operation is performed on the light emitting element L via the pixel sub-circuit C100.

For example, the second control sub-circuit C220 is configured to provide the first power voltage VDD to the pixel sub-circuit C100 in response to the light emitting control signal EM, for example, to provide the first power voltage VDD to the voltage transmission circuit C120 in the pixel sub-circuit C100 which is to be described in the following. For example, in some examples, in a light emitting phase, the second control sub-circuit C220 is turned on in response to the light emitting control signal EM, so that the first power voltage VDD is provided to the pixel sub-circuit C100 to drive the pixel sub-circuit C100 to generate a driving current, and further, the light emitting element L is driven to emit light. For example, in some examples, after the light emitting phase lasts for a period of time, the input of the light emitting control signal EM can be stopped, and the second control sub-circuit can be closed, so that the first power voltage VDD cannot be applied to the pixel sub-circuit C100, the pixel sub-circuit C100 cannot generate the driving current, and the light emitting element L stops emitting light and enters a non-light emitting phase; for example, in some examples, after the non-light emitting phase lasts for a period of time, the light emitting control signal EM can be inputted again, so that the light emitting element L returns to the light emitting phase. Therefore, after entering the light-emitting phase, a light emitting time of the light emitting element L can be controlled by controlling whether the light emitting control signal EM is inputted or not, thereby realizing PWM dimming.

For example, as shown in FIG. 18, the pixel sub-circuit C100 includes a driving circuit C110, a voltage transmission circuit C120 and a data writing circuit C130.

For example, the driving circuit C110 includes a control terminal T111, a first terminal T112 and a second terminal T113, and is configured to control the voltage of the second terminal T113 according to the voltage of the control terminal T111 (e.g., the voltage of a data signal) and the voltage of the first terminal T112 (e.g., the first power voltage), and to generate a driving current for driving the light emitting element L to emit light based on the voltage of the second terminal T113. For example, in some examples, in the light emitting phase, the driving circuit C110 can control the voltage Vs of the second terminal T113 according to the voltage of the control terminal T111 (e.g., the voltage of the data signal) and the voltage of the first terminal T112 (e.g., the first power voltage VDD), and generate a driving current based on the voltage Vs, so that the driving circuit C110 can provide the driving current to the light emitting element L to drive the light emitting element L to emit light, and can provide a driving current corresponding to a grayscale to be displayed so as to drive the light emitting element L to emit light. It should be noted that in the embodiments of the present disclosure, a grayscale displayed by the light emitting element L is not only related to the magnitude of the driving current, but also related to the time duration of the driving current being applied to the light emitting element L (i.e., the light emitting time of the light emitting element L).

For example, the voltage transmission circuit C120 is configured to respectively apply the reset voltage Vinit and the first power voltage VDD to the first terminal T112 of the driving circuit C110 in response to a transmission control signal VT. For example, in some examples, in the reset phase, the voltage transmission circuit C120 is turned on in response to the transmission control signal VT, thereby applying the reset voltage Vinit provided by the first control sub-circuit C210 to the first terminal T112 of the driving circuit C110. Because the driving circuit C110 remains in an on state under the control of the data signal of a previous frame, the reset voltage Vinit can be transmitted to the light emitting element L via the driving circuit C110, thereby resetting the light emitting element L. For example, in some examples, in the light emitting phase, the voltage transmission circuit C120 is turned on in response to the transmission control signal VT, thereby applying the first power voltage VDD provided by the second control sub-circuit C220 to the first terminal T112 of the driving circuit C110. Because the driving circuit C110 is kept in an on state under the control of the data signal of a current frame, the driving circuit C110 can generate a driving current under the drive of the first power voltage VDD, thereby driving the light emitting element L to emit light. For example, in some examples, after entering the light emitting phase, the voltage transmission circuit C120 can be controlled to be turned on or off by controlling whether the transmission control signal VT is inputted or not, thereby controlling the light emitting time of the light-emitting element L, and further realizing PWM dimming For example, specific details can be referred to the above related description of controlling the light emitting time of the light emitting element L by controlling whether the light emitting control signal EM is inputted or not, and will not be repeated here.

It should be noted that after entering the light emitting phase, the light emitting time of the light emitting element L can be controlled by controlling whether the light emitting control signal EM is inputted and/or whether the transmission control signal VT is inputted, without being limited in the embodiments of the present disclosure.

For example, the data writing circuit C130 is configured to write a data signal DATA to the control terminal T111 of the driving circuit C110 in response to a scan signal SN and to store the data signal DATA being written. For example, the data writing circuit C130 further includes a storage capacitor, and the storage capacitor can receive and store the data signal DATA being written. For example, in some examples, in a data writing phase, the data writing circuit C130 is turned on in response to the scan signal SN, thereby writing the data signal DATA into the control terminal T111 of the driving circuit C110, and at the same time, the storage capacitor can store the data signal DATA being written, and further, the driving circuit C110 can be controlled by the stored data signal DATA in the light emitting phase, so that the driving circuit C110 can generates a driving current for driving the light emitting element L to emit light according to the data signal DATA. For example, the data writing circuit includes two switching transistors of different types, and for example, the two switching transistors are turned on in response to the scan signal SN. For example, specifically, one of the two switching transistors is turned on in response to the scan signal SN, and the other of the two switching transistors is turned on in response to an inverted signal SN of the scan signal SN.

For example, as shown in FIG. 18, the first electrode (e.g., anode) of the light emitting element L is coupled to the second terminal T113 of the driving circuit C110, and the second electrode (e.g., cathode) of the light emitting element L is coupled to a second power terminal to receive a second power voltage VSS. For example, the second power voltage VSS can be a low voltage, and for example, the second power voltage VSS can be a zero voltage or a ground voltage.

Figure 19:
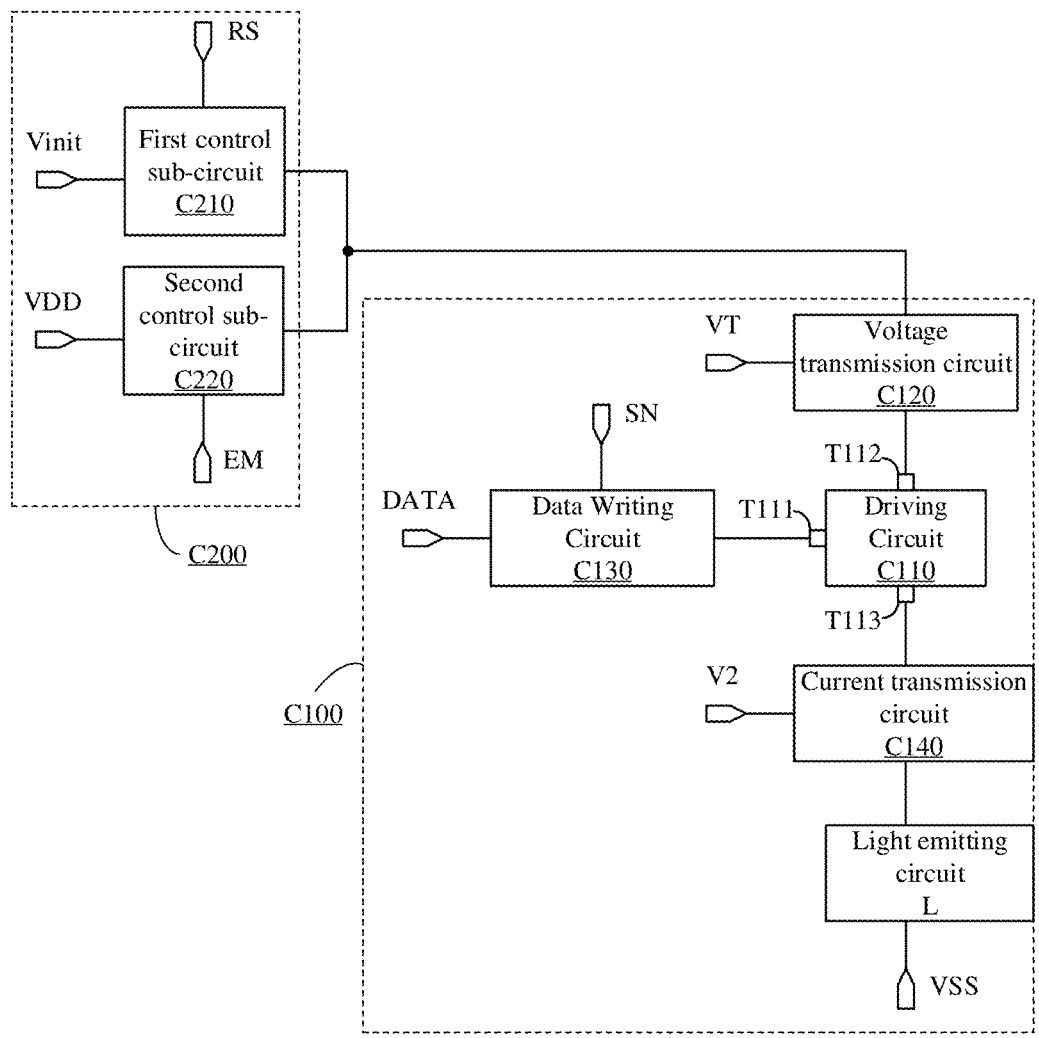
FIG. 19 is a schematic block diagram of another pixel circuit provided by at least one embodiment of the present disclosure.

FIG. 19 is a schematic block diagram of another pixel circuit provided by at least one embodiment of the present disclosure. As shown in FIG. 19, the pixel circuit shown in FIG. 19 further includes a current transmission circuit C140 on the basis of the pixel circuit shown in FIG. 18. It should be noted that other circuit structures in the pixel circuit shown in FIG. 19 (e.g., voltage control circuit C200, driving circuit C110, voltage transmission circuit C120, data writing circuit C130, etc.) are basically the same as those of the pixel circuit shown in FIG. 18, and details will not be repeated here.

For example, as shown in FIG. 19, the first electrode (e.g., anode) of the light emitting element L is coupled to the second terminal T113 of the driving circuit C110 via the current transmission circuit C140, and the second electrode (e.g., cathode) of the light emitting element L is coupled to the second power terminal to receive the second power voltage VSS. For example, the current transmission circuit C140 is configured to transmit the driving current generated by the driving circuit C110 to the light emitting element L. For example, in some examples, the control terminal of the current transmission circuit C140 is connected to a second voltage terminal to receive a second voltage V2, and the current transmission circuit C140 is substantially kept in an on state under the control of the second voltage V2; Thus, in the reset phase, the current transmission circuit C140 allows the reset voltage Vinit to be transmitted to the light emitting element L, and in the light emitting phase, the current transmission circuit C140 allows the driving current generated by the driving circuit C110 to be transmitted to the light emitting element L.

For example, in some examples, the current transmission circuit C140 can be made to function as a current clamp by selecting an appropriate second voltage V2. For example, when a high grayscale is displayed, the current transmission circuit C140 has a high turn-on degree under the control of the second voltage V2 and the voltage at the second terminal of the driving circuit C110, so that the light emitting element L can have a large light emitting brightness. For example, when a low gray scale is displayed, the current transmission circuit C140 has a low turn-on degree under the control of the second voltage V2 and the voltage at the second terminal of the driving circuit C110, so that the light emitting element L can have a low light emitting brightness. For example, when displaying a lowest grayscale, the current transmission circuit C140 has an extremely low turn-on degree (e.g., close to an off state) under the control of the second voltage V2 and the voltage at the second terminal of the driving circuit C110, so that the light emitting element L hardly emits light. Thus, the display contrast of the display substrate can be improved.

Figure 20:
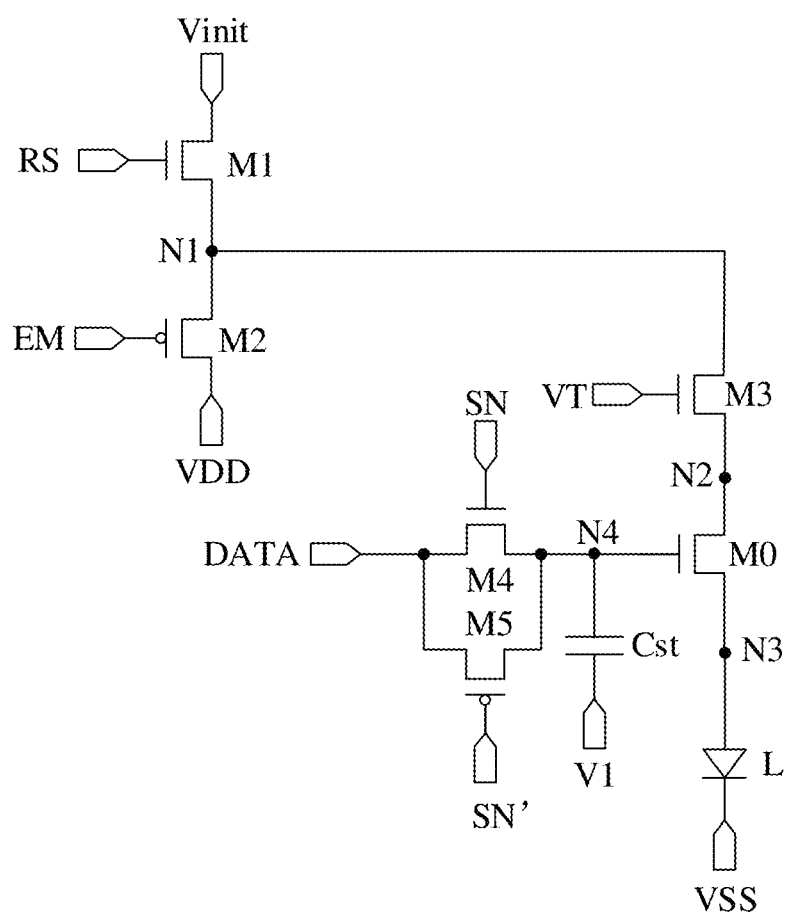
FIG. 20 is a circuit diagram of a specific implementation of the pixel circuit shown in FIG. 18.

FIG. 20 is a circuit diagram of a specific implementation of the pixel circuit shown in FIG. 18. As shown in FIG. 20, the pixel sub-circuit C100 includes a driving transistor M0, a first switching transistor M1, a second switching transistor M2, a third switching transistor M3, a fourth switching transistor M4, a fifth switching transistor M5, and a storage capacitor Cst. For example, the light emitting element L is also shown in FIG. 20. For example, the light emitting element L can include one selected from the group consisting of an organic light emitting diode, a quantum dot light emitting diode, and an inorganic light emitting diode. For example, the light emitting element L can adopt a micron-sized organic light emitting element, such as Micro-OLED, Mini-OLED, etc., and the embodiments of the present disclosure include but are not limited thereto. It should be noted that the types of each switching transistor in FIG. 20 are exemplary and should not be considered as a limitation to the embodiments of the present disclosure.

For example, as shown in FIG. 20, the first control sub-circuit C210 in the voltage control circuit C200 can be implemented as the first switching transistor M1. A gate electrode of the first switching transistor M1 is connected to a reset control signal terminal to receive the reset control signal RS, a first electrode of the first switching transistor M1 is connected to a reset voltage terminal to receive the reset voltage Vinit, and a second electrode of the first switching transistor M1 is connected to a first node N1. For example, as shown in FIG. 20, the first switching transistor M1 can be an N-type transistor, and the embodiments of the present disclosure include but are not limited thereto. For example, the reset voltage Vinit can be a zero voltage or a ground voltage, or can be other fixed voltages, such as a low voltage, etc., without being limited in the embodiments of the present disclosure. For example, when the reset control signal RS is at a high level, the N-type first switching transistor M1 is turned on; and when the reset control signal RS is at a low level, the N-type first switching transistor M1 is turned off.

For example, as shown in FIG. 20, the second control sub-circuit C220 in the voltage control circuit C200 can be implemented as the second switching transistor M2. A gate electrode of the second switching transistor M2 is connected to a light emitting control signal terminal to receive the light emitting control signal EM, a first electrode of the second switching transistor M2 is connected to a first power terminal to receive the first power voltage VDD, and a second electrode of the second switching transistor M2 is connected to the first node N1. For example, as shown in FIG. 20, the second switching transistor M2 can be a P-type transistor, and the embodiments of the present disclosure include but are not limited thereto. For example, the first power voltage VDD can be a driving voltage, such as a high voltage. For example, when the light emitting control signal EM is at a low level, the P-type second switching transistor M2 is turned on; and when the light emitting control signal EM is at a high level, the P-type second switching transistor M2 is turned off.

For example, as shown in FIG. 20, the voltage transmission circuit C120 in the pixel sub-circuit C100 can be implemented as the third switching transistor M3. A gate electrode of the third switching transistor M3 is connected to a transmission control signal terminal to receive the transmission control signal VT, a first electrode of the third switching transistor M3 is connected to the first node N1, and a second electrode of the third switching transistor M3 is connected to a second node N2. For example, as shown in FIG. 20, the third switching transistor M3 can be an N-type transistor, and the embodiments of the present disclosure include but are not limited thereto. For example, when the transmission control signal VT is at a high level, the N-type third switching transistor M3 is turned on; and when the transmission control signal VT is at a low level, the N-type third switching transistor M3 is turned off.

For example, as shown in FIG. 20, the driving circuit C110 in the pixel sub-circuit C100 can be implemented as the driving transistor M0. A gate electrode of the driving transistor M0 serves as the control terminal T111 of the driving circuit C110 and is connected to a fourth node N4, a first electrode of the driving transistor M0 serves as the first terminal T112 of the driving circuit C110 and is connected to the second node N2, and a second electrode of the driving transistor M0 serves as the second terminal T113 of the driving circuit C110 and is connected to a third node N3. For example, as shown in FIG. 20, the driving transistor M0 may be an N-type transistor, and the embodiments of the present disclosure include but are not limited thereto.

For example, as shown in FIG. 20, the data writing circuit C130 in the pixel sub-circuit C100 can be implemented as the fourth switching transistor M4 and the storage capacitor Cst. A gate electrode of the fourth switching transistor M4 is connected to a scan signal terminal to receive the scan signal SN, a first electrode of the fourth switching transistor M4 is connected to a data signal terminal to receive the data signal DATA, a second electrode of the fourth switching transistor M4 is connected to the fourth node N4, a first terminal of the storage capacitor Cst is connected to the fourth node N4 (i.e., coupled to the gate electrode of the driving transistor M0), and a second terminal of the storage capacitor Cst is connected to a first voltage terminal to receive the first voltage V1. For example, the first voltage V1 can be a fixed voltage, such as a zero voltage or a ground voltage. For example, the storage capacitor Cst can store the data signal DATA written to the fourth node N4 (i.e., the gate electrode of the driving transistor M0). For example, as shown in FIG. 20, the fourth switching transistor M4 can be an N-type transistor, and the embodiments of the present disclosure include but are not limited thereto. For example, when the scan signal SN is at a high level, the N-type fourth switching transistor M4 is turned on; and when the scan signal SN is at a low level, the N-type fourth switching transistor M4 is turned off.

For example, in some examples, as shown in FIG. 20, the data writing circuit C130 in the pixel sub-circuit C100 can further include the fifth switching transistor M5, that is, the data writing circuit C130 can be implemented as the fourth switching transistor M4, the fifth switching transistor M5, and the storage capacitor Cst. A gate electrode of the fifth switching transistor M5 is configured to receive the inverted signal SN' of the scan signal SN, a first electrode of the fifth switching transistor M5 is connected to the data signal terminal to receive the data signal DATA, and a second electrode of the fifth switching transistor M5 is connected to the fourth node N4. For example, the types of the fifth switching transistor M5 and the fourth switching transistor M4 are different. For example, as shown in FIG. 20, in the case where the fourth switching transistor is an N-type transistor, the fifth switching transistor M4 is a P-type transistor. For example, when the scan signal SN is at a high level, the inverted signal SN' thereof is at a low level, and the P-type fifth switching transistor M5 is turned on; and when the scan signal SN is at a low level, the inverted signal SN' thereof is at a high level, and the P-type fifth switching transistor M5 is turned off. That is, the fifth switching transistor M5 and the fourth switching transistor M4 can be turned on or off simultaneously. For example, the fifth switching transistor M5 and the fourth switching transistor M4 can be transistor elements with symmetrical structures; and for example, the fifth switching transistor M5 and the fourth switching transistor M4 can form a transmission gate (also referred to as an analog switch).

For example, the inverted signal SN' of the scan signal SN can be obtained by inputting the scan signal SN into an inverter circuit, and the embodiments of the present disclosure include but are not limited thereto. For example, the scan signal SN can be inputted to an input terminal of the inverter circuit, so that the inverted signal SN' is outputted by an output terminal of the inverter circuit. For example, the inverter circuit can be provided in each sub-pixel in the display region AA, or can be provided in a non-display region NA and transmit the inverted signal SN' of the scan signal SN to each row of sub-pixels via a wire. For example, the inverter circuit can be implemented in common manners, and details will not be described here.

In the case where the data writing circuit C130 includes only the fourth switching transistor M4, when the data writing circuit C130 writes the data signal DATA, the influence of the threshold voltage and the internal resistance of the fourth switching transistor M4 is always needed to be considered, so that the voltage range of the data signal DATA is small. The case where the data writing circuit C130 includes only the fifth switching transistor M5 is similar to the case where the data writing circuit C130 includes only the fourth switching transistor M4, and details will not be repeated here. In the case where the data writing circuit includes the fifth switching transistor M5 and the fourth switching transistor M4, the influence of the threshold voltages and the internal resistances of the two switching transistors is small, so that the voltage range of the data signal DATA can be increased. For example, the operation principle of the fifth switching transistor M5 and the fourth switching transistor M4 (i.e. the principle that the data signal DATA can have a large voltage range) can be referred to the operation principle of common CMOS transmission gates when being used in analog circuits, and details will not be described here.

For example, as shown in FIG. 20, the first electrode (e.g., anode) of the light emitting element L is coupled to the second electrode of the driving transistor M0, and the second electrode (e.g., cathode) of the light emitting element L is coupled to a second power terminal to receive the second power voltage VSS. For example, the second power voltage VSS can be a low voltage, and for example, the second power voltage VSS can be a zero voltage or a ground voltage.

Figure 21:
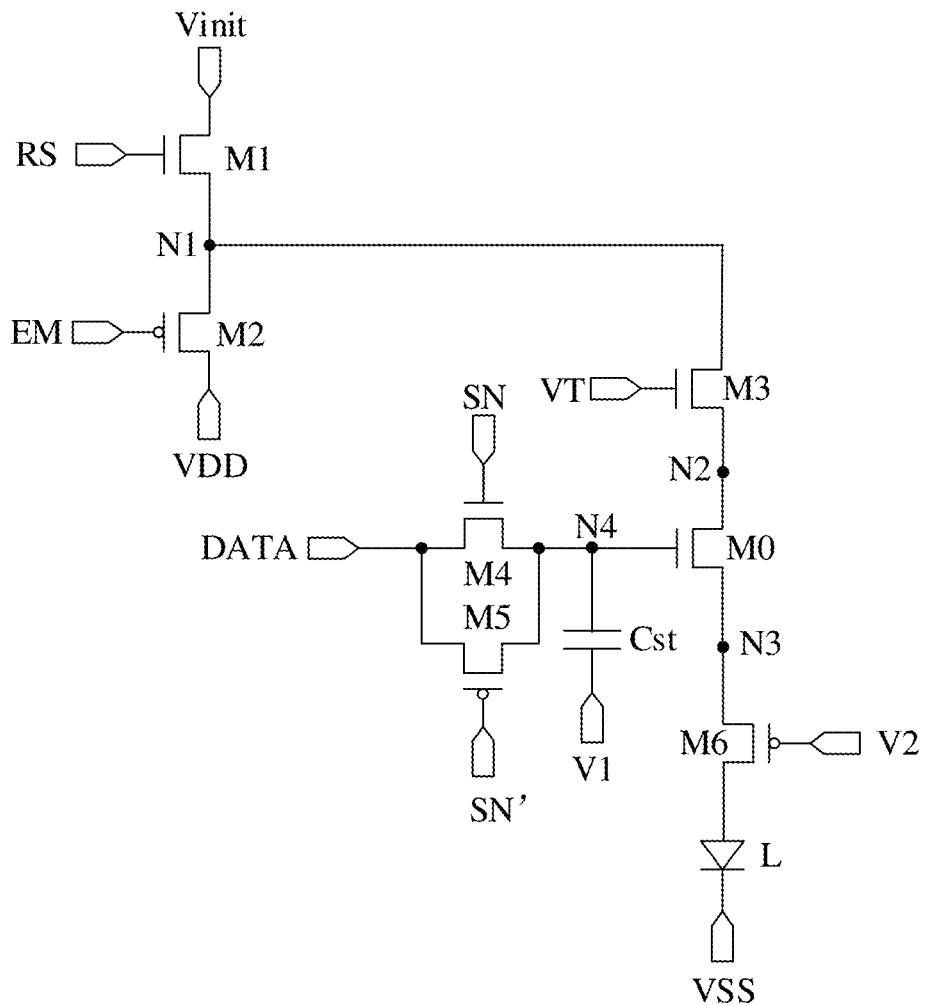
FIG. 21 is a circuit diagram of a specific implementation of the pixel circuit shown in FIG. 19.

FIG. 21 is a circuit diagram of a specific implementation of the pixel circuit shown in FIG. 19. As shown in FIG. 21, the pixel circuit shown in FIG. 21 further includes a sixth switching transistor M6 on the basis of the pixel circuit shown in FIG. 20. It should be noted that other circuit structures (e.g., driving transistor M0, first to fifth switching transistors M1-M5, storage capacitor Cst, etc.) in the pixel circuit shown in FIG. 21 are basically the same as those of the pixel circuit shown in FIG. 20, and details will not be repeated here.

For example, as shown in FIG. 21, the current transmission circuit C140 in the pixel sub-circuit C100 can be implemented as the sixth switching transistor M6. A gate electrode of the sixth switching transistor M6 is connected to a second voltage terminal to receive the second voltage V2, a first electrode of the sixth switching transistor M6 is connected to the third node N3, a second electrode of the sixth switching transistor M6 is coupled to the first electrode (e.g., anode) of the light emitting element L, and the second electrode (e.g., cathode) of the light emitting element L is connected to the second power terminal to receive the second power voltage VSS. For example, as shown in FIG. 21, the sixth switching transistor M6 can be a P-type transistor, and the embodiments of the present disclosure include but are not limited thereto. For example, in the case where the sixth switching transistor M6 is a P-type transistor, the second voltage V2 can be a zero voltage or a ground voltage, or can be other fixed voltages, such as a low voltage, etc. For example, the sixth switching transistor M6 is substantially kept in an on state under the control of the second voltage V2.

It should be noted that in the embodiment of the present disclosure, the storage capacitor Cst can be a capacitor element manufactured by a process. For example, specific capacitor electrodes are manufactured to realize the capacitor element, and each electrode of the capacitor can be realized by a metal layer, a semiconductor layer (e.g., doped polysilicon), etc. Moreover, the capacitor can also be a parasitic capacitance between various elements, and can be realized by a transistor itself and other elements and circuits. The connection manner of the capacitor is not limited to the manner described above, but can also be other suitable connection manners as long as the potential of the corresponding node can be stored.

It should be noted that in the description of the embodiments of the present disclosure, the first node N1, the second node N2, the third node N3 and the fourth node N4 do not represent components that must actually exist, but represent the junction points of related electrical connections in the circuit diagram.

It should be noted that the transistors adopted in the embodiments of the present disclosure can all be thin film transistors or field effect transistors or other switching devices having the same characteristics, without being limited in the embodiments of the present disclosure. The source electrode and drain electrode of the transistor adopted here can be symmetrical in structure, so the source electrode and drain electrode can be structurally indistinguishable. In the embodiments of the present disclosure, in order to distinguish the two electrodes of the transistor in addition to the gate electrode, one electrode is directly described as a first electrode and the other electrode is described as a second electrode. For example, in a specific implementation, taking a P-type transistor as an example, the first electrode can be a source electrode and the second electrode can be a drain electrode; and taking an N-type transistor as an example, the first electrode can be a drain electrode and the second electrode can be a source electrode. It should be noted that the embodiments of the present disclosure do not limit the type of each transistor. In a specific implementation, it is only needed to connect respective electrodes of a transistor of the selected type with reference to respective electrodes of a corresponding transistor in the embodiments of the present disclosure, and to allow the corresponding voltage terminals to provide corresponding high voltages or low voltages.

Figure 22:
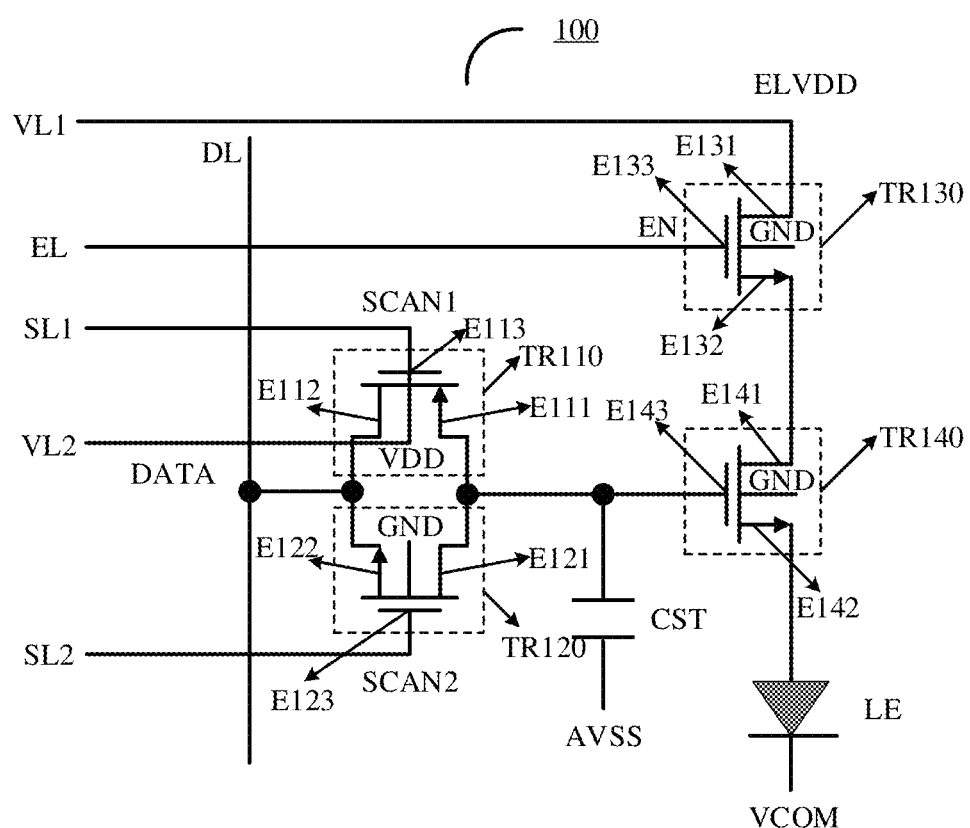
FIG. 22 illustrates a schematic diagram of a circuit structure of a pixel circuit according to an embodiment of the present disclosure.

FIG. 22 illustrates a schematic diagram of a circuit structure of a pixel circuit according to an embodiment of the present disclosure. As illustrated in FIG. 22, the pixel circuit includes a driving transistor TR140, a first transistor TR110, a second transistor TR120, and a third transistor TR130. It should be noted that, in some embodiments, the pixel circuit may not include the third transistor TR130, which is not limited in the embodiments of the present disclosure.

For example, the driving transistor TR140 includes a control electrode E143, a first electrode E141, and a second electrode E142, and the driving transistor TR140 is configured to control a driving current, flowing through the first electrode E141 of the driving transistor TR140 and the second electrode E142 of the driving transistor TR140, for driving a light-emitting element LE to emit light according to a voltage of the control electrode E143 of the driving transistor TR140. The light-emitting element LE can emit light of different intensity according to the magnitude of the driving current.

It should be noted that a source electrode and a drain electrode of the transistor adopted in the embodiment of the present disclosure may be symmetrical in structure, so the source electrode and the drain electrode of the transistor may have no difference in structure. In the embodiments of the present disclosure, in order to distinguish two electrodes except a gate electrode of the transistor, one electrode is directly described as the first electrode and the other electrode is directly described as the second electrode, so the first electrode and the second electrode of all or portion of the transistors in the embodiments of the present disclosure may be exchanged as required. For example, the first electrode of the transistor in the embodiments of the present disclosure may be the source electrode and the second electrode may be the drain electrode; or the first electrode of the transistor may be the drain electrode and the second electrode may be the source electrode. The following embodiments are described by taking that the first electrode of the transistor is the drain electrode, and the second electrode is the source electrode as examples and will not be described again.

For example, the first transistor TR110 is connected to the control electrode E143 of the driving transistor TR140 and is configured to write a data signal DATA to the control electrode E143 of the driving transistor TR140 in response to a first scan signal SCAN1.

For example, the second transistor TR120 is connected to the control electrode E143 of the driving transistor TR140 and is configured to write the data signal DATA to the control electrode E143 of the driving transistor TR140 in response to a second scan signal SCAN2.

For example, the third transistor TR130 is connected to the first electrode E141 of the driving transistor TR140 and is configured to apply a first power supply voltage ELVDD to the first electrode E141 of the driving transistor TR140 in response to a light-emitting control signal EN. For example, the first power supply voltage ELVDD in the embodiment of the present disclosure is a high-level voltage, for example, the first power supply voltage ELVDD is at 5V.

As illustrated in FIG. 22, in some embodiments, a first electrode E111 (for example, a drain electrode) of the first transistor TR110 and a first electrode E121 (for example, a drain electrode) of the second transistor TR120 are connected to each other to obtain a common electrode, and are connected to the control electrode E143 of the driving transistor TR140 through the common electrode.

In the above embodiment, a first scan signal line SL1, a second scan signal line SL2, a data line DL, a first power supply voltage line VL1, a light-emitting control line EL, and the like are further provided to provide corresponding electrical signals. A control electrode E113 of the first transistor TR110 is configured to receive the first scan signal SCAN1 from the first scan signal line SL1, and a second electrode E112 (for example, a source electrode) of the first transistor TR110 is configured to receive the data signal DATA from the data line DL. A control electrode E123 of the second transistor TR120 is configured to receive the second scan signal SCAN2 from the second scan signal line SL2, and a second electrode E122 (for example, a source electrode) of the second transistor TR120 is configured to receive the data signal DATA from the data line DL. A control electrode E133 of the third transistor TR130 is configured to receive the light-emitting control signal EN from the light-emitting control line EL, and a first electrode E131 (for example, a drain electrode) of the third transistor TR130 is configured to receive the first power supply voltage ELVDD from the first power supply voltage line VL1, and a second electrode E132 (for example, a source electrode) of the third transistor TR130 is connected to the first electrode E141 (for example, a drain electrode) of the driving transistor TR140.

The second electrode E142 (for example, a source electrode) of the driving transistor TR140 is configured to be connected to a first electrode of the light-emitting element LE. For example, in the case where the light-emitting element LE is an OLED, the second electrode E142 of the driving transistor TR140 may be connected to an anode of the OLED. For example, a second electrode of the light-emitting element LE is configured to receive a fourth power supply voltage VCOM. For example, the fourth power supply voltage VCOM in the embodiment of the present disclosure is a low-level voltage.

For example, in the embodiments of the present disclosure, the light-emitting element LE may adopt an OLED. In the case where a plurality of pixel units form a pixel array of a display panel, the second electrodes (for example, the cathodes) of the plurality of light-emitting elements OLED in the plurality of pixel units may be electrically connected together, for example, respectively connected to a same electrode or integrally formed to receive the fourth power supply voltage VCOM, that is, the plurality of light-emitting elements OLEDs in the plurality of pixel units adopt a common-cathode connection manner.

For example, the light-emitting element OLED may be of various types, such as top emission, bottom emission, etc., and may emit red light, green light, blue light, or white light, which is not limited in the embodiments of the present disclosure.

For example, as illustrated in FIG. 22, the pixel circuit further includes a storage capacitor CST to store the data signal DATA written to the control electrode E143 of the driving transistor TR140, so that the driving transistor TR140 can control the magnitude of the driving current that drives the light-emitting element LE according to the voltage of the data signal DATA. A first electrode of the storage capacitor CST is connected to the control electrode E143 of the driving transistor TR140, and a second electrode of the storage capacitor CST is configured to receive a third power supply voltage AVSS. For example, the third power supply voltage AVSS in the embodiment of the present disclosure is a low-level voltage. It should be noted that, in the embodiments of the present disclosure, the third power supply voltage AVSS may be the same as the fourth power supply voltage VCOM. For example, the third power supply voltage AVSS and the fourth power supply voltage VCOM are both grounded, and embodiments of the present disclosure include but are not limited thereto.

As illustrated in FIG. 22, in some embodiments of the present disclosure, the first transistor TR110 may be a P-type MOS transistor, and the second transistor TR120, the third transistor TR130, and the driving transistor TR140 may be N-type MOS transistors. For example, the first transistor TR110, the second transistor TR120, the third transistor TR130, and the driving transistor TR140 are formed in a base substrate. For example, the base substrate is a monocrystalline silicon substrate, and active layers of the first transistor TR110, the second transistor TR120, the third transistor TR130, and the driving transistor TR140 are formed in the monocrystalline silicon substrate, that is, the active layers are formed by the monocrystalline silicon.

For example, as illustrated in FIG. 22, a third electrode of the first transistor TR110 is configured to receive a second power supply voltage VDD. For example, the third electrode of the first transistor TR110 is connected to the second power supply voltage line VL2 to receive the second power supply voltage VDD.

For example, third electrodes of the second transistor TR120, the third transistor TR130, and the driving transistor TR140 are configured to be grounded (GND). It should be noted that, in the embodiment of the present disclosure, the third electrode of a transistor is an electrode opposite to the control electrode (gate electrode) of the transistor. The following embodiments are the same and will not be described again.

In the embodiments of the present disclosure, because the first transistor TR110 and the second transistor TR120 adopt MOS transistors having opposite semiconductor types, the first transistor TR110 and the second transistor TR120 may form a transmission gate switch having complementary characteristics. In this case, for example, the first scan signal SCAN1 provided to the first transistor TR110 and the second scan signal SCAN2 provided to the second transistor TR120 may be made to be mutually inverted signals, so that it can be guaranteed that one of the first transistor TR110 and the second transistor TR120 is always in an on state, and the data signal DATA may be transmitted to the storage capacitor CST without voltage loss, thereby improving the reliability and stability of the pixel circuit.

Figure 23:
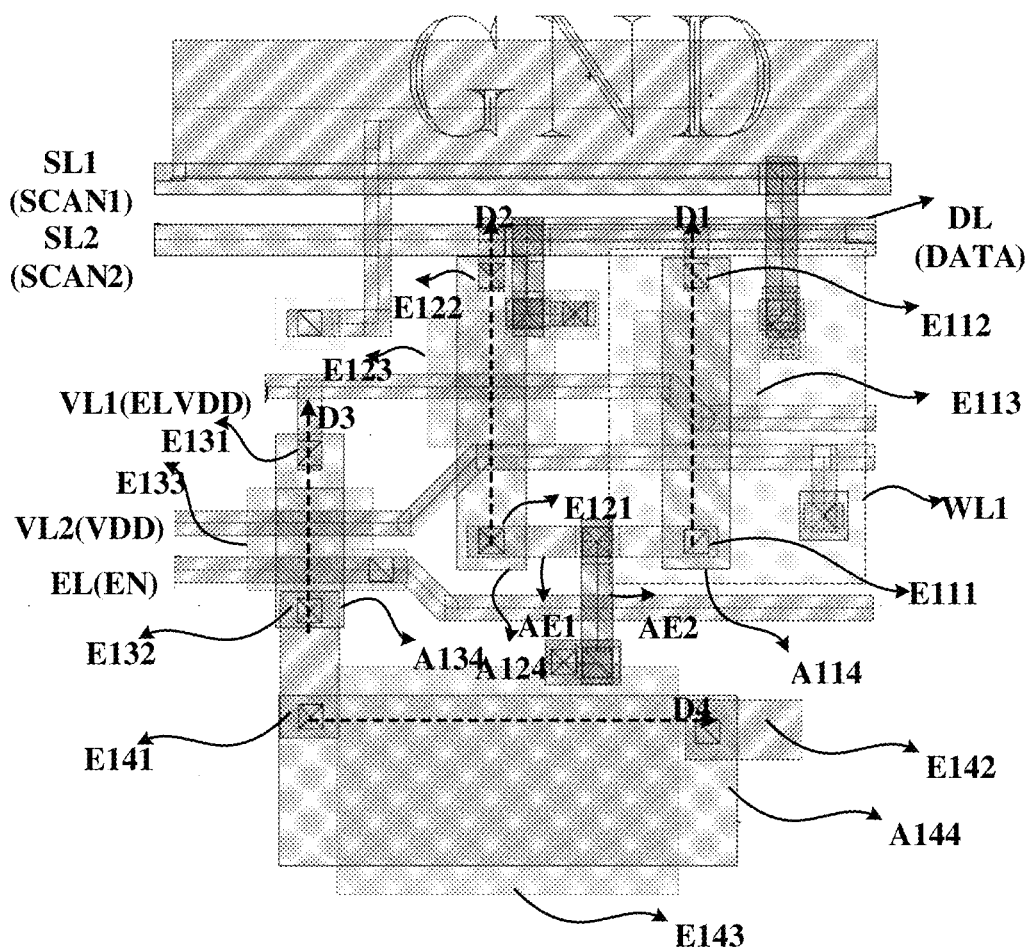
FIG. 23 is a schematic diagram showing a layout of a substrate of the display device 100 illustrated in FIG. 22.

FIG. 23 is a schematic diagram showing a layout of a substrate of the display device 100 illustrated in FIG. 22. As illustrated in FIG. 23, in the embodiments of the present disclosure, a direction along the first electrode E111 of the first transistor TR110 to the second electrode E112 of the first transistor TR110 is referred to as a first direction D1, a direction along the second electrode E121 of the second transistor TR120 to the second electrode E122 of the second transistor TR120 is referred to as a second direction D2, a direction along the first electrode E131 of the third transistor TR130 to the second electrode E132 of the third transistor TR130 is referred to as a third direction D3, and a direction along the first electrode E141 of the driving transistor TR140 to the second electrode E142 of the driving transistor TR140 is referred to as a fourth direction D4.

For example, at least one of the first direction D1 and the second direction D2 intersects with the fourth direction D4. For example, in the case where the pixel circuit includes the third transistor TR130, at least one of the first direction D1, the second direction D2 and the second three directions D3 intersects with the fourth direction D4. For example, the fourth direction D4 is a lateral direction from left to right in FIG. 3.

In the pixel circuit, because the size of the driving transistor TR140 is generally larger than that of other switching transistors (for example, the first transistor TR110, the second transistor TR120, and the third transistor TR130), the driving transistor TR140 may be arranged in the fourth direction D4 when arranging the positions of the transistors, while causing at least one of the first direction D1, the second direction D2 and the third direction D3 intersects with the fourth direction D4, so that the layout of the four transistors may be more compact, the layout area occupied by the display device 100 may be reduced, and the display device 100 may be easier to achieve high PPI.

In some embodiments of the present disclosure, the first direction D1 and the second direction D2 may both be intersected with the fourth direction D4; for another example, the first direction D1, the second direction D2, and the third direction D3 may all be intersected with the fourth direction D4. For example, as illustrated in FIG. 23, the fourth direction D4 is the lateral direction, and the first direction D1, the second direction D2, and the third direction D3 are all longitudinal directions perpendicular to the lateral direction in FIG. 23.

For example, in some implementations of the present disclosure, the first direction D1 and the second direction D2 are both perpendicular to the fourth direction D4; for another example, the first direction D1, the second direction D2, and the third direction D3 are all perpendicular to the fourth directions D4. For the case where the plurality of the pixel units in a display region of the display device are arranged in a rows and columns manner, using this manner can make the layout of the display device 100 more compact, thereby further reducing the area occupied by the display device 100, and causing the display device 100 to be easier to achieve high PPI.

For example, as illustrated in FIG. 23, the first transistor TR110 includes a first active region A114 extending along the first direction D1, and the first active region A114 includes the first electrode E111 of the first transistor TR110, the second electrode E112 of the first transistor TR110, and a channel region formed between the first electrode E111 of the first transistor TR110 and the second electrode E112 of the first transistor TR110.

The second transistor TR120 includes a second active region A124 extending along the second direction D2, and the second active region A124 includes the first electrode E121 of the second transistor T120, the second electrode E122 of the second transistor TR120, and a channel region formed between the first electrode E121 of the second transistor TR120 and the second electrode E122 of the second transistor TR120.

The third transistor TR130 includes a third active region A134 extending along the third direction D3, and the third active region A134 includes the first electrode E131 of the third transistor TR130, the second electrode E132 of the third transistor TR130, and a channel region formed between the first electrode E131 of the third transistor TR130 and the second electrode E132 of the third transistor TR130.

The driving transistor TR140 includes a fourth active region A144 extending along the fourth direction D4, and the fourth active region A144 includes the first electrode E141 of the driving transistor TR140, the second electrode E142 of the driving transistor TR140, and a channel region formed between the first electrode E141 of the driving TR140 and the second electrode E142 of the driving transistor TR140.

For example, the base substrate in the display device 100 provided by the embodiment of the present disclosure is a silicon-based base substrate, and the first active region A114, the second active region A124, the third active region A134, and the fourth active region A144 are all doped regions in the silicon-based base substrate. These doped regions are obtained, for example, by an ion implantation process or an ion diffusion process. For example, the silicon-based base substrate is a monocrystalline silicon substrate, P-type doping may be achieved by doping boron (B), N-type doping may be achieved by doping phosphorus (P) or arsenic (As), and the embodiment of the present disclosure does not limit this.

For example, in some embodiments of the present disclosure, the doping types of the first active region A114 and the second active region A124 are opposite. For example, the doping type of the first active region A114 is P-type, and the doping type of the second active region A124 is N-type.

As illustrated in FIG. 23, two ends of the first active region A114 and two ends of the second active region A124 are aligned with each other in the fourth direction D4, and, for example, the two ends of the first active region A114 and the second active region A124 are arranged adjacent to each other. In this way, the layout design of the display device 100 can be simplified.

A line between an edge of the first active region A114 along the first direction D1 and an edge of the second active region A124 along the second direction D2 is parallel to the fourth direction D4; and a line between the other edge of the first active region A114 along the first direction D1 and the edge of the second active region A124 along the second direction D2 is parallel to the fourth direction D4. In this way, the layout design of the display device 100 can be simplified.

Compared with a silicon-based analog CMOS circuit for non-display applications, the driving current for the light-emitting element LE in the display device 100 provided by the embodiment of the present disclosure is relatively small by 1 to 2 orders of magnitude. The current characteristic of the driving transistor 140 in a saturated state is:

$$I_D = \frac{1}{2}\frac{W}{L}K(V_{GS4}V_{th})^2;$$

$I_D$ is the driving current provided by the driving transistor 140, W/L is the width-to-length ratio of the driving transistor 140, K is a constant value, $V_{GS4}$ is the voltage difference between the gate electrode and the source electrode of the driving transistor 140, and $V_{th}$ is the threshold voltage of the driving transistor 140.

It can be seen from the above formula that in order to achieve a lower driving current, the value L of the driving transistor 140 may be increased in the size design, which is disadvantageous for reducing the layout area of the display device 100 adopting the driving transistor 140. It should be noted that the current characteristic of the driving transistor 140 in the saturated state are listed here only to illustrate the size design of the silicon-based transistor for display purposes, and not to indicate that the driving transistor in the above pixel circuit is limited to work in the saturated state to display. For example, the driving transistor in the pixel circuit according to an embodiment of the present disclosure may also work in a sub-threshold region when driving display. The voltage between the source electrode and the drain electrode of the driving transistor in the sub-threshold region is proportional to the voltage of the gate electrode. This driving method can simplify the structure of the pixel circuit, which will be described in more detail later.

The pixel circuit 100 provided by some embodiments of the present disclosure may improve or avoid the above problems by adjusting the relative relationship between the doping concentration of the channel region of the first active region A114, the doping concentration of the channel region of the second active region A124, the doping concentration of the channel region of the third active region A134, and the doping concentration of the channel region of the fourth active region A144.

For example, the doping concentration of the channel region of the fourth active region A144 is smaller than the doping concentration of the channel region of the third active region A134. For example, the doping concentration of the channel region of the third active region A134 is about $1\times10^{17}$ cm$^{-3}$ to $9\times10^{17}$ cm$^3$, the doping concentration of the channel region of the fourth active region A144 is about $1\times10^{13}$ cm$^{-3}$ to $9\times10^{13}$ cm$^{-3}$, and the doping concentration of the channel region of the fourth active region A144 is 4 orders of magnitude smaller than the doping concentration of the channel region of the third active region A134. In the embodiment of the present disclosure, without changing the size of the driving transistor TR140 (for example, the width-to-length ratio W/L does not change), by reducing the doping concentration of the channel region of the fourth active region A144, the driving transistor TR140 may output a smaller driving current, and the driving current that outputted may be changed more smoothly, so that the value of the driving current that outputted may be controlled more accurately, and the gray level value when the pixel circuit adopting the driving transistor TR140 drives the light-emitting element LE (for example, an OLED) to emit light can be controlled more accurately.

For example, in the case where the doping concentration is different at different positions in the channel region, the doping concentration of the channel region is the average doping concentration of the channel region of the transistor.

For example, in the display device 100 provided by some embodiments of the present disclosure, the doping concentration of the channel region of at least one of the first active region A114 and the second active region A124 is greater than the doping concentration of the channel region of the third active region A134.

For example, the doping concentration of the channel region of the first active region A114 and the doping concentration of the channel region of the second active region A124 are both greater than the doping concentration of the channel region of the third active region A134. For example, the doping concentration of the channel region of the first active region A114 and the doping concentration of the channel region of the second active region A124 are about $1\times10^{20}$ cm$^3$ to $9\times10^{20}$ cm$^{-3}$. In this case, the doping concentration of the channel region of the first active region A114 and the doping concentration of the channel region of the second active region A124 are 3 orders of magnitude greater than the doping concentration of the channel region of the third active region A134.

As illustrated in FIG. 22, the first transistor TR110 and the second transistor TR120 are used as switching transistors in the pixel circuit, so the first transistor TR110 and the second transistor TR120 need to have good switching characteristics. In the case where the doping concentration of the channel region of the first active region A114 or/and the second active region A124 is greater, a larger driving current can be obtained and the driving current changes faster, so that the first transistor TR110 or/and the second transistor TR120 has better switching characteristics.

For example, in the embodiments of the present disclosure, the first transistor TR110 is a first semiconductor type MOS transistor, the second transistor, the third transistor, and the driving transistor are all second semiconductor type MOS transistors, and the first semiconductor type and the second semiconductor type are opposite. For example, the first semiconductor type is a P-type, the second semiconductor type is an N-type, and the embodiments of the present disclosure include but are not limited thereto.

As illustrated in FIG. 23, the display device 100 provided by some embodiments of the present disclosure further includes a first scan signal line SL1 for transmitting the first scan signal SCAN1 and a second scan signal line SL2 for transmitting the second scan signal SCAN2. The first scan signal line SL1 is arranged in parallel with the second scan signal line SL2.

For example, the first scan signal line SL1 is connected to the control electrode E113 of the first transistor TR110 to provide the first scan signal SCAN1, and the second scan signal line SL2 is connected to the control electrode E123 of the second transistor TR120 to provide the second scan signal SCAN2.

For example, the extended directions of the first scan signal line SL1 and the second scan signal line SL2 are both parallel to the fourth direction D4. The orthographic projection of the first scan signal line SL1 on the base substrate is parallel to the orthographic projection of the second scan signal line SL2 on the base substrate, for example, are both parallel to the fourth direction D4.

For example, a region where the orthographic projection of the pixel circuit on the base substrate is the pixel region, and the first scan signal line SL1 and the second scan signal line SL2 are arranged side by side at a side of the pixel region.

As illustrated in FIG. 23, the display device 100 provided by some embodiments of the present disclosure further includes a data line DL for transmitting the data signal DATA, and the orthographic projection of the second scan signal line SL2 on the base substrate is at least partially overlap with the orthographic projection of the data line DL on the base substrate. For example, the second scan signal line SL2 and the data line DL overlap in a direction perpendicular to the base substrate. For example, as illustrated in FIG. 23, the plane on which FIG. 23 is located may be regarded as the plane on which the base substrate is located, and then being perpendicular to the base substrate is being perpendicular to the plane on which FIG. 23 is located. In the embodiment of the present disclosure, the data line DL does not occupy an additional layout area by overlapping the second scan signal line SL2 and the data line DL in the direction perpendicular to the base substrate, thereby further reducing the layout area occupied by the display device 100, and advantageously implementing high PPI.

As illustrated in FIG. 23, the display device 100 provided by some embodiments of the present disclosure further includes a first power supply voltage line VL1 for transmitting the first power supply voltage ELVDD and a light-emitting control line EL for transmitting the light-emitting control signal EN.

For example, a partial extended direction of the first power supply voltage line VL1 and a partial extended direction of the light-emitting control line EL are respectively parallel to the fourth direction D4. The orthographic projections of the first scan signal line SL1, the second scan signal line SL2, the first power supply voltage line VL1, and the light-emitting control line EL on the base substrate are sequentially arranged in the direction perpendicular to the fourth direction D4.

It should be noted that, in the display device 100 provided by some embodiments of the present disclosure, as illustrated in FIG. 23, the orthographic projection of the first power supply voltage line VL1 on the base substrate is between the orthographic projection of the second scan signal line SL2 on the base substrate and the orthographic projection of the light-emitting control line EL on the base substrate, because the first power supply voltage ELVDD transmitted by the first power supply voltage line VL1 is a DC signal, and the second scan signal SCAN2 transmitted by the second scan signal line SL2 and the light-emitting control signal EN transmitted by the light-emitting control line EL are jumping signals, the above arrangement can effectively shield the mutual interference between the second scan signal SCAN2 and the light-emitting control signal EN.

As illustrated in FIG. 23, the display device 100 provided by some embodiments of the present disclosure further includes a second power supply voltage line VL2 for transmitting the second power supply voltage VDD, and the third electrode of the first transistor TR110 is electrically connected to the second power supply voltage line VL2 to receive the second power supply voltage VDD. For example, the second power supply voltage VDD in the embodiment of the present disclosure is a high-level voltage, for example, the second power supply voltage is at 5V.

For example, the first transistor TR110 is a P-type MOS transistor, and doped regions (the source region and the drain region) corresponding to the first electrode and the second electrode of the first transistor TR110 are P-type doping. As illustrated in FIG. 22, the third electrode opposite to the control electrode (the gate electrode) E113 of the first transistor TR110 receives the second power supply voltage VDD. For example, the second transistor TR120, the third transistor TR130 and the driving transistor TR140 are all N-type MOS transistor, doped regions (the source region and the drain region) corresponding to the first electrode and the second electrode thereof are N-type doping, and the third electrodes of the TR120, the third transistor TR130, and the driving transistor TR140 are all configured to be grounded (GND).

For example, the orthographic projection of the second power supply voltage line VL2 on the base substrate is between the orthographic projection of the first power supply voltage line VL1 on the base substrate and the orthographic projection of the light-emitting control line EL on the base substrate, and the extending direction of a part of the second power supply voltage line VL2 is parallel to the fourth direction D4.

As illustrated in FIG. 23, the second power supply voltage line VL2 has a bending region when extending along the fourth direction D4. In addition, the light-emitting control line EL also has a bending region when extending along the fourth direction D4, and bending directions of the second power supply voltage line VL2 and the light-emitting control line EL are different. For example, adopting this wiring manner can leave a layout space for a first transition electrode AE1 described below.

For example, as illustrated in FIG. 23, the first transistor TR110 and the second transistor TR120 are both disposed between the second scan signal line SL2 and the light-emitting control line EL, the first transistor TR110 intersects with the first power supply voltage line VL1 and the second power supply voltage line VL2, and the second transistor TR120 intersects with the first power supply voltage line VL1 and the second power supply voltage line VL2.

For example, the orthographic projection of the first active region A114 of the first transistor TR110 on the base substrate and the orthographic projection of the second active region A124 of the second transistor TR120 on the base substrate are both located between the orthographic projection of the second scan signal line SL2 on the base substrate and the orthographic projection of the light-emitting control line EL on the base substrate.

The orthogonal projection of the first active region A114 of the first transistor TR110 on the base substrate intersects with the orthographic projection of the first power supply voltage line VL1 on the base substrate, and the orthogonal projection of the first active region A114 of the first transistor TR110 on the base substrate intersects with the orthographic projection of the second power supply voltage line VL2 on the base substrate.

The orthogonal projection of the second active region A124 of the second transistor TR120 on the base substrate intersects with the orthographic projection of the first power supply voltage line VL1 on the base substrate, and the orthogonal projection of the second active region A124 of the second transistor TR120 on the base substrate intersects with the orthographic projection of the second power supply voltage line VL2 on the base substrate.

As illustrated in FIG. 23, the display device 100 provided by some embodiments of the present disclosure further includes the first transition electrode AE1 disposed on a first side of the light-emitting control line EL, and a second transition electrode AE2 extending from the first side of the light-emitting control line EL to a second side of the light-emitting control line EL.

For example, the orthographic projection of the second transition electrode AE2 on the base substrate intersects with the orthographic projection of the light-emitting control line EL on the base substrate. The two ends of the first transition electrode AE1 are electrically connected to the first electrode E111 of the first transistor TR110 and the first electrode E121 of the second transistor TR120, respectively. The first transition electrode AE1 is electrically connected to the second transition electrode AE2, and the second transition electrode AE2 is electrically connected to the control electrode E143 of the driving transistor TR140.

For example, the extending direction of the second transition electrode AE2 is perpendicular to the extending direction of the first transition electrode AE1 and is perpendicular to the fourth direction D4.

Because the second transition electrode AE2 is connected to the storage capacitor CST, the level of the second transition electrode AE2 may fluctuate greatly during the operation of the pixel circuit, and the fluctuation may cause crosstalk to the first power supply voltage line VL1 and generate noise. In the display device 100 provided by the embodiment of the present disclosure, the first power supply voltage line VL1 and the second transition electrode AE2 are spaced apart by using the second power supply voltage line VL2, so that the crosstalk caused by the fluctuation of the level of the second transition electrode AE2 on the first power supply voltage line VL1 can be reduced, and noise can be isolated.

In addition, the display device 100 provided by some embodiments of the present disclosure extends the first active region A114 of the first transistor TR110 and the second active region 124 of the second transistor TR120, thereby leaving wiring channels for the second power supply voltage line VL2.

For example, the layout size of the pixel circuit (rectangular shape) provided by an embodiment of the present disclosure is approximately 4.5 μm×2.9 μm.

At least one embodiment of the present disclosure provides a display device 100 including a base substrate and a pixel circuit formed on the base substrate. The pixel circuit includes a driving transistor TR140, a first transistor TR110, and a second transistor TR120. The driving transistor TR140 includes a control electrode E143, a first electrode E141, and a second electrode E142, and is configured to control a driving current, flowing through the first electrode E141 of the driving transistor TR140 and the second electrode E142 of the driving transistor TR140, for driving a light-emitting element LE to emit light according to a voltage of the control electrode E143 of the driving transistor TR140. A first electrode E111 of the first transistor TR110 is connected to the control electrode E143 of the driving transistor TR140 and is configured to write a data signal DATA to the control electrode E143 of the driving transistor TR140 in response to a first scan signal SCAN1. The second transistor TR120 is connected to the control electrode E143 of the driving transistor TR140 and is configured to write the data signal DATA to the control electrode E143 of the driving transistor TR140 in response to a second scan signal SCAN2. In addition, for a more specific description of the pixel circuit, reference may be made to the embodiments described above.

Figure 24:
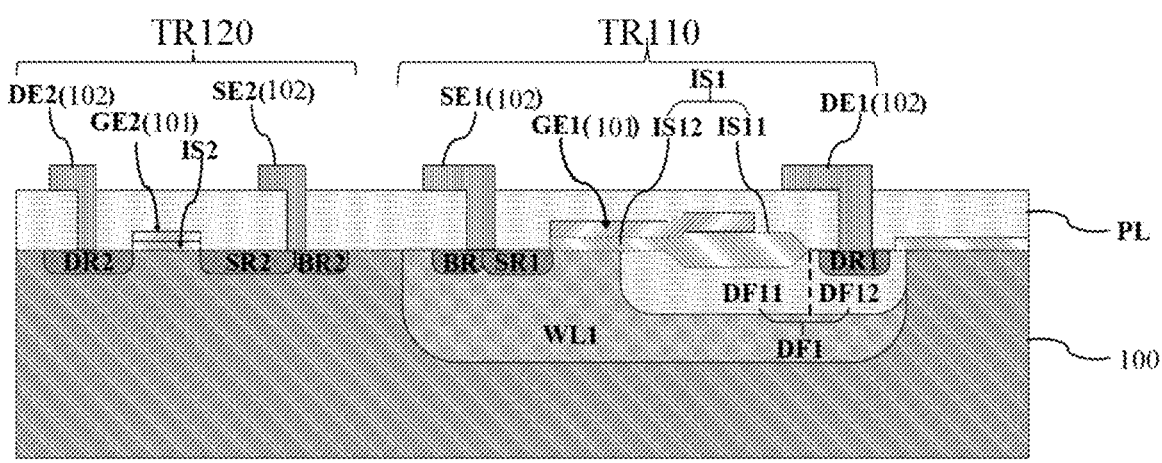
FIG. 24 is a cross-sectional schematic view of two transistor according to an embodiment of the present disclosure.

For example, as illustrated in FIG. 24, the base substrate includes a semiconductor body 100 that can be doped, and a first conductive layer 101 and a second conductive layer 102 that are both on the semiconductor body 100. In this embodiment, the first conductive layer 101 and the second conductive layer 102 are included in the base substrate for convenience of description herein. However, as described above, the first conductive layer 101 and the second conductive layer 102 may be formed on a base substrate such as a monocrystalline silicon substrate or a silicon-on-insulator (SOI) substrate. For example, the first conductive layer 101 can be a polysilicon layer.

The first transistor TR110 includes a gate electrode GE1 in the first conductive layer 101, a second electrode SE1 and a first electrode DE1 that are both in the second conductive layer 102, a first doped region DR1 in contact with the first electrode DE1 of the first transistor TR110, and a second doped region SR1 in contact with the second electrode SE1 of the first transistor TR110. The first doped region DR1 of the first transistor TR110 and the second doped region SR1 of the first transistor TR110 are spaced apart from each other, have the same doping type, and are both in the semiconductor body 100. The channel region of the first transistor TR110 is between the first doped region DR1 and the second doped region SR1. When the first transistor TR110 is turned on in response to a control voltage applied on the gate electrode GE1, the first doped region DR1 and the second doped region SR1 are conducted through the channel region. It should be noted that the gate electrode GE1 of the first transistor TR110 here is the control electrode E113 of the first transistor TR110 described above. The following embodiments are the same and will not be described again. The first conductive layer 101 being used to form the gate electrode is taken as an example, but the embodiment of the disclosure is not limited thereto. The first conductive layer 101 can be further used to form an electrode of a capacitor and/or other components.

As illustrated in FIG. 24, the first transistor TR110 further includes a drift doped region DF1 in contact with the first doped region DR1, and the drift doped region DF1 of the first transistor TR110 and the second doped region SR1 of the first transistor TR110 are spaced apart from each other, have the same doping type, and are both in the semiconductor body 100. For example, the first transistor TR110 is a P-type MOS transistor. The doping types of the first doped region DR1, the second doped region SR1, and the drift doped region DF1 of the first transistor TR110 are all P-type doping, and the doping type of the semiconductor body 100 is a P-type bulk silicon or a P-type silicon-on-insulator (SOI).

For example, the orthographic projection of the gate electrode GE1 of the first transistor TR110 on the base substrate partially overlaps with the orthographic projection of the drift doped region DF1 of the first transistor TR110 on the base substrate, and the orthographic projection of the first doped region DR1 of the first transistor TR110 on the base substrate is in the orthographic projection of the drift doped region DF1 of the first transistor TR110 on the base substrate. The doping concentration of the drift doped region DF1 of the first transistor TR110 is smaller than the doping concentration of the first doped region DR1 of the first transistor TR110. When the first transistor TR110 is turned on in response to the control voltage applied on the gate electrode GE1, the first doped region DR1 and the second doped region SR1 are conducted through the channel region and the drift doped region DF1 of the first transistor TR110.

In the display device 100 provided by the embodiment of the present disclosure, the pixel circuit provides the drift doped region DF1 in the first transistor TR110 and makes the doping concentration of the drift doped region DF1 of the first transistor TR110 smaller than the doping concentration of the first doped region DR1 of the first transistor TR110, so that a breakdown voltage between the first electrode DE1 and the second electrode SE1 of the first transistor TR110 may be increased, and the first transistor TR110 may reduce or avoid the risk of being broken down by a high voltage. For example, the first transistor TR110 is a P-type MOS transistor.

As illustrated in FIG. 24, in at least one embodiment, the drift doped region DF1 of the first transistor TR110 includes a first portion DF11 and a second portion DF12, and the orthographic projection of the second portion DF12 on the base substrate overlaps with the orthographic projection of the first doped region DR1 of the first transistor TR110 on the base substrate. In this case, it can be considered that the second portion DF12 of the first doped region DF1 of the first transistor TR110 constitutes a part of the channel region and is different from other parts of the channel region. For example, the first doped region DR1 of the first transistor 110 is in the drift doped regions DF1 of the first transistor 110. For example, the doping depth of the first doped region DR1 of the first transistor TR110 in the semiconductor body 100 may be smaller than, equal to, or greater than the doping depth of the drift doped region DF1 of the first transistor TR110.

As illustrated in FIG. 24, in the first transistor TR110 provided by some embodiments of the present disclosure, the first doped region DR1, the second doped region SR1, and the drift doped region DF1 of the first transistor TR110 are in a first well WL1 in the semiconductor body 100, for example, the doping type of the first well WL1 is N-type doping.

The orthographic projection of the gate electrode GE1 of the first transistor TR110 on the base substrate is in the orthographic projection of the first well WL1 on the base substrate, and a portion, between the first doped region DR1 of the first transistor TR110 and the second doped region SR1 of the first transistor TR110, of the first well WL1 constitutes the channel region of the first transistor TR110. For example, the region where the first well WL1 is located is shown in FIG. 23.

For example, as illustrated in FIG. 24, the first transistor TR110 further includes an auxiliary doped region BR. For example, the doping type of the auxiliary doped region BR of the first transistor TR110 is N-type doping, the auxiliary doped region BR of the first transistor TR110 is in contact with the second doped region SR1 of the first transistor TR110, the auxiliary doped region BR of the first transistor TR110 is electrically connected to the second electrode SE1 of the first transistor TR110, and the orthographic projection of the auxiliary doped region BR of the first transistor TR110 on the base substrate is in the orthographic projection of the first well WL1 on the base substrate. The auxiliary doped region BR may play an isolation role to prevent leakage.

As illustrated in FIG. 24, the base substrate in the display device 100 provided by some embodiments of the present disclosure further includes a first insulating layer IS1 between the semiconductor body 100 and the first conductive layer 101. The first insulating layer IS1 may make the gate electrode GE1 of the first transistor TR110 to be insulated from the semiconductor body 100. For example, the first insulating layer IS1 may be a gate insulating layer, such as a silicon oxide layer, and may be formed by a vapor deposition process, or directly obtained by oxidizing a silicon-based base substrate through a thermal oxidation process.

The first insulating layer IS1 includes a first portion IS11 close to the first doped region DR1 of the first transistor TR110 and a second portion IS12 away from the first doped region DR1 of the first transistor TR110.

For example, in at least one embodiment, the thickness of the first portion IS11 of the first insulating layer IS1 is greater than the thickness of the second portion IS12 of the first insulating layer IS1, and the thickness is a thickness along the direction perpendicular to the base substrate. For example, the thickness of the first portion IS11 of the first insulating layer IS1 is 7 to 8 nanometers, and the thickness of the second portion IS12 of the first insulating layer IS1 is 2 to 3 nanometers.

In the embodiment of the present disclosure, by increasing the thickness of the first portion IS11 of the first insulating layer IS1, for example, more than twice the thickness of the second portion IS12, the risk of that a region between the gate electrode GE1 of the first transistor TR110 and the first electrode DE1 of the first transistor TR110 being broken down by a high voltage may be reduced or avoided.

As illustrated in FIG. 24, the base substrate further includes a planarization insulating layer PL, the planarization insulating layer PL covers the gate electrode GE1 of the first transistor TR110, and the light-emitting element LE is on the planarization insulating layer PL. The planarization insulating layer PL may cover the pixel circuit described above, so that the surface of the planarization insulating layer PL is relatively flat, which is more benefit for forming the light-emitting element LE on the planarization insulating layer PL. The material of the planarization insulating layer PL may be silicon oxide, silicon oxynitride, silicon nitride, or the like, and the planarization insulating layer PL may be obtained by a process such as vapor deposition.

For example, in the embodiment as illustrated in FIG. 24, the first transistor TR110 adopts a structural design that can reduce or avoid the risk of being broken down by a high voltage, and the second transistor TR120 adopts a structure design of a general MOS transistor. As illustrated in FIG. 24, the second transistor TR120 includes a gate electrode GE2 in the first conductive layer 101, a first electrode DE2 and a second electrode SE2 in the second conductive layer 102, a first doped region DR2 in contact with the first electrode DE2 of the second transistor TR120, and a second doped region SR2 in contact with the second electrode SE2 of the second transistor TR120. The first doped region DR2 of the second transistor TR120 and the second doped region SR2 of the second transistor TR120 are spaced apart from each other, have the same doping type, and are both in the semiconductor body 100. It should be noted that the gate electrode GE2 of the second transistor TR120 here is the control electrode E123 of the second transistor TR120 described above. The following embodiments are the same and will not be described again. For example, the second transistor TR110 is an N-type MOS transistor. The doping types of the first doped region DR2 and the second doped region SR2 of the second transistor TR120 are both N-type doping.

For example, as illustrated in FIG. 24, the second transistor TR120 further includes an auxiliary doped region BR2, the auxiliary doped region BR2 of the second transistor TR120 is in contact with the second doped region SR2 of the second transistor TR120, the auxiliary doped region BR2 of the second transistor TR120 is electrically connected to the second electrode SE2 of the second transistor TR120, and the doping type of the auxiliary doped region BR2 of the second transistor TR120 is opposite to the doping type of the second doped region SR2 of the second transistor TR120. For example, the doping type of the auxiliary doped region BR2 of the second transistor TR120 is P-type doping. The auxiliary doped region BR2 can play an isolation role to prevent leakage.

It should be noted that the embodiments of the present disclosure include, but are not limited to, the foregoing cases. The first transistor TR110 may also adopt an N-type MOS transistor, the doping type of the first doped region DR1 of the first transistor TR110 is N-type doping, and the doping type of the semiconductor body 100 is a P-type bulk silicon or a P-type silicon-on-insulator (SOI).

For example, in the case where the first transistor TR110 is an N-type MOS transistor, the first transistor TR110 may further include an auxiliary doped region. In this case, the doping type of the auxiliary doped region of the first transistor TR110 is P-type, the auxiliary doped region of the first transistor TR110 is in contact with the second doped region SR1 of the first transistor TR110, and the auxiliary doped region is electrically connected to the second electrode SE1 of the first transistor TR110.

Figure 25:
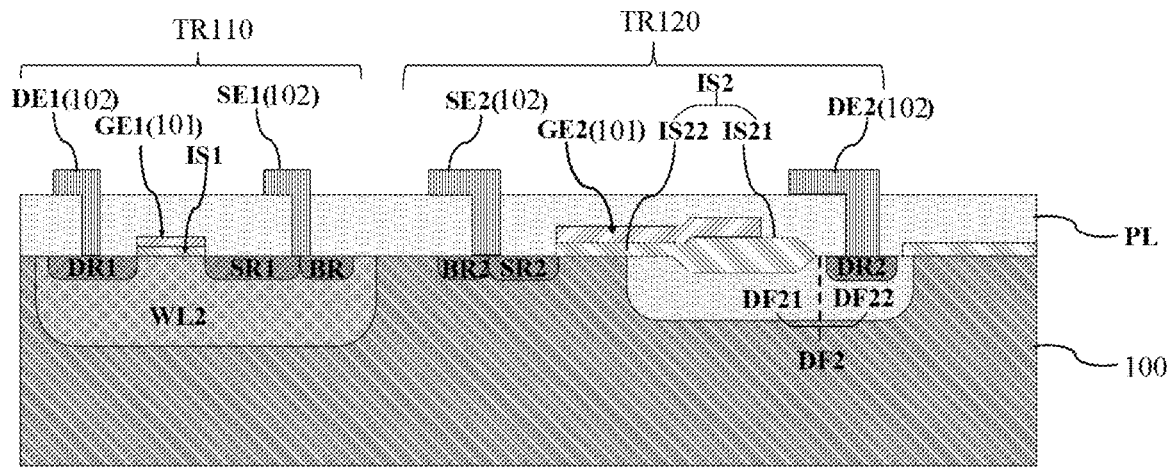
FIG. 25 is a cross-sectional schematic view of two transistor according to an embodiment of the present disclosure.

As illustrated in FIG. 25, in the pixel unit provided by some embodiments of the present disclosure, the second transistor TR120 adopts a structural design that can reduce or avoid the risk of being broken down by a high voltage, and the first transistor TR110 adopts a structure design of a general MOS transistor.

As illustrated in FIG. 25, the second transistor TR120 includes a gate electrode GE2 in the first conductive layer 101, a first electrode DE2 and a second electrode SE2 in the second conductive layer 102, a first doped region DR2 in contact with the first electrode DE2 of the second transistor TR120, and a second doped region SR2 in contact with the second electrode SE2 of the second transistor TR120. The first doped region DR2 of the second transistor TR120 and the second doped region SR2 of the second transistor TR120 are spaced apart from each other, have the same doping type, and are both in the semiconductor body 100.

For example, the second transistor TR120 further includes a drift doped region DF2 in contact with the first doped region DR2. The drift doped region DF2 of the second transistor TR120 and the second doped region SR2 of the second transistor TR120 are spaced apart from each other, having the same doping type, and are both in the semiconductor body 100. For example, the second transistor TR120 is a P-type MOS transistor, the doping types of the first doped region DR2, the second doped region SR2, and the drift doped region DF2 of the second transistor TR120 are all N-type doping, and the semiconductor body 100 is a P-type bulk silicon or a P-type silicon-on-insulator (SOI).

For example, the orthographic projection of the gate electrode GE2 of the second transistor TR120 on the base substrate partially overlaps with the orthographic projection of the drift doped region DF2 of the second transistor TR120 on the base substrate, and the orthographic projection of the first doped region DR2 of the second transistor TR120 on the base substrate is in the orthographic projection of the drift doped region DF2 of the second transistor TR120 on the base substrate. The doping concentration of the drift doped region DF2 of the second transistor TR120 is smaller than the doping concentration of the first doped region DR2 of the second transistor TR120.

In the display device 100 provided by the embodiment of the present disclosure, the pixel circuit provides the drift doped region DF2 in the second transistor TR120 and makes the doping concentration of the drift doped region DF2 of the second transistor TR120 smaller than the doping concentration of the first doped region DR2 of the second transistor TR120, so that a breakdown voltage between the first electrode DE2 and the second electrode SE2 of the second transistor TR120 may be increased, and the second transistor TR120 may reduce or avoid the risk of being broken down by a high voltage. As illustrated in FIG. 25, the drift doped region DF2 of the second transistor TR120 includes a first portion DF21 and a second portion DF22, and the orthographic projection of the second portion DF22 on the substrate overlaps with the orthographic projection of the first doped region DR2 of the second transistor TR120 on the base substrate. For example, the first doped region DR2 of the second transistor TR120 is in the drift doped region DF2 of the second transistor TR120.

For example, as illustrated in FIG. 25, the second transistor TR120 further includes an auxiliary doped region BR2. For example, the doping type of the auxiliary doped region BR2 of the second transistor TR120 is P-type doping, the auxiliary doped region BR2 of the second transistor TR120 is in contact with the second doped region SR2 of the second transistor TR120, and the auxiliary doped region BR2 of the second transistor TR120 is electrically connected to the second electrode SE2 of the second transistor TR120. The auxiliary doped region BR2 may play an isolation role to prevent leakage.

As illustrated in FIG. 25, the base substrate in the display device 100 provided by some embodiments of the present disclosure further includes a second insulating layer IS2 between the semiconductor body 100 and the first conductive layer 101. The second insulating layer IS2 may make the gate electrode GE2 of the second transistor TR120 to be insulated from the semiconductor body 100. For example, the second insulating layer IS2 may be a gate insulating layer, such as a silicon oxide layer, and may be formed by a vapor deposition process, or directly obtained by oxidizing a silicon-based base substrate through a thermal oxidation process.

The second insulating layer IS2 includes a first portion IS21 close to the first doped region DR2 of the second transistor TR120 and a second portion IS22 away from the first doped region DR2 of the second transistor TR120.

For example, the thickness of the first portion IS21 of the second insulating layer IS2 is greater than the thickness of the second portion IS22 of the second insulating layer IS2, and the thickness is a thickness along the direction perpendicular to the base substrate. For example, the thickness of the first portion IS21 of the second insulating layer IS2 is 7 to 8 nanometers, and the thickness of the second portion IS22 of the second insulating layer IS2 is 2 to 3 nanometers.

In the embodiment of the present disclosure, by thickening the thickness of the first portion IS21 of the second insulating layer IS2, for example, more than twice the thickness of the second portion IS22, the risk of that a region between the gate electrode GE2 of the second transistor TR120 and the first electrode DE2 of the second transistor TR120 being broken down by a high voltage may be reduced or avoided.

As illustrated in FIG. 25, the base substrate further includes a planarization insulating layer PL, the planarization insulating layer PL covers the gate electrode GE2 of the second transistor TR120, and the light-emitting element LE is on the planarization insulating layer PL. The planarization insulating layer PL may cover the pixel circuit described above, so that the surface of the planarization insulating layer PL is relatively flat, which is more benefit to forming the light-emitting element LE on the planarization insulating layer PL. The material of the planarization insulating layer PL may be silicon oxide, silicon oxynitride, silicon nitride, or the like, and the planarization insulating layer PL may be obtained by a process such as vapor deposition.

For example, in the embodiment as illustrated in FIG. 25, the second transistor TR120 adopts a structural design that can reduce or avoid the risk of being broken down by a high voltage, and the first transistor TR110 adopts a structure design of a general MOS transistor. As illustrated in FIG. 25, the first transistor TR110 includes a gate electrode GE1 in the first conductive layer 101, a first electrode DE1 and a second electrode SE1 in the second conductive layer 102, a first doped region DR1 in contact with the first electrode DE1 of the first transistor TR110, and a second doped region SR1 in contact with the second electrode SE1 of the first transistor TR110. The first doped region DR1 of the first transistor TR110 and the second doped region SR1 of the first transistor TR110 are spaced apart from each other, have the same doping type, and are both in the semiconductor body 100. For example, the first transistor TR110 is a P-type MOS transistor. The doping types of the first doped region DR1 and the second doped region SR1 of the first transistor TR110 are both P-type doping.

As illustrated in FIG. 25, in the first transistor TR110 provided by some embodiments of the present disclosure, the first doped region DR1 and the second doped region SR1 of the first transistor TR110 are in a second well WL2 in the semiconductor body 100. For example, the doping type of the second well WL2 is N-type doping.

The orthographic projection of the gate electrode GE1 of the first transistor TR110 on the base substrate is in the orthographic projection of the second well WL2 on the base substrate, and a portion, between the first doped region DR1 of the first transistor TR110 and the second doped region SR1 of the first transistor TR110, of the second well WL2 constitutes the channel region of the first transistor TR110.

For example, as illustrated in FIG. 25, the first transistor TR110 further includes an auxiliary doped region BR. For example, the doping type of the auxiliary doped region BR of the first transistor TR110 is N-type doping, the auxiliary doped region BR of the first transistor TR110 is in contact with the second doped region SR1 of the first transistor TR110, the auxiliary doped region BR of the first transistor TR110 is electrically connected to the second electrode SE1 of the first transistor TR110, and the orthographic projection of the auxiliary doped region BR of the first transistor TR110 on the base substrate is in the orthographic projection of the second well WL2 on the base substrate. The auxiliary doped region BR may play an isolation role to prevent leakage.

Figure 26:
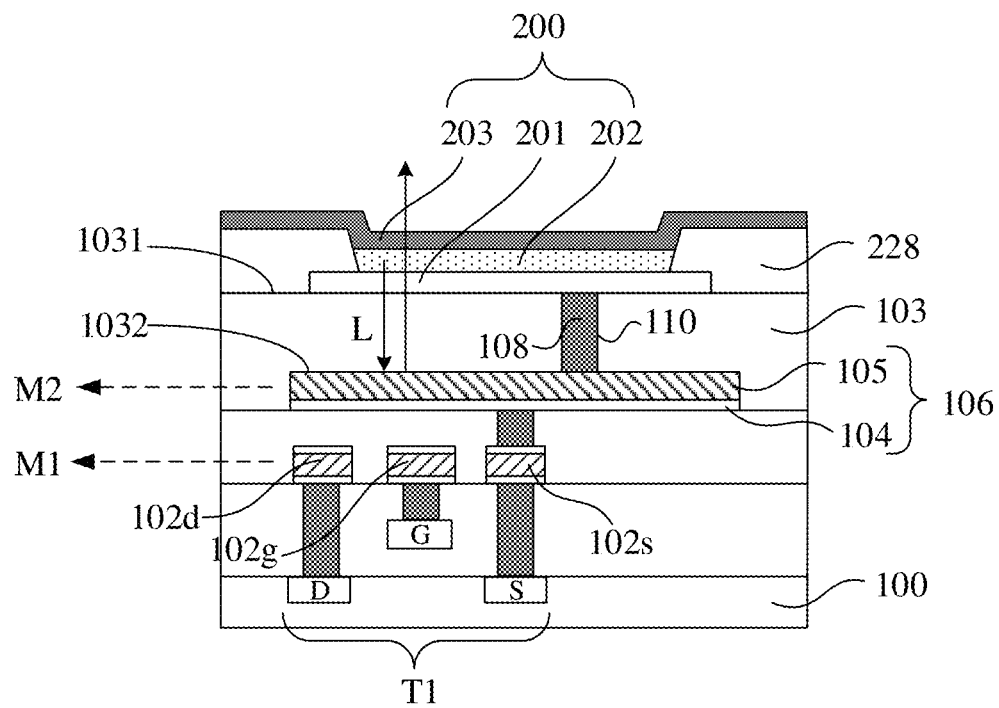
FIG. 26 is a partially enlarged cross-sectional view of a sub-pixel of a display device according to an embodiment of the present disclosure.
Figure 32:
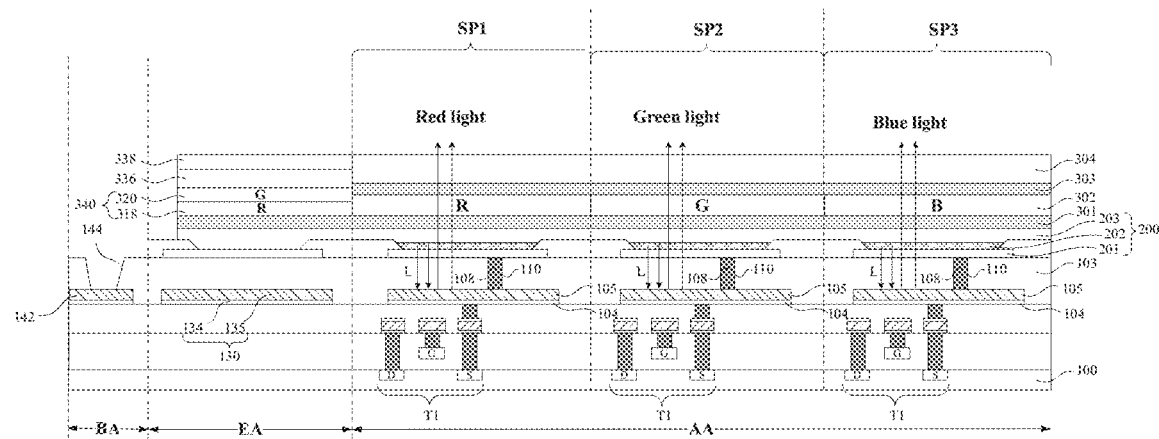
FIG. 32 is a cross sectional schematic view of a display substrate according to an embodiment of the disclosure.

FIG. 26 is a partially enlarged cross-sectional view of a sub-pixel of a display device according to an embodiment of the present disclosure. For simplicity, only one transistor is shown in the figure. As illustrated by FIG. 26 and FIG. 32, for example, each sub-pixel includes a first reflective electrode 106 and a light emitting element 200 on the first reflective electrode 106. The light emitting element 200 includes a first electrode layer 201, an organic light emitting functional layer 202, and a second electrode layer 203, the first electrode layer 201, the organic light emitting functional layer 202, and the second electrode layer 203 are sequentially staked on the first reflective electrode 106.

For example, with reference to FIG. 26 and FIG. 32, each sub-pixel further includes an insulation layer 103 between the first reflective electrode 106 and the first electrode layer 201. The insulation layer 103 is light-transmitting so that light emitted from the organic light emitting function layer 202 penetrates the insulation layer 103, reaches the first reflective electrode 106, and is reflected by the first reflective electrode 106. The insulation layer 103 is used to separate the first reflective electrode 106 and the first electrode layer 201. Upon the first reflective electrode 106 being manufactured, the first reflective electrode 106 can be integrated in a driving substrate manufactured by a wafer fab, which reduces the manufacturing costs and manufacturing difficulty of the reflective electrode 106. Moreover, upon the light L emitted from the organic light emitting functional layer 202 being incident on a first surface 1031 of the insulation layer 103, which is close to the organic light emitting functional layer 202, because the insulation layer 103 has a light-transmitting property, the light L can penetrate the first surface 1031 of the insulation layer 103, be emitted from a second surface 1032 of the insulation layer 103 close to the first reflective electrode 106, and reach the first reflective electrode 106. The first reflective electrode 106 has a reflective property, and reflects the light L incident thereon back to the light emitting element 200; finally, the light L exits from the light emitting element 200. In the present embodiment, due to the light-transmitting property of the insulation layer 103, light reflected by the first reflective electrode 106 is emitted outward with almost no loss, thus ensuring high light brightness and high light efficiency of the display device. For example, the insulation layer 103 in three sub-pixels is integrally formed to facilitate manufacture and reduce the difficulty of the manufacturing process.

In at least some embodiments, a conductive path for electrically connecting the first electrode layer and the first reflective electrode is provided in the insulation layer. Two examples of conductive path are provided below.

For example, as illustrated by FIG. 26, the insulation layer 103 includes a via hole 110 filled with a metal member 108, and the first reflective electrode 106 is electrically connected to the first electrode layer 201 through the metal member 108. In this way, by forming a conductive path between the first reflective electrode 106 and the first electrode layer 201 in the insulation layer 103, it is advantageous to transmit a signal provided by a pixel circuit in the display device to the first electrode layer 201 through the first reflective electrode 106. In this way, it is not only beneficial to achieve the control of the light emitting element by the pixel circuit, but also to make the structure of the display device more compact, which contributes to the miniaturization of the display device. Furthermore, for example, the metal member 108 is made of a metal material, such as tungsten metal, and the via hole filled with tungsten metal is also referred to as a tungsten via hole (W-via). For example, in the case where the thickness of the insulation layer 103 is relatively large, the formation of tungsten via hole in the insulation layer 103 can ensure the stability of the conductive path. Moreover, because the process for manufacturing the tungsten via hole is mature, the surface flatness of the insulation layer 103 as obtained is good, which is beneficial to reduce the contact resistance between the tungsten via and the first electrode layer 201. It can be understood that, the tungsten via hole is not only suitable for the electrical connection between the insulation layer 103 and the first electrode layer 201, but also suitable for the electrical connection between the first reflective electrode 106 and the pixel circuit, and electrical connection among other wiring layers. The electrical connection between the first reflective electrode 106 and the pixel circuit will be described in detail later.

Figure 27:
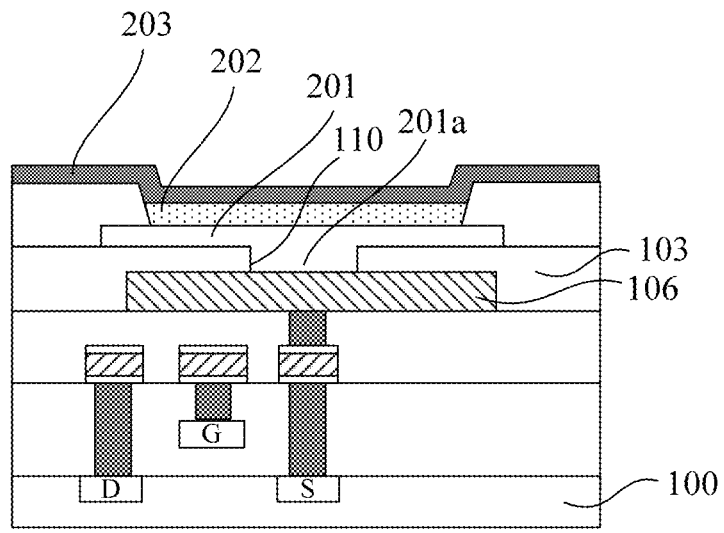
FIG. 27 is a partially cross-sectional view of a sub-pixel according to other embodiments of the present disclosure.

FIG. 27 is a partially cross-sectional view of a sub-pixel according to other embodiments of the present disclosure. As illustrated by FIG. 27, the insulation layer 103 includes a first opening 110 that exposes the first reflective electrode 106. At least a portion 201a of the first electrode layer 201 is located in the first opening 110 and is electrically connected to the first reflective electrode 106. In FIG. 26, the first electrode layer 201 and the first reflective electrode 106 are electrically connected through the metal member 108, and there is no direct contact between the first electrode layer 201 and the first reflective electrode 106. In FIG. 27, a portion 201a of the first electrode layer 201 is filled in the first opening 110 of the insulation layer 103, and is in direct contact with the first reflective electrode 106 to form an electrical connection. Compared with FIG. 26, the first opening 110 of the insulation layer 103 in FIG. 27 does not need to be filled with a metal member, so the manufacturing process is simpler. Moreover, because the first electrode layer 201 and the first reflective electrode 106 are in direct contact with each other, the thickness of the display device is reduced, which is beneficial to the thinning of the display device.

Figure 28:
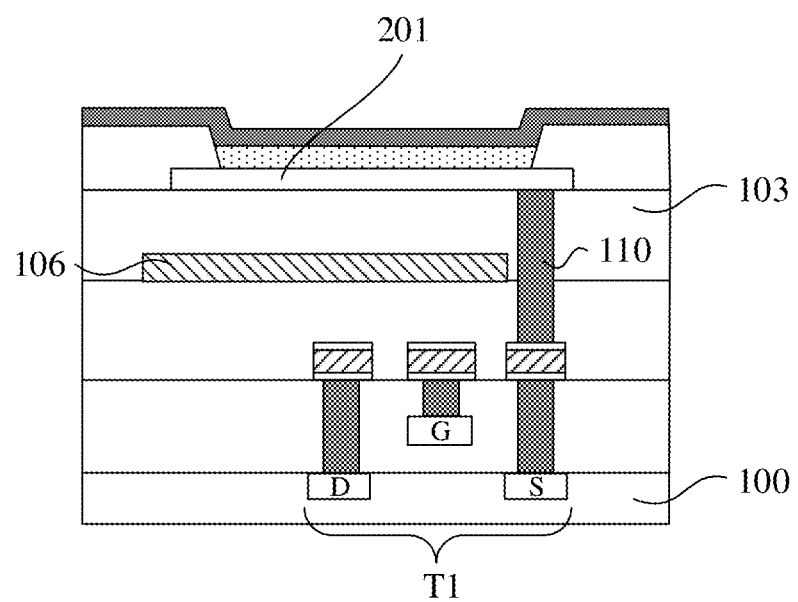
FIG. 28 is a partially cross-sectional view of a sub-pixel according to other embodiments of the present disclosure.

In at least some embodiments, the first reflective electrode and the first electrode layer are insulated from each other. For example, as illustrated by FIG. 28, the entire first reflective electrode 106 is separated from the first electrode layer 201 by the insulation layer 103 and insulated from the first electrode layer 201. That is, there is no electrical connection between the first electrode layer 201 and the first reflective electrode 106. In this way, upon the first reflective electrode 106 being manufactured, the position or connection relationship between the wiring layer and the pixel circuit in the existing display device does not need to be changed, and the purpose of the present disclosure can also be achieved. In this case, the pixel circuit including driving transistor is electrically connected to the first electrode layer 201 through the via hole 110 for controlling light emission of the light emitting element.

For example, as illustrated by FIG. 26, the display device further includes at least one wiring layer M1, and the at least one wiring layer M1 is located between the first reflective electrode 106 and the base substrate 100. For example, the wiring layer M1 includes a metal layer (hatched portion), a gate electrode connection portion 102g, a source electrode connection portion 102s, and a drain electrode connection portion 102d are located in the same metal layer.

For example, as illustrated by FIG. 26, the first reflective electrode 106 also includes a metal layer 105. The material of the metal layer 105 is, for example, aluminum or an aluminum alloy, such as an aluminum-copper alloy. Because the resistance of aluminum or aluminum-copper alloy is small and the reflectivity is high, the light emitting brightness and light emitting efficiency of the display device can be improved. For example, the thickness of the metal layer 105 is between 10 nm and 1000 nm. If the thickness is too low, the reflection effect is not obvious. If the thickness is too high, the overall thickness of the panel is large. The first reflective electrode 106 can be regarded as a wiring layer M2 of the display device. As illustrated by FIG. 26, in the case where the display device includes a plurality of wiring layers, the wiring layer M2 where the first reflective electrode 106 is located is the uppermost wiring layer, which can simplify the manufacture of the first reflective electrode 106 without destroying the underlying structure of the display device.

For example, as illustrated by FIG. 26, the first reflective electrode 106 further includes at least one protection layer 104. The protection layer 104 and the metal layer 105 are stacked on a side of the metal layer 105 close to the base substrate 100. That is, the protection layer 104 is located on a surface of the metal layer 105 close to the base substrate 100. In this way, the protection layer 104 can prevent the metal layer 105 from being oxidized. For example, the material of the protection layer is a conductive material, such as titanium nitride (TiN). Because the protection layer 104 is not provided on a surface of the metal layer 105 close to the first electrode layer 122, light emitted by the organic light emitting functional layer 124 and passing through the first electrode layer 122 and the insulation layer 103 can be directly incident on a surface of the metal layer 105. Therefore, the loss of light on the interface can be reduced, thereby improving the light reflection efficiency and the light output brightness of the display device.

Figure 29:
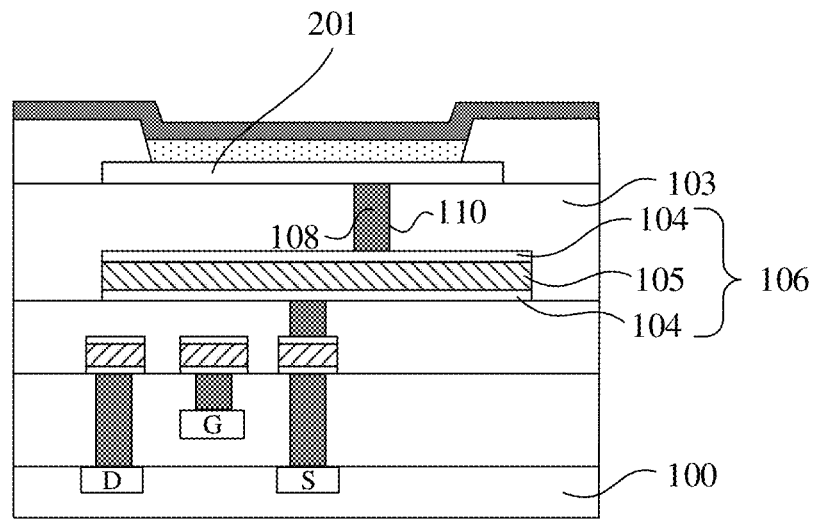
FIG. 29 is a partially cross-sectional view of a sub-pixel according to other embodiments of the present disclosure.

In the embodiment of the present disclosure, the arrangement manner and the number of the protection layer 104 are not limited to those shown in FIG. 26. A protection layer may not be provided in the first reflective electrode. For example, as illustrated by FIG. 27 and FIG. 28, the first reflective electrode 106 does not include any protection layer, and includes only a metal layer. In the case where one protection layer is provided, the protection layer may be provided on one side of the metal layer. For example, the protection layer is provided only on the side of the metal layer 105 close to the base substrate 100 (as illustrated by FIG. 26), or, only on the side of the metal layer 105 far from the base substrate 100 (not shown). In the case where two protection layers are provided, the two protection layers can be provided on two sides of the metal layer. For example, as illustrated by FIG. 29, the first reflective electrode 106 includes two protection layers 104 and a metal layer 105 between the two protection layers 104. The two protection layers 104 are respectively located on a side of the metal layer 105 close to the base substrate 100 and a side of the metal layer 105 away from the base substrate 100. In this case, the insulation layer 103 includes a via hole 110 and a metal member 108 located in the via hole. The first electrode layer 201 is electrically connected to the first reflective electrode 106 including two protection layers 104 and a metal layer 105 through a metal member 108. It can be understood that the above-mentioned protection layer can also be applied to other wiring layers. For example, as illustrated by FIG. 26, protection layers are provided on the upper and lower sides of each of the gate electrode connection portion 102g, the source electrode connection portion 102s, and the drain electrode connection portion 102d, which can effectively prevent these electrode connection portions from being oxidized, and improve the conductivity.

For example, as illustrated by FIG. 32, the insulation layer 103 further includes a second opening 144 that exposes a pad 142, and the second opening 144 is provided to facilitate electrical connection and signal communication between the pad 142 and an external circuit. The display device of FIG. 32 uses the sub-pixel structure shown in FIG. 26. It can be understood that the sub-pixel structures shown in FIGS. 27 to 29 can be applied to the display device of FIG. 32, and details are not repeated herein.

Figure 30:
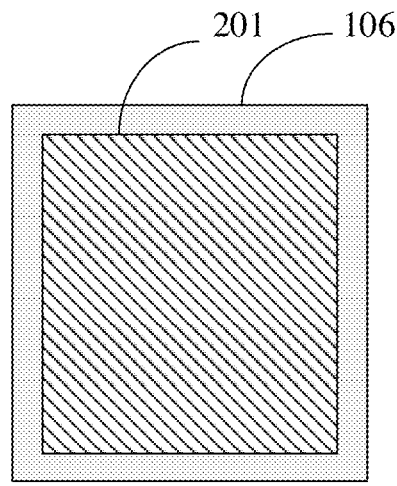
FIG. 30 illustrates the location relationship between the first reflective electrode and the first electrode layer according to an embodiment of the disclosure.
Figure 31:
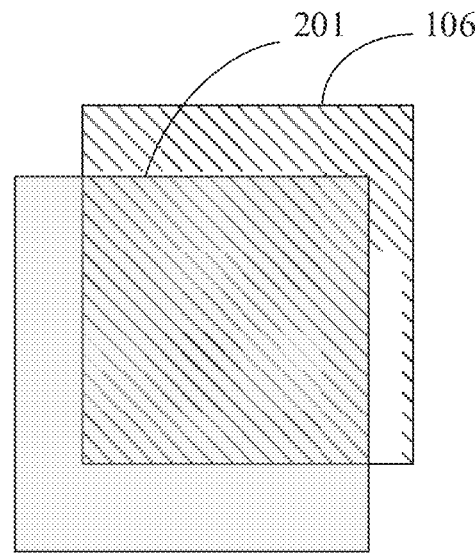
FIG. 31 illustrates the location relationship between the first reflective electrode and the first electrode layer according to an embodiment of the disclosure.

In at least some embodiments, the relative positional relationship between the first electrode layer and the first reflective electrode may be determined according to actual requirements. For example, as illustrated by FIG. 26 and FIG. 30, an orthographic projection of the first electrode layer 201 on a plane, where the base substrate 100 is located, is located within an orthographic projection of the first reflective electrode 106 on the plane where the base substrate 100 is located. That is, the area of the orthographic projection of the first electrode layer 201 is smaller than the area of the orthographic projection of the first reflective electrode 106. In this way, almost all the light passing through the first electrode layer 201 is incident on the first reflective electrode 106 and is reflected, thereby improving the light emitting efficiency and light emitting brightness of the display device. It can be understood that the arrangement manner of the first electrode layer and the first reflective electrode is not limited to the cases shown in FIGS. 26 and 30, and vice versa. For example, as illustrated by FIG. 27, the orthographic projection of the first reflective electrode 106 on the plane, where the base substrate 100 is located, is located within the orthographic projection of the first electrode layer 201 on the plane where the base substrate 100 is located. For another example, as illustrated by FIG. 28 and FIG. 31, the orthographic projection of the first reflective electrode 106 on the plane, where the base substrate 100 is located, is partially overlapped with the orthographic projection of the first electrode layer 201 on the plane where the base substrate 100 is located. The positional relationship can make the manufacturing process of the first reflective electrode 106 simple without changing the electrical connection relationship between the wiring layer and the driving transistor in the existing display device.

In at least some embodiments, the shape of the first reflective electrode is not limited to the rectangle shown in FIG. 30 and FIG. 31, and may be other regular shapes, such as a circle, an oval, a parallelogram, a regular polygon, a trapezoid, and the like. Alternatively, the first reflective electrode may also have an irregular shape, such as a polygonal line shape, a curved shape, a honeycomb shape, or the like. For example, the first reflective electrode 106 in FIG. 33 has a honeycomb shape. In a plane parallel to the base substrate, the shape of the first electrode layer may be the same as or different from the shape of the first reflective electrode. For example, as illustrated by FIG. 30, the shape of the first reflective electrode 106 is the same as the shape of the first electrode layer 201 in the plane parallel to the base substrate 100. In this way, the reflection through the first reflective electrode 106 can ensure that the brightness of the emitted light is more uniform. For another example, the shape of the first electrode layer 106 is circular, and the shape of the first reflective electrode is rectangular. Furthermore, in this case, the orthographic projection of the circular first electrode layer on the plane, where the base substrate is located, is located within the orthographic projection of the rectangular first reflective electrode on the plane where the base substrate is located. In this way, almost all the light passing through the circular first electrode layer is incident on the rectangular first reflective electrode and is reflected, thereby improving the light emitting efficiency and light emitting brightness of the display device.

In at least some embodiments, the organic light emitting functional layer may include a light emitting layer and one or more film layers selected from the group consisting of a hole injection layer, an electron injection layer, a hole transport layer, an electron transport layer, an electron blocking layer, and a hole blocking layer. The organic light emitting functional layer 202 includes an electron injection layer (EIL), an electron transport layer (ETL), a light emitting layer (OL), a hole injection layer (HTL), and a hole transport layer (HIL) in an order from the top to the bottom. These layers may use materials and structures known in the art, and the details are not repeated herein. The organic light emitting functional layer 202 may be made of an organic material. As illustrated by FIG. 26, under the voltage driving of the first electrode layer 201 and the second electrode layer 203, the light emitting characteristics of the organic material are utilized to emit light according to the required gray scale.

In at least some embodiments, each sub-pixel further includes a pixel circuit including a driving transistor. The pixel circuit here can use any of the pixel circuits described in the above embodiments.

For example, as illustrated by FIG. 26 and FIG. 32, the driving transistor T1 in each sub-pixel includes a source electrode S, a drain electrode D, and a semiconductor layer (the portion located between the source electrode S and the drain electrode D), one of the source electrode S and the drain electrode D is electrically connected with the first reflective electrode 106. The semiconductor layer is located in the base substrate, and the semiconductor layer is, for example, a channel region formed between the source electrode S and the drain electrode D. For example, as illustrated by FIG. 26, the driving transistor includes a gate electrode G a source electrode S, and a drain electrode D. The three electrodes correspond to three electrode connection portions, respectively. For example, the gate electrode G is electrically connected to the gate electrode connection portion 102g, the source electrode S is electrically connected to the source electrode connection portion 102s, and the drain electrode D is electrically connected to the drain electrode connection portion 102d. The drain electrode D of the driving transistor is electrically connected to the first reflective electrode 106 through the drain electrode connection portion 102d. Upon the driving transistor being in an ON state, an electrical signal VDD provided by a power line can be transmitted to the first electrode layer 201 through the drain electrode S, the drain electrode connection portion 102d, and the first reflective electrode 106 of the driving transistor. Because a voltage difference is formed between the second electrode layer 202 and the first electrode layer 201, an electric field is formed between the second electrode layer 202 and the first electrode layer 201, and the organic light emitting functional layer 202 emits light under the action of the electric field.

In at least some embodiments, the peripheral region includes a plurality of second reflective electrodes on the base substrate and a light blocking layer disposed on a side of the plurality of second reflective electrodes away from the base substrate. For example, as illustrated by FIG. 32, a second reflective electrode 130 is provided in the peripheral region EA, and the second reflective electrode 130 has the same structure as the first reflective electrode 106. For example, the second reflective electrode 130 includes a metal layer 135 and a protection layer 134. For example, the metal layer 135 and the metal layer 105 are disposed in the same layer, and the protection layer 134 and the protection layer 104 are disposed in the same layer, which is helpful to simplify the manufacturing process. A light blocking layer 340 is disposed on the side of the second reflective electrode 130 away from the base substrate 100, and is configured to block light reflected by the second reflective electrode 130 and reduce light leakage from the display region to the peripheral region. For example, the light blocking layer 340 includes a stacked structure of color filter layers of at least two colors. For example, the light blocking layer 340 includes a red color filter layer 318 and a green color filter layer 320 which are stacked. In other embodiments, a stacked structure of color filter layers of three colors may also be used. For another example, the light blocking layer includes a black matrix layer, and the black matrix layer includes a black resin material, which can also achieve a light blocking effect. Upon the color filter layer in the light blocking layer being manufactured, the color filter layer may be completed with the color filter layer with the same color in the display region AA in the same process step, which can reduce the steps of the manufacturing process.

For example, as illustrated by FIG. 32, the display device further includes a first encapsulation layer 301, a color filter layer 302, a second encapsulation layer 303, and a cover plate 304 disposed in the display region AA. For example, the first encapsulation layer 301 is located on a side of the second electrode layer 203 away from the base substrate. The color filter layer 302 is located on a side of the first encapsulation layer 301 away from the base substrate, and includes a red color filter layer R, a green color filter layer G, and a blue color filter layer B. The second encapsulation layer 303 and the cover plate 304 are located on a side of the color filter layer 302 away from the base substrate. As for the specific materials of the first encapsulation layer 301, the color filter layer 302, the second encapsulation layer 303, and the cover plate 304, conventional materials in the art may be used, and the details will not be repeated herein. For example, in the peripheral region EA, an encapsulation layer 336 and a cover plate 338 for covering the light blocking layer 340 are further provided. For example, the encapsulation layer 336 and the second encapsulation layer 303 are made of the same material and are completed in the same process step, and the cover plate 338 and the cover plate 304 are made of the same material and are completed in the same process step. In this way, the manufacturing process steps can be reduced.

Figure 33:
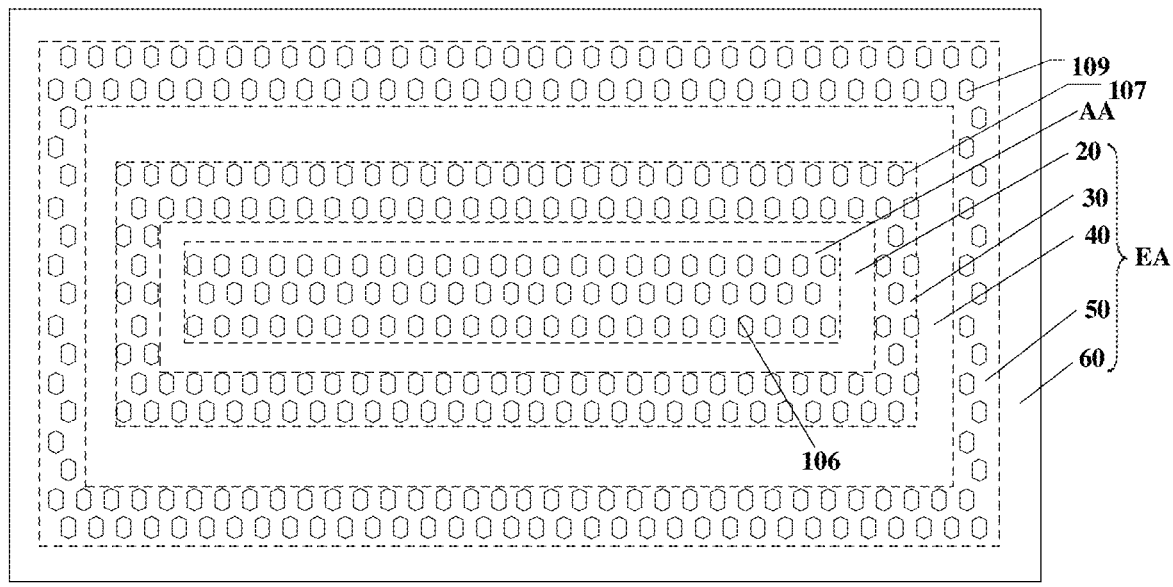
FIG. 33 is a schematic structural diagram of a display device according to an embodiment of the present disclosure.
Figure 34:
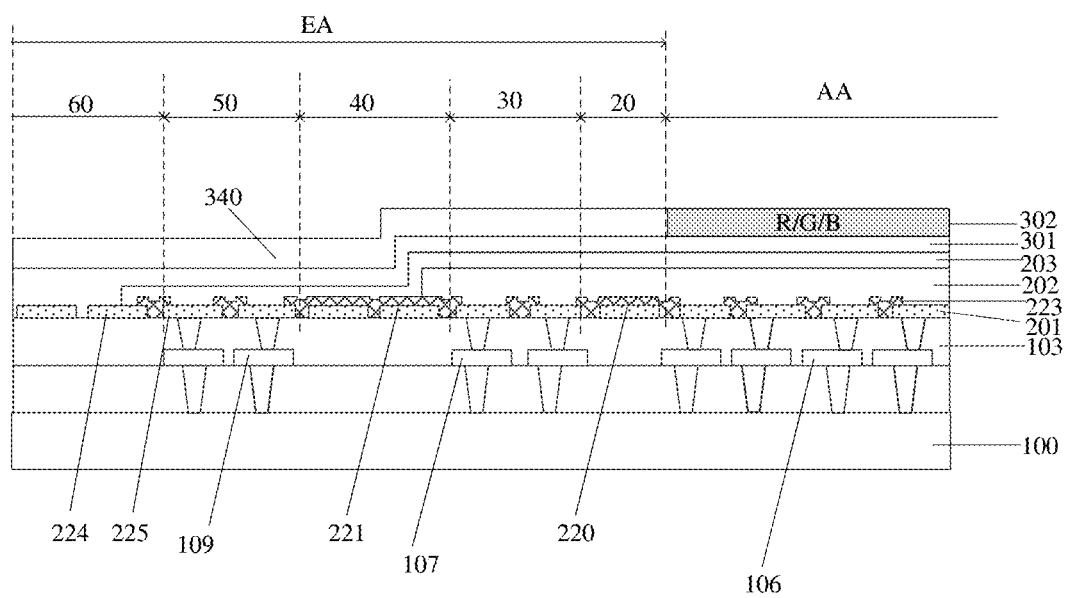
FIG. 34 is a schematic cross-sectional view of a display device according to an embodiment of the present disclosure.

FIG. 33 is a schematic structural diagram of a display device according to an embodiment of the present disclosure. FIG. 34 is a schematic cross-sectional view of a display device according to an embodiment of the present disclosure. For example, as illustrated by FIG. 33 and FIG. 34, the display device includes a first reflective electrode pattern located in the display region AA, the first reflective electrode pattern includes a plurality of first reflective electrodes 106 spaced from each other. For example, the peripheral region EA includes a sensing region 30, and the display device further includes a plurality of second reflective electrode patterns located in the sensing region 30. The second reflective electrode pattern includes a plurality of second reflective electrodes 107 spaced from each other.

In at least some embodiments, the peripheral region further includes a plurality of third reflective electrodes on the base substrate. For example, as illustrated by FIG. 33 and FIG. 34, the peripheral region EA further includes a connection electrode region 50, and the display device further includes a third reflective electrode pattern located in the connection electrode region 50. The third reflective electrode pattern includes a plurality of third reflective electrodes 109 which are spaced apart.

In at least some embodiments, the pattern density of the first reflective electrode pattern is the same as the pattern density of the second reflective electrode pattern and/or the pattern density of the third reflective electrode pattern. As illustrated by FIG. 33, the pattern density of the plurality of first reflective electrodes 106 is the same as the pattern density of the plurality of second reflective electrodes 107, or the pattern density of the plurality of first reflective electrodes 106 is the same as the pattern density of the plurality of third reflective electrodes 109. Alternately, the pattern density of the plurality of first reflective electrodes 106, the pattern density of the plurality of second reflective electrodes 107, and the pattern density of the plurality of third reflective electrodes 109 are the same as each other. In this way, over-etching phenomenon can be avoided upon the conductive layer being etched. The inventor(s) has found that, during an etching process of the conductive layer, the display region of the display device needs to form a reflective electrode pattern, and the part of the conductive layer at the peripheral region of the organic light emitting diode display device needs to be completely or partially removed. The pattern density of the display region and the pattern density of peripheral region are different, which results in a large difference in the amount of conductive material that needs to be etched away from the display region and the peripheral region within the unit area under the same dry etching process. The dry etching process has poor selectivity, which on the one hand can easily lead to difficulty in controlling the process film thickness and size uniformity of the first electrode pattern that is finally formed, and on the other hand, it can easily lead to over-etching phenomenon of the insulation layer under the first electrode pattern. In the present embodiment, at least one of the pattern density of the second reflective electrode pattern and the pattern density of the third reflective electrode pattern is the same as the pattern density of the first reflective electrode pattern, which can avoid the over-etching phenomenon, thereby improving the etching uniformity.

In at least some embodiments, the peripheral region further includes a light blocking layer disposed on the plurality of second reflective electrodes and the plurality of third reflective electrode layers away from the base substrate. For example, as illustrated by FIG. 33 and FIG. 34, a light blocking layer 340 is provided on a side of the plurality of second reflective electrodes 107 and the plurality of third reflective electrodes 109 away from the base substrate, and the light blocking layer includes a black matrix layer. The material of the black matrix layer is a black resin, which can block light reflected by the second reflective electrode 107 and the third reflective electrode 109, and reduce light leakage from the display region to the peripheral region.

For example, as illustrated by FIGS. 33 and 34, the peripheral region EA further includes a first dummy region 20 surrounding the display region AA, and no reflective electrode is provided in the first dummy region 20. For example, the first dummy region 20 is provided with a first dummy electrode 220. For example, the first dummy electrode 220 in the first dummy region 20 and the plurality of first electrodes 201 in the display region AA are on the same layer to simplify the manufacturing process. In the display region AA, two adjacent first electrodes 201 are separated by a pixel definition layer 223. For example, the organic light emitting functional layer 202, the second electrode 203, and the encapsulation layer 301 all extend into the first dummy region 20.

For example, as illustrated by FIG. 33 and FIG. 34, the peripheral region EA further includes a second dummy region 40 surrounding the sensing region 30, and no reflective electrode is provided in the second dummy region 40. For example, the second dummy region 40 is provided with a second dummy electrode 221.

For example, as illustrated by FIG. 33 and FIG. 34, the peripheral region EA further includes a third dummy region 60 surrounding the connection electrode region 50, and no reflective electrode is provided in the third dummy region 60. For example, the third dummy region 60 is provided with a third dummy electrode 224.

As illustrated by FIG. 34, the second electrode layer 203 may extend from the AA region to the first dummy region 20, the sensing region 30, the second dummy region 40, and the connection electrode region 50. For example, the second electrode layer 203 may be a continuous film layer covering these regions. For example, the connection electrode region 50 is provided with a connection electrode 225 in the same layer as the first electrode layer 201. As illustrated by FIG. 34, the second electrode layer 203 is connected to the connection electrode 225, and the connection electrode 225 is connected to the third reflective electrode 109 below through a conductive path in the insulation layer 210, and the third reflective electrode 109 is connected with the circuit below through the via hole below. Therefore, the second electrode layer 203 can be connected to the circuit below through the above-mentioned connection electrode 225, the third reflective electrode 109, and the corresponding via holes, so as to transmit a corresponding driving signal to the second electrode layer 203. For example, the connection electrodes 25 in the connection electrode region 50 can be referred to a cathode electrode ring.

In at least some embodiments, the peripheral region of the display device further includes the voltage control circuit as described above.

In at least some embodiments, the first electrode layer is a transparent electrode layer. For example, the first electrode layer may be made of a light-transmitting material or a semi-light-transmitting material. Similarly, the second electrode layer may also be a transparent electrode layer, for example, made of a light-transmitting material or a semi-light-transmitting material. The light-transmitting material is, for example, a transparent conductive oxide, including but not limited to indium tin oxide (ITO), indium zinc oxide (IZO), cadmium tin oxide (CTO), tin dioxide ($SnO_2$) and zinc oxide (ZnO). For example, the first electrode layer is made of ITO. Because ITO material has a higher work function than ordinary molybdenum and titanium metals, ITO material is suitable for use as an OLED anode material, and because ITO has a high transmittance, the light emitted by the organic light emitting functional layer can pass through the first electrode layer without any loss, so as to further improve the light emitting efficiency and light emitting brightness of the display device. In a silicon-based micro OLED display device, one of the first electrode layer and the second electrode layer is used as an anode, and the other one is used as a cathode.

In at least some embodiments, the material of the insulation layer is a light-transmitting material, such as silicon nitride (SiNx), silicon oxide (SiOx), aluminum oxide ($Al_2O_3$), aluminum nitride (AlN), or other suitable materials. For example, the insulation layer may be a single layer or a plurality of layers.

In at least some embodiments, the base substrate is a silicon-based substrate. The silicon-based substrate has a mature manufacturing process and stable performance, and is suitable for manufacturing highly integrated micro display devices. For example, the display device is a silicon-based micro organic light emitting diode display device.

In the display device of the present embodiment, the light emitting element including the first electrode layer 201, the organic light emitting functional layer 202, and the second electrode layer 203, the first encapsulation layer 301, the color filter layer 302, the second encapsulation layer 303, and the cover plate 304 are manufactured in the panel factory. In addition, the insulation layer 103 above the pad 142 is also etched in the panel factory, thereby exposing the pad, such that the pad can be bonded to a flexible circuit board (FPC). Therefore, by using the display device designed in the present disclosure, the first reflective electrode 106 and the insulation layer 103 can be manufactured by a wafer fab for preparing a driving substrate suitable for forming a light emitting element, which not only reduces the manufacturing difficulty of the first reflective electrode, but is also beneficial to the subsequent processes of the panel factory.

In the present embodiment, the arrangement manner and specific structure or material of the first electrode layer, the light emitting element, the second electrode layer, the insulation layer, the first reflective electrode, the second reflective electrode, the pixel circuit, and the storage capacitor can refer to the previous embodiments, and the repeated portions are omitted.

In the existing manufacturing method of the display device, the reflective metal is usually manufactured in a panel factory, which increases the difficulty and costs of the manufacturing process. In the present embodiment, the first reflective electrode and the first electrode layer are separated by an insulation layer, so that it is possible to independently manufacture a stacked structure including the first reflective electrode and the insulation layer in the display device in a wafer fab. Moreover, the stacked structure has a surface suitable for manufacturing a light emitting element, therefore, the manufacturing difficulty of the first reflective electrode is reduced, and at the same time, the high light emitting efficiency and the high light emitting brightness of the display device are ensured.

As described above, the insulation layer 103 is between the first electrode 201 and the reflective electrode 106. In some embodiments, the insulation layer 103 is a silicon nitride (SiNx) layer. For example, the silicon nitride layer 103 is in direct contact with the metal reflective layer (first reflective electrode) 106. The silicon nitride layer 103 includes a via hole 110, and the first electrode 201 and the metal reflective layer 106 are electrically connected through the via hole 110.

For example, in some examples, as illustrated by FIG. 26 or 32, the first electrode 201 and the second electrode 203 are both transparent electrodes. A part of the light emitted by the light emitting functional layer 202 can be directly emitted through the second electrode 203. Another part of the light emitted by the light emitting functional layer 202 needs to pass through the first electrode 201 and the silicon nitride layer 103, then be reflected by the metal reflective layer 106, then passes through the silicon nitride layer 103 and the first electrode 201, and finally emits through the second electrode 203. Therefore, the reflectivity of the reflective electrode structure formed by the metal reflective layer 106, the silicon nitride layer 103, and the first electrode 201 being improved contributes to improving the light emitting brightness and light emitting efficiency of the light emitting element. For the light emitted from the light emitting functional layer 202, the first electrode 201 and the silicon nitride layer 103 can be considered to be transparent. Therefore, the method for improving the reflectivity of the above-mentioned reflective electrode structure mainly lies in increasing the reflectivity of the metal reflective layer 106. On the one hand, the reflectivity of the metal reflective layer 106 can be increased by using a metal material with a higher reflectivity to form the metal reflective layer 106; on the other hand, the surface roughness of a surface of the metal reflective layer 106 close to the silicon nitride layer 103 can also be reduced (the lower the surface roughness, the closer the surface is to the ideal mirror surface, and the higher the reflectivity of the surface), to improve the reflectivity of the metal reflective layer 106.

For example, in some examples, in order to improve the reflectivity of the metal reflective layer 106, the material of the metal reflective layer 106 may include a metal material having a high reflectivity (for example, a reflectivity of 90% or more is a high reflectivity), such as silver (Ag), a silver-containing metal material such as a silver alloy, aluminum (Al), or an aluminum-containing metal material such as an aluminum alloy, etc., to improve the reflectivity of the metal reflective layer 222 from a material level. For example, the metal reflective layer 106 may be formed by a method such as electron beam evaporation. It should be noted that because Al is chemically active, it is easily oxidized to aluminum oxide (AlOx), which deteriorates the reflectivity and causes a device defect. At the same case, Al atoms easily migrate and easily affect other film layers, thus, Al is not directly used as the material of the first electrode 201 and is not in direct contact with the light emitting functional layer 202.

For example, in some examples, the thickness of the metal reflective layer 106 is 300-500 Å, such as 360-450 Å. If the thickness of the metal reflective layer 106 is too small, its reflection effect is not obvious; if the thickness of the metal reflective layer 106 is too large, the overall thickness of the display panel will be large.

For example, in some examples, the silicon nitride layer 103 may be formed on the metal reflective layer 103 by a vapor deposition method. For example, the vapor deposition method includes chemical vapor deposition (CVD), plasma chemical vapor deposition (PCVD), plasma enhanced chemical vapor deposition (PECVD), and the like. For example, upon the silicon nitride layer being formed by the vapor deposition method, the deposition temperature may be relatively low. Taking the case where the metal reflective layer 106 is an Al reflective layer as an example, as the deposition temperature decreases, the migration of Al atoms will be suppressed, which can reduce the degree of increasing the surface roughness of the Al reflective layer 106 to improve the reflectivity of the metal reflective layer 106 from a structural level.

For example, in some examples, as illustrated by FIG. 26 or 32, the silicon nitride layer 103 in a plurality of sub-pixels is integrally formed to facilitate manufacture.

For example, in some examples, the deposition temperature of the silicon nitride layer 103 is, for example, 70-100 degrees Celsius, and for example, 80-85 degrees Celsius.

For example, in some examples, the thickness of the silicon nitride layer 103 is 50-100 Å, such as 60-80 Å. If the thickness of the silicon nitride layer 103 is too small, the silicon nitride layer 103 may not be able to effectively achieve the functions of protecting Al from being oxidized and limiting the migration of Al atoms; if the thickness of the silicon nitride layer 103 is too large, the overall thickness of the display panel may be relatively big.

For example, in some examples, the first electrode 201 is a transparent electrode, and the material of the first electrode 203 may include a transparent conductive material, for example, the material of the first electrode 203 may include at least one selected from the group consisting of indium tin oxide (ITO), zinc tin oxide (IZO), indium gallium tin oxide (IGZO), and indium zinc tin oxide (IZTO). For example, the first electrode 201 may be formed on a side of the silicon nitride layer 103 away from the metal reflective layer 106 by a magnetron sputtering method. For example, the first electrode 201 is made of ITO. Because the ITO material has a high work function (about 5.0 eV) and high transmittance, light can pass through the first electrode 201 almost without loss, so that the above-mentioned reflective electrode structure have relatively high reflectivity as a whole.

For example, in some examples, the thickness of the first electrode 201 is 700-2000 Å. If the thickness of the first electrode 201 is too small, its conductivity may be poor; if the thickness of the first electrode 201 is too large, the overall thickness of the display panel may be large.

For example, as illustrated by FIG. 26, the silicon nitride layer 103 includes a via hole 110, and the metal reflective layer 106 and the first electrode 201 are electrically connected through the via hole 110. For example, in some examples, as illustrated by FIG. 26, the via hole 110 is filled with a metal member 108, the first electrode 201 is electrically connected to the metal reflective layer 106 through the metal member 108 located in the via hole 110, and the first electrode 201 is not in direct contact with the metal reflective layer 106. For example, the metal member 108 is made of a metal material, such as tungsten metal, and the via hole filled with tungsten metal is also referred to as a tungsten via hole (W-via). For example, the formation of tungsten via hole in the silicon nitride layer 103 through a silicon-based semiconductor process can ensure the stability of the conductive path, and because the process for manufacturing the tungsten via hole is mature, the surface flatness of the silicon nitride layer 103 as obtained is good, which is beneficial to improve the reflectivity of the reflective electrode structure.

For example, in the display panel provided by the embodiment of the present disclosure, the surface roughness of the reflective electrode structure formed by the metal reflective layer 106, the silicon nitride layer 103, and the first electrode 201 is relatively low. For example, the surface roughness of the reflective electrode structure can be represented by a contour arithmetic mean deviation Ra, and the contour arithmetic mean deviation Ra can be obtained by measuring and calculating through an electric contour measuring instrument (the calculating process can be automatically completed by the instrument). For example, the surface roughness Ra of the reflective electrode structure is less than 3.0 nm, such as 2.5 nm, 2.0 nm, 1.8 nm, 1.5 nm, or the like.

The case where the reflective electrode structure is a stacked structure of Al/SiNx/ITO is taken as an example, compared with a common stacked structure of Al/SiOx/ITO used for the reflective electrode structure, in the case where the other formation conditions are the same (for example, deposition method, deposition temperature, and thickness of the Al reflective layer are the same, deposition method, deposition temperature, and thickness of the ITO layer are the same, and the thickness of SiNx and the thickness of SiOx are the same, etc.), because the deposition temperature of SiNx (for example, 70-100 degrees Celsius) is lower than that of SiOx (for example, 120-150 degrees Celsius), the migration of Al atoms during the deposition of SiNx is not as severe as the migration of Al atoms during the deposition of SiOx. Therefore, the degree of increasing of the surface roughness of the Al reflective layer is smaller during deposition of SiNx than that during deposition of SiOx. Furthermore, the surface roughness of the electrode structure of Al/SiNx/ITO is lower than that of the electrode structure of Al/SiOx/ITO, that is, the reflectivity of the electrode structure of Al/SiNx/ITO is higher than that of the electrode structure of Al/SiOx/ITO.

For example, in a comparative example, the surface roughness Ra of the electrode structure of Al/SiOx/ITO is 3.5 nm and its reflectivity is less than 85%; in one example, the surface roughness of the electrode structure of Al/SiNx/ITO is Ra is 1.8 nm, and its reflectivity is higher than 90%, for example, its reflectivity can reach 92%.

The structure including the metal reflective layer, the silicon nitride layer, and the first electrode in the display panel provided by the embodiments of the present disclosure has a relatively low surface roughness, which improves the reflectivity of the metal reflective layer, and can improve the light emitting efficiency and light emitting brightness of the light emitting element, so as to further improve the display brightness of the display panel.

Figure 35:
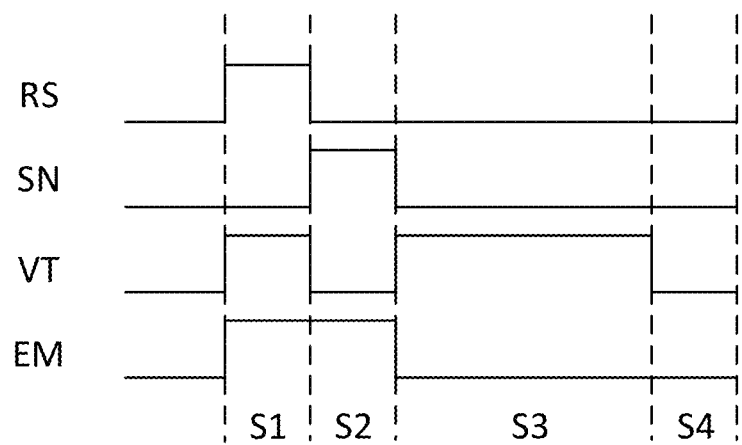
FIG. 35 is a signal timing chart of a driving method of a pixel circuit provided by at least one embodiment of the present disclosure.

At least one embodiment of the present disclosure further provides a driving method corresponding to the pixel circuit provided by the above embodiments. FIG. 35 is a signal timing chart of a driving method of a pixel circuit provided by at least one embodiment of the present disclosure. The driving method of the pixel circuit provided by the embodiment of the present disclosure will be described below with reference to the signal timing chart shown in FIG. 35. It should be noted that the potential level in the signal timing chart shown in FIG. 35 is merely illustrative, and does not represent a real potential value or a relative proportion. Corresponding to the embodiments of the present disclosure, a low-level signal corresponds to a turn-on signal of the P-type transistors, while a high-level signal corresponds to a turn-off signal of the P-type transistors.

Hereinafter, taking the pixel circuit shown in FIG. 18 as an example and taking that the pixel circuit shown in FIG. 18 is implemented as the circuit structure shown in FIG. 20 as a reference, the driving method of the pixel circuit provided by the embodiment of the present disclosure will be described in detail.

For example, as shown in FIG. 35, the driving method provided by the present embodiment can include four phases, namely, a reset phase S1, a data writing phase S2, a light emitting phase S3 and a non-light emitting phase S4. The timing waveform of each control signal (reset control signal RS, scan signal SN, transmission control signal VT, and light emitting control signal EM) in each phase is shown in FIG. 35.

Figure 36:
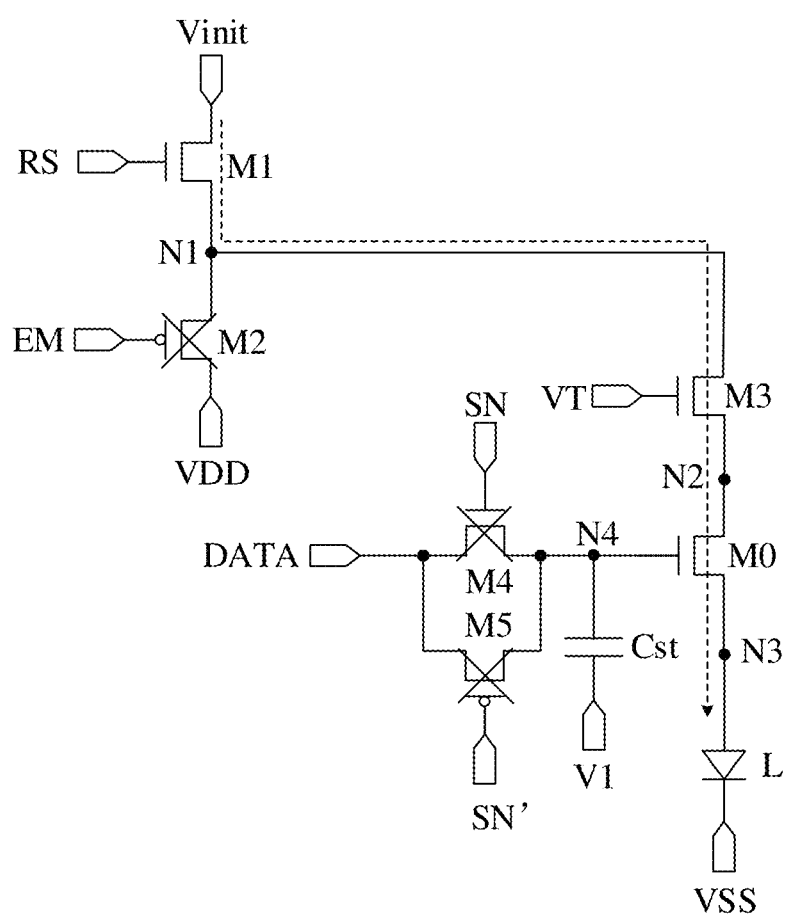
FIGS. 36 to 39 are circuit diagrams of the pixel circuit shown in FIG. 20 corresponding to the four phases in FIG. 35, respectively.
Figure 37:
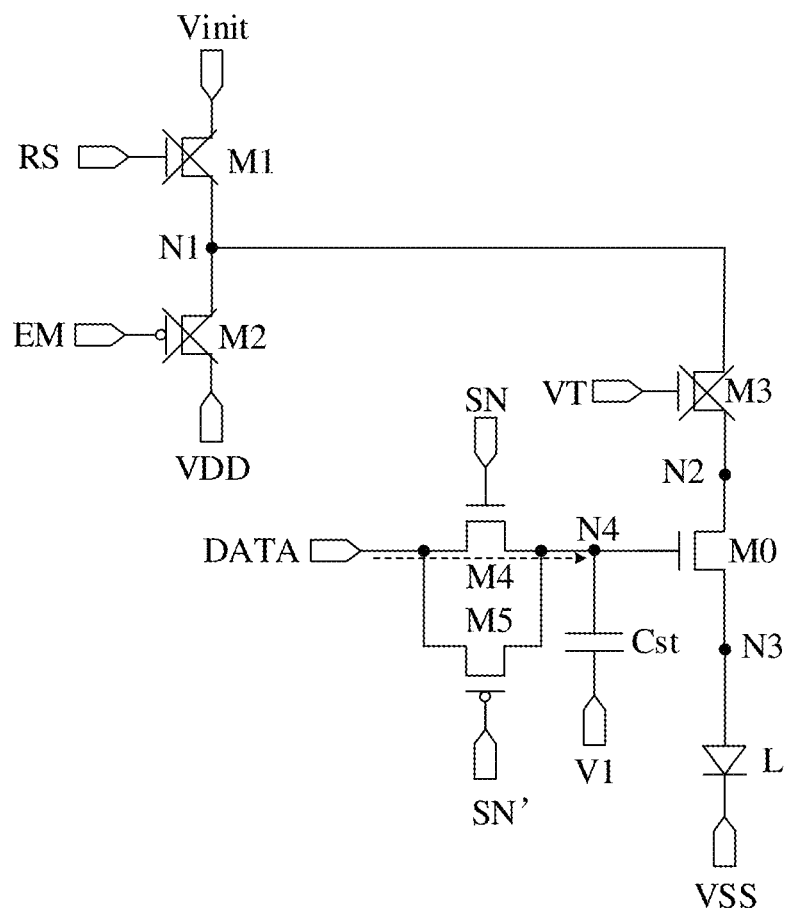
Figure 38:
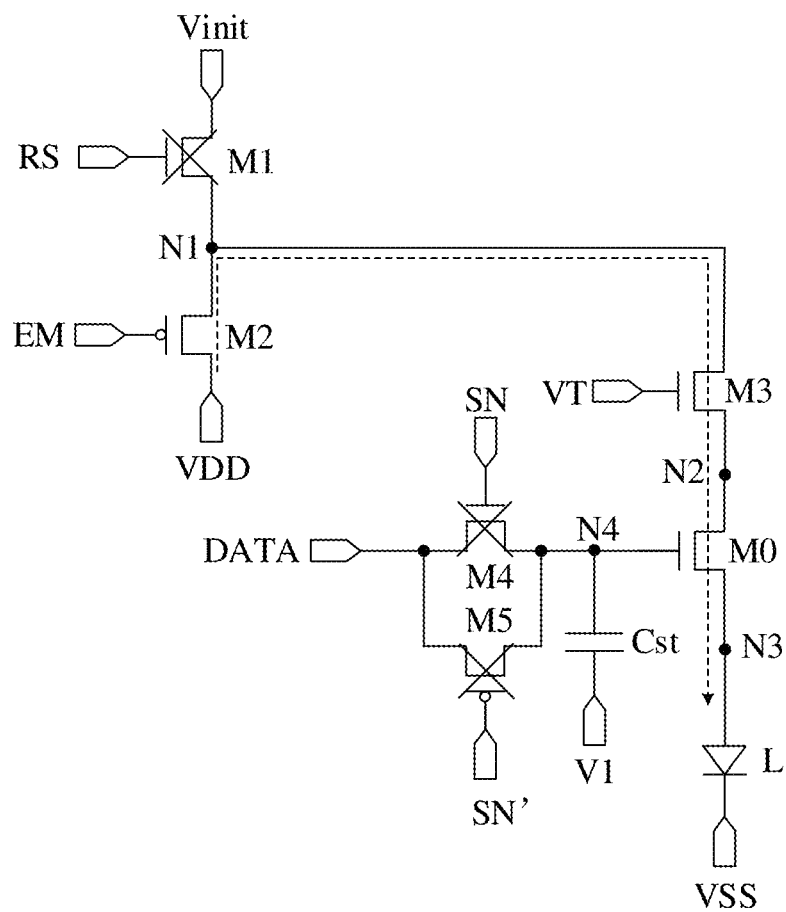
Figure 39:
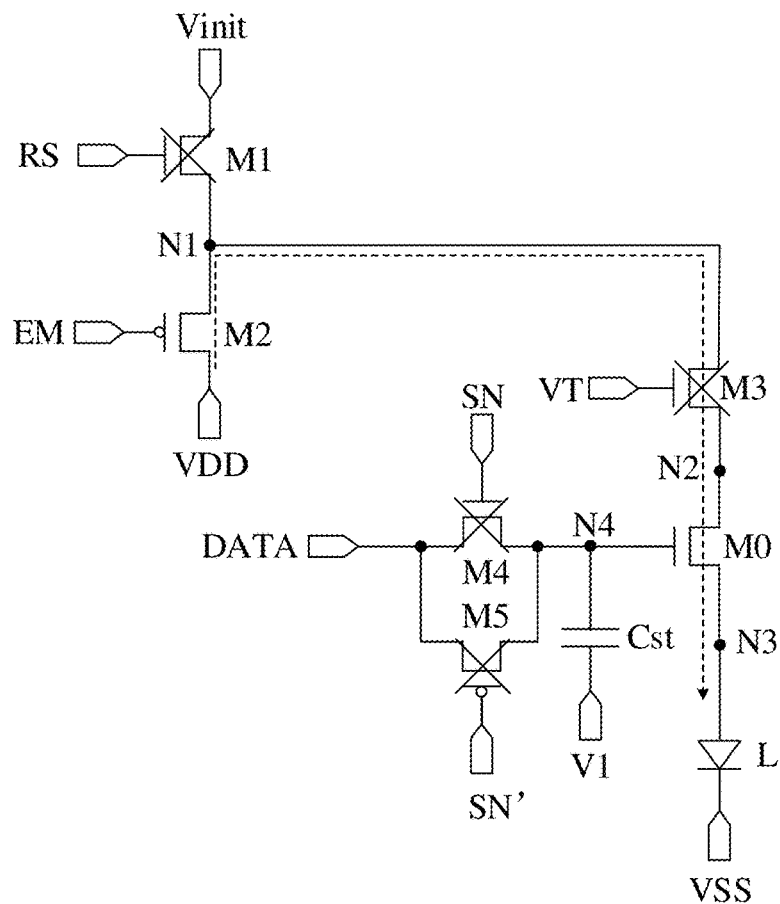

FIGS. 36 to 39 are circuit diagrams of the pixel circuit shown in FIG. 20 corresponding to the four phases in FIG. 35, respectively. Specifically, FIG. 36 is a circuit diagram when the pixel circuit shown in FIG. 20 is in the reset phase S1, FIG. 37 is a circuit diagram when the pixel circuit shown in FIG. 20 is in the data writing phase S2, FIG. 38 is a circuit diagram when the pixel circuit shown in FIG. 20 is in the light emitting phase S3, and FIG. 39 is a circuit diagram when the pixel circuit shown in FIG. 20 is in the non-light emitting phase S4. In addition, the transistors identified by the cross (X) in FIGS. 36 to 39 indicate that they are in an off state in the corresponding phase, and a dashed line with an arrow in FIGS. 36 to 39 indicates a current path of the pixel circuit in the corresponding phase (the direction of the arrow does not indicate the current direction).

In the reset phase S1, the reset control signal RS and the transmission control signal VT are inputted, the voltage control circuit C200 and the voltage transmission circuit C120 are turned on, and the reset voltage Vinit is applied to the first terminal T112 of the driving circuit C110 via the voltage control circuit C200 and the voltage transmission circuit C120, so as to reset the light emitting element L. For example, specifically, in the reset phase S1, the voltage control circuit C200 is turned on by turning on the first control sub-circuit C210, and the reset voltage Vinit is applied to the first terminal T112 of the driving circuit C110 via the first control sub-circuit C210 and the voltage transmission circuit C120.

As shown in FIGS. 35 and 36, in the reset phase S1, the N-type first switching transistor M1 is turned on by the high level of the reset control signal RS, and the N-type third switching transistor M3 is turned on by the high level of the transmission control signal VT; at the same time, the P-type second switching transistor M2 is turned off by the high level of the light emitting control signal EM, the N-type fourth switching transistor M4 is turned off by the low level of the scan signal SN, and accordingly, the P-type fifth switching transistor M5 is turned off by the high level of the inverted signal SN' of the scan signal SN; moreover, the driving transistor M0 is turned on by the electric level of the fourth node N4 (i.e., the data signal DATA stored by the storage capacitor Cst during the display of a previous frame).

As shown in FIG. 36, in the reset phase S1, a reset path can be formed (as shown by the dashed line with an arrow in FIG. 36). Because the reset voltage Vinit is a low voltage (e.g., a ground voltage or a zero voltage), the light emitting element L can be reset through the reset path.

In the data writing phase S2, the scan signal SN is inputted, the data writing circuit C130 is turned on, the data signal DATA is written to the control terminal T111 of the driving circuit C110 via the data writing circuit C130, and the data signal DATA being written is stored by the data writing circuit C130.

As shown in FIGS. 35 and 37, in the data writing phase S2, the N-type fourth switching transistor M4 is turned on by the high level of the scan signal SN, and accordingly, the P-type fifth switching transistor M5 is turned on by the low level of the inverted signal SN' of the scan signal SN; at the same time, the N-type first switching transistor M1 is turned off by the low level of the reset control signal RS, the P-type second switching transistor M2 is turned off by the high level of the light emitting control signal EM, and the N-type third switching transistor M3 is turned off by the low level of the transmission control signal VT.

As shown in FIG. 37, in the data writing phase S2, a data writing path can be formed (as shown by the dashed line with an arrow in FIG. 37). The data signal DATA charges the first terminal of the storage capacitor Cst (i.e., the fourth node N4, i.e., the gate electrode of the driving transistor M0) through the data writing path, so that the potential of the first terminal of the storage capacitor Cst becomes DATA, and the driving transistor M0 is kept in an on state under the control of the data signal DATA.

At the end of the data writing phase S2, the potential of the first terminal of the storage capacitor Cst (i.e., the fourth node N4, i.e., the gate electrode of the driving transistor M0) is DATA, that is, the voltage information of the data signal DATA is stored in the storage capacitor Cst for controlling the driving transistor M0 to generate a driving current in the subsequent light emitting phase.

In the light emitting phase S3, the light emitting control signal EM and the transmission control signal VT are inputted, the voltage control circuit C200, the voltage transmission circuit C120 and the driving circuit C110 are turned on, the first power voltage VDD is applied to the first terminal T112 of the driving circuit C110 via the voltage control circuit C200 and the voltage transmission circuit C120, and the driving circuit C110 is caused to control the voltage Vs of the second terminal T113 of the driving circuit C110 according to the data signal DATA of the control terminal T111 of the driving circuit C110 and the first power voltage VDD of the first terminal T112 of the driving circuit C110, and generates a driving current based on the voltage Vs of the second terminal T113 of the driving circuit C110 to drive the light emitting element L to emit light. For example, specifically, in the light emitting phase S3, the voltage control circuit C200 is turned on by turning on the second control sub-circuit C220, and the first power voltage VDD is applied to the first terminal T112 of the driving circuit C110 via the second control sub-circuit C220 and the voltage transmission circuit C120.

As shown in FIGS. 35 and 38, in the light emitting phase S3, the P-type second switching transistor M2 is turned on by the low level of the light emitting control signal EM, and the N-type third switching transistor M3 is turned on by the high level of the transmission control signal VT; at the same time, the N-type first switching transistor M1 is turned off by the low level of the reset control signal RS, the N-type fourth switching transistor M4 is turned off by the low level of the scan signal SN, and accordingly, the P-type fifth switching transistor M5 is turned off by the high level of the inverted signal SN' of the scan signal SN; moreover, the driving transistor M0 is turned on by the electric level of the fourth node N4 (i.e., the data signal DATA stored by the storage capacitor Cst in the data writing phase S2).

As shown in FIG. 38, in the light emitting phase S3, a light emitting path can be formed (as shown by the dashed line with an arrow in FIG. 38). The first electrode (anode) of the light emitting element L is connected to the first power voltage VDD (high voltage) through the light emitting path, and the second electrode (cathode) of the light emitting element L is connected to the second power voltage VSS (low voltage), so that the light emitting element L can emit light under the action of the driving current flowing through the driving transistor M0. For example, in some examples, the driving transistor M0 operates in the sub-threshold region. It should be noted that in the embodiment of the present disclosure, the driving transistor M0 is considered to be in an on state when the driving transistor M0 operates in the sub-threshold region. The driving current generated by the driving transistor M0 can be obtained according to the following formula:

$$I_L = I_0 \exp\left(\frac{q(Vgs - Vth)}{nkT}\right) = I_0 \exp\left(\frac{q(DATA - Vs - Vth)}{nkT}\right).$$

In the above formula, $I_L$ represents a driving current, $I_0$ represents a driving current when Vgs=Vth, Vth represents a threshold voltage of the driving transistor M0, Vgs represents a voltage difference between the gate electrode and the second electrode (e.g., the source electrode) of the driving transistor M0, Vs represents the voltage of the second electrode of the driving transistor M0, q is the electron charge (a constant value), n is the doping concentration of the channel of the driving transistor M0, k is a constant value, and T is the operating temperature of the driving transistor M0.

In some embodiments of the present disclosure, the driving transistor M0 operates in a sub-threshold region, Vgs<Vth; in the ideal case, there exists a linear relationship between the voltage Vs of the second electrode of the driving transistor M0 and the voltage DATA of the gate electrode of the driving transistor M0, $V_s$=a·DATA+b, where a and b are both constant values. That is, the voltage of the second electrode of the transistor M0 varies linearly with the voltage of the gate electrode of the driving transistor M0. Therefore, the voltage Vs of the second electrode of the driving transistor M0 can be changed by adjusting the voltage of the gate electrode of the driving transistor M0 (i.e., the voltage of the data signal DATA), so that the voltage difference between the two electrodes of the light emitting element L can be changed, and further, the light emitting brightness of the light emitting element L can be adjusted.

The above driving current $I_L$ is applied to the light emitting element L through the light emitting path, so that the light emitting element L emits light under the action of the driving current flowing through the driving transistor M0. It should be noted that in the display substrate provided by the embodiments of the present disclosure, a grayscale of light emitted from the pixel circuit is not only related to the magnitude of the driving current, but also related to the time duration of the driving current being applied to the light emitting element L (i.e., the light emitting time of the light emitting element L). For example, the relationship between the grayscale of light emitted from the pixel circuit and the group consisting of the magnitude of the driving current and the length of the light emitting time can be determined by means of theoretical calculation, simulation, experimental measurement, etc., and further, a required grayscale can be displayed by simultaneously controlling the magnitude of the driving current and the length of the light emitting time according to the relationship. For example, in some examples, the above driving method can insert a non-light emitting phase S4 after the light emitting phase S3 to control the length of the light emitting time of the light emitting element.

In the non-light emitting phase S4, the input of the transmission control signal VT is stopped, and the voltage transmission circuit C120 is turned off, so that the first power voltage VDD cannot be applied to the first terminal T112 of the driving circuit C110 so as to stop the light emitting element L from emitting light.

As shown in FIGS. 35 and 39, after the light emitting phase S3 lasts for a period of time, the input of the transmission control signal VT can be stopped (other control signals remain in the state in the light emitting phase S3), for example, the transmission control signal VT changes from a high level to a low level to turn off the third switching transistor M3, so that the first power voltage VDD cannot be applied to the first terminal of the driving transistor M0, the light emitting path in FIG. 38 is disconnected, the driving transistor M0 cannot generate the driving current, and the light emitting element L stops emitting light, i.e., enters the non-light emitting phase S4.

For example, in some examples, after the non-light emitting phase S4 lasts for a period of time, the transmission control signal VT can be inputted again, so that the light emitting element L returns to the light emitting phase S3, that is, the light emitting phase S3 can alternate with the non-light emitting phase S4. For example, PWM dimming can be realized based on the switching between the light emitting phase S3 and the non-light emitting phase S4.

It should be noted that the switching between the light emitting phase S3 and the non-light emitting phase S4 can also be realized by other means, and is not limited to the above-mentioned means. For example, the switching between the light emitting phase S3 and the non-light emitting phase S4 can be realized by controlling whether the light emitting control signal EM is inputted or not. It can be understood that it is also allowed to simultaneously control whether the light emitting control signal EM and the transmission control signal VT are inputted to realize the switching between the light emitting phase S3 and the non-light emitting phase S4.

It should be noted that the current transmission circuit C140 basically remains in an on state under the control of the second voltage V2, so the pixel circuit shown in FIG. 19 (for example, specifically implemented as the circuit structure shown in FIG. 21) can also be driven according to the timing chart of various control signals shown in FIG. 35. Specific details can be referred to the related description of the driving method, and will not be repeated here.

It should be noted that the signal timing chart shown in FIG. 35 is illustrative. For the display substrate provided by the embodiments of the present disclosure, the signal timing thereof during operation can be determined according to actual needs, without being limited in the embodiments of the present disclosure.

Figure 40:
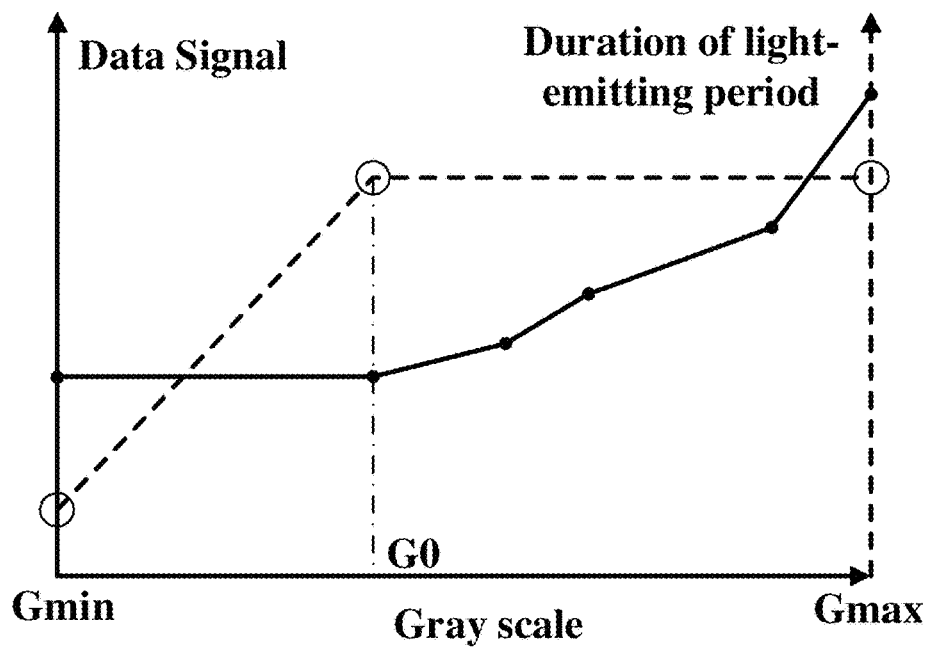
FIG. 40 is a schematic diagram of the principle of controlling a display grayscale in the driving method of the pixel circuit according to at least one embodiment of the present disclosure.

FIG. 40 is a schematic diagram of the principle of controlling a display grayscale in the driving method of the pixel circuit according to at least one embodiment of the present disclosure. For example, as shown in FIG. 40, in the driving method provided by the embodiments of the present disclosure, each sub-pixel can display a required grayscale by simultaneously controlling the magnitude of the driving current and the length of the light emitting time (i.e., the duration of the aforementioned light emitting phase).

For example, the magnitude of the driving current can be controlled by adjusting the magnitude of the data signal DATA, and for example, this process can be referred to the aforementioned formula of the driving current. For example, the length of the light emitting time of the light emitting element can be controlled by controlling the duration of the light emitting phase, for example, the switching between the light emitting phase and the non-light emitting phase can be realized by controlling whether the light emitting control signal EM is inputted and/or whether the transmission control signal VT is inputted, and thus the length of the light emitting time can be controlled.

For example, in some examples, the driving method provided by the embodiments of the present disclosure can further include: controlling a display grayscale of the light emitting element by adjusting the magnitude of the data signal DATA and the time duration of the transmission control signal VT in the light emitting phase. For example, specifically, referring to FIG. 40, in the case where a target display grayscale of the light emitting element is less than a preset value G0 (i.e., the target display grayscale is between Gmin and G0, where Gmin is the lowest grayscale), the magnitude of the data signal DATA is kept unchanged (correspondingly, the light emitting brightness of the light emitting element is kept unchanged), and the display grayscale of the light emitting element is made to conform to the target display grayscale by adjusting the time duration of the transmission control signal VT in the light emitting phase (i.e., the light emitting time of the light emitting element); in the case where the target display grayscale of the light emitting element is not less than the preset value (i.e., the target display grayscale is between G0 and Gmax, and Gmax is the highest grayscale), the time duration of the transmission control signal VT in the light emitting phase is kept unchanged, and the display grayscale of the light emitting element is made to conform to the target display grayscale by adjusting the magnitude of the data signal DATA.

It should be noted that the preset value G0 can be determined according to actual needs, without being limited in the embodiments of the present disclosure. It should also be noted that the correspondence relationship between the data signal and the display grayscale (shown by solid lines and solid dots in the figure) and the correspondence relationship between the time duration of the light emitting phase and the display grayscale (shown by dashed lines and hollow circles in the figure) shown in FIG. 40 are illustrative, and both of them can be determined according to actual needs, without being limited in the embodiments of the present disclosure.

The technical effects of the driving method of the display substrate provided by the embodiments of the present disclosure can be referred to the related description of the display substrate in the above embodiments and will not be repeated here.

Figure 41:
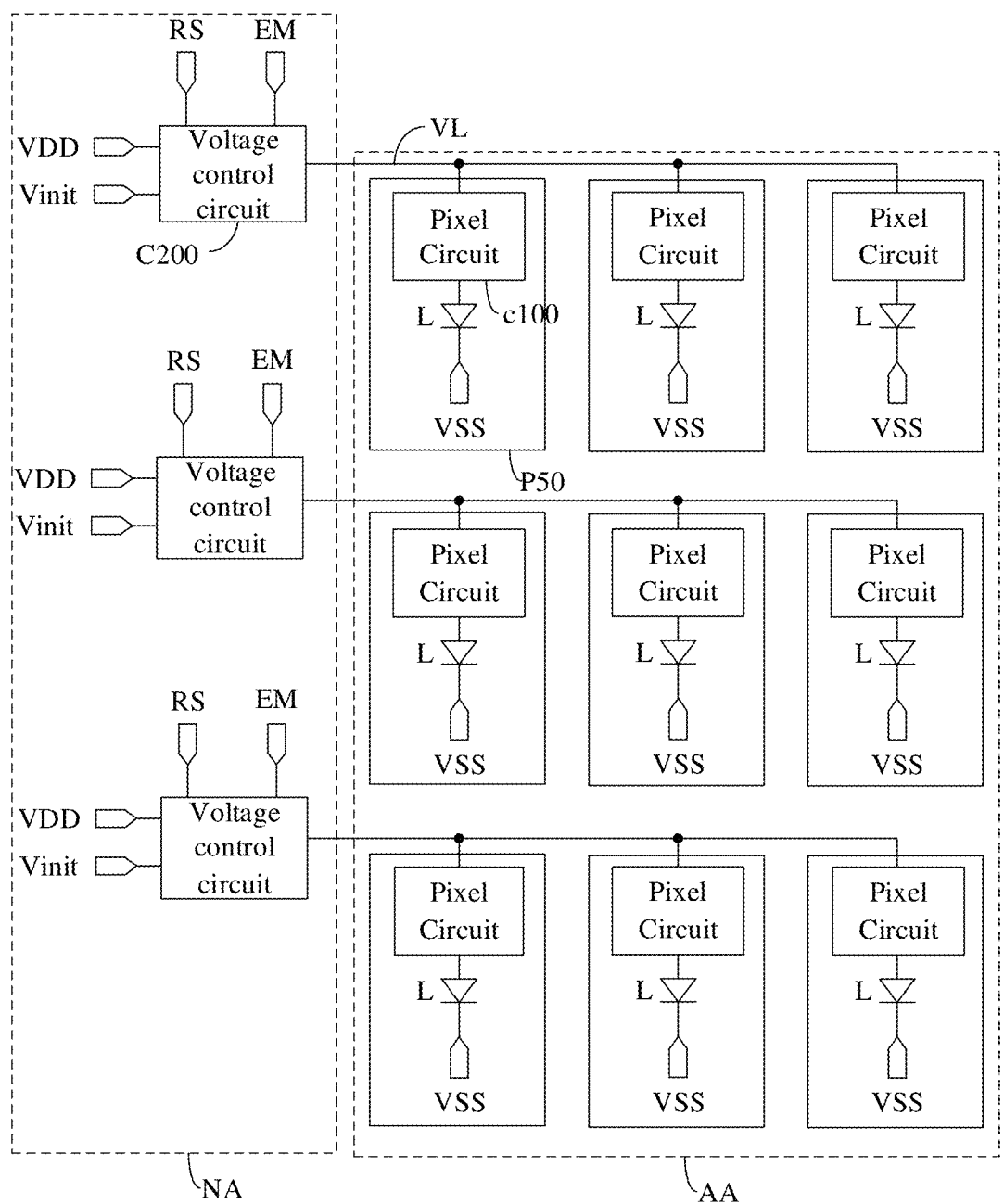
FIG. 41 is a schematic structural diagram of a display substrate according to at least one embodiment of the present disclosure.

FIG. 41 is a schematic structural diagram of a display substrate according to at least one embodiment of the present disclosure. For example, the display substrate includes the pixel circuit provided by any one of the above embodiments of the present disclosure. For example, the display substrate can be a silicon-based base substrate, and the embodiments of the present disclosure include but are not limited thereto. For example, a cross-sectional structure of the display substrate can be referred to the structure of the silicon-based OLED display device shown in FIG. 17. For example, referring to FIG. 17, the pixel circuit (referring to the transistor shown in FIG. 17) can be formed at least partially in the silicon-based substrate, and the light emitting element can be formed on the pixel circuit. For example, more details of the display substrate can be referred to the related description of the silicon-based OLED display device shown in FIG. 17 and will not be repeated here.

For example, as shown in FIG. 41, the display substrate includes a display region AA and a non-display region NA. For example, the non-display region NA is a region other than the display region AA on the display substrate. For example, in some examples, the non-display region NA surrounds the display region AA.

For example, as shown in FIG. 41, the display region AA of the display substrate includes a plurality of sub-pixels P50 arranged in an array. For example, the plurality of sub-pixels P50 can include a variety of color sub-pixels, such as red sub-pixels, green sub-pixels and blue sub-pixels, etc., and the embodiments of the present disclosure include but are not limited thereto. For example, the arrangement manner of the subpixels of various colors can be determined according to actual needs, without being limited in the embodiments of the present disclosure.

For example, as shown in FIG. 41, each sub-pixel P50 includes a light emitting element L and a pixel sub-circuit C100 coupled to the light emitting element L, and the pixel sub-circuit C100 can be used to drive the light emitting element L to emit light. That is, the pixel sub-circuit C100 in the above pixel circuit can be disposed in the display region AA of the display substrate. For example, the light emitting element L can include an organic light emitting diode (OLED), and the embodiments of the present disclosure include but are not limited thereto; for example, the light emitting element L can also include a quantum dot light emitting diode (QLED) or an inorganic light emitting diode, etc. For example, the light emitting element L can adopt a micron-sized light emitting element, such as Micro-OLED, Mini-OLED, etc., and the embodiments of the present disclosure include but are not limited thereto.

For example, as shown in FIG. 41, the non-display region NA includes a plurality of voltage control circuits C200, and each voltage control circuit C200 is coupled to a pixel sub-circuit C100 in at least one row of sub-pixels P50. That is, the voltage control circuit in the above pixel circuit can be disposed in the non-display region NA of the display substrate. For example, after entering the light emitting phase, the light emitting time of the light emitting elements L of the at least one row (e.g., one row or more rows) of sub-pixels coupled to one voltage control circuit C200 can be controlled by controlling whether the light emitting control signal EM is inputted or not.

For example, as shown in FIG. 41, the display substrate further includes a plurality of voltage transmission lines VL corresponding to each row of sub-pixels P50. The pixel sub-circuits C100 in each row of sub-pixels P50 are connected to the voltage control circuit C200 via a corresponding voltage transmission line VL, and the corresponding voltage transmission line VL is configured to transmit the reset voltage Vinit and the first power voltage VDD provided by the voltage control circuit C200 to the pixel sub-circuits C100.

For example, in the display substrate shown in FIG. 41, because the voltage control circuit C200 is disposed in the non-display region NA, wires, such as a first power line for transmitting the first power voltage VDD, a reset control signal line for transmitting the reset control signal RS and a light emitting control signal line for transmitting the light emitting control signal EM, can also be disposed in the non-display region NA accordingly. Therefore, the wiring layout in the display region AA of the display substrate can be simplified, so that the display region AA can be provided with more sub-pixels P50 (i.e., pixel sub-circuits C100, light emitting elements L, etc.), which is favorable for realizing high resolution (high PPI) display. For example, in some examples, the voltage transmission circuits C120 in the pixel sub-circuits C100 of each row of sub-pixels P50 can be connected to a same transmission control signal line, and the transmission control signal VT is provided by the same transmission control signal line; and therefore, after entering the light emitting phase, the light emitting time of the light emitting elements L of each row of subpixels can be controlled by controlling whether the transmission control signal VT is inputted or not.

It should be noted that in the embodiments of the present disclosure, because the voltage transmission circuit C120 is located inside the sub-pixel P50 and the second control sub-circuit C220 is located outside the sub-pixel P50 (located in the non-display area NA), compared with PWM control based on the second control sub-circuit C220 (i.e., controlling whether the light emitting control signal EM is inputted or not), PWM control based on the voltage transmission circuit C120 (i.e., controlling whether the transmission control signal VT is inputted or not) can reduce the influence of wiring load (e.g., parasitic capacitance, parasitic resistance, etc.), so as to better ensure the uniformity of PWM control of sub-pixels.

It should be noted that FIG. 41 only exemplarily shows a case where each voltage control circuit C200 is coupled to the pixel sub-circuits C100 in one row of sub-pixels P50, and the embodiments of the present disclosure include but are not limited thereto. For example, each voltage control circuit C200 can also be coupled to pixel sub-circuits C100 in a plurality of rows (e.g., two rows, three rows, four rows, etc., e.g., the plurality of rows includes some adjacent rows) of sub-pixels P50.

The display substrate provided by the embodiments of the present disclosure, by setting the voltage control circuit C200 in the non-display region NA, can simplify the structure of the pixel sub-circuit C100 in each sub-pixel P50 and reduce the occupied area of the pixel sub-circuit C100 in each sub-pixel P50, so that more sub-pixels P50 (i.e., the pixel sub-circuits C100 and the light emitting elements L, etc.) can be set in the display region AA, which is favorable for realizing high resolution (high PPI) display.

Figure 42:
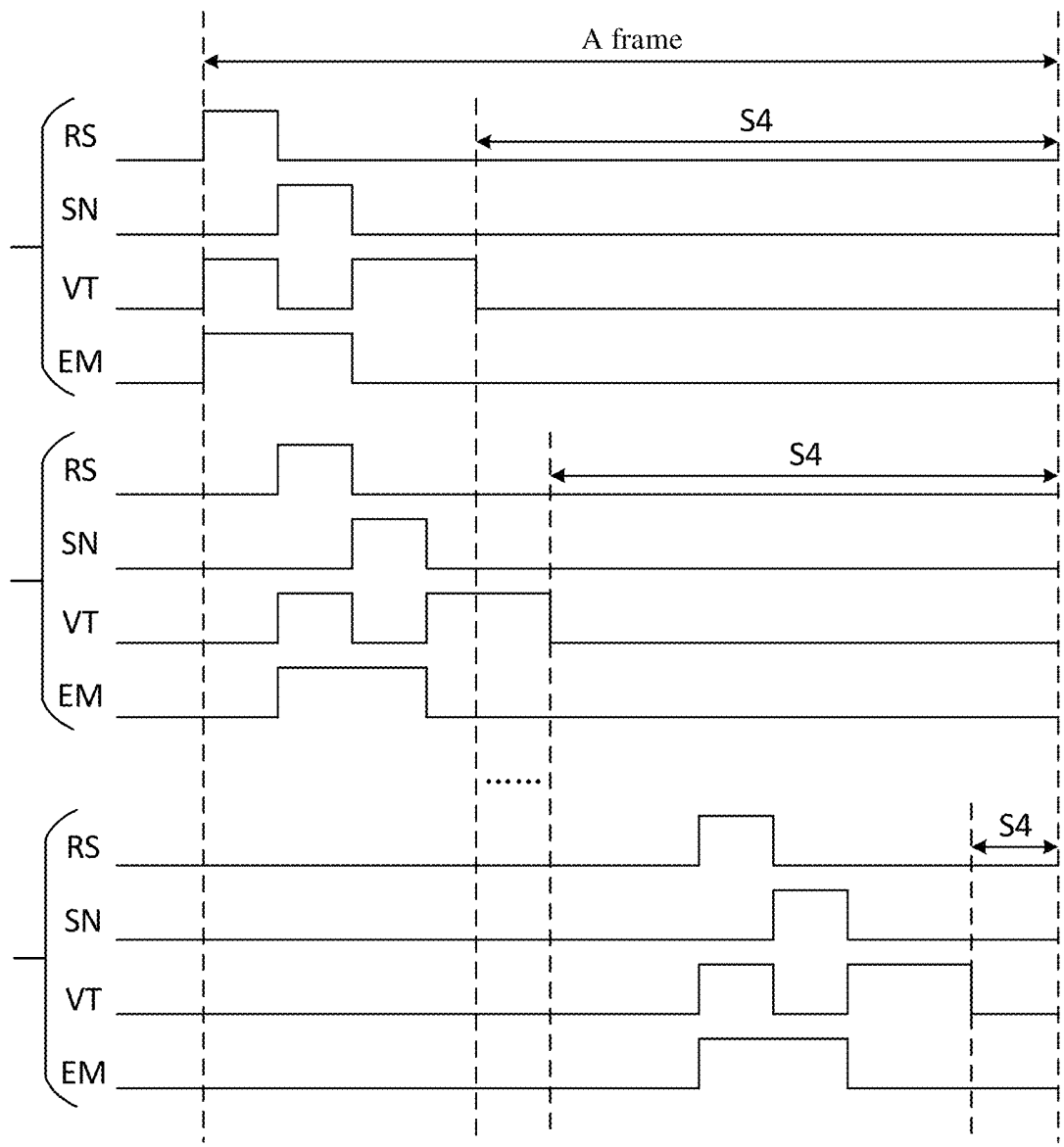
FIG. 42 is a signal timing chart of a driving method of a display substrate provided by at least one embodiment of the present disclosure.

FIG. 42 is a signal timing chart of a driving method of a display substrate provided by at least one embodiment of the present disclosure. For example, the signal timing chart shown in FIG. 35 can be used to drive one row of sub-pixels in the display substrate provided by the embodiments of the present disclosure, while the signal timing chart shown in FIG. 42 can be used to drive the display substrate (i.e., to drive all rows of sub-pixels in the display substrate).

For example, as shown in FIG. 42, the signal timing corresponding to each row of sub-pixels (i.e., reset control signal RS, scan signal SN, transmission control signal VT, and light emitting control signal EM included in one brace) is basically the same as the signal timing shown in FIG. 35, that is, the operation principle of each row of sub-pixels alone can be referred to the related description of the aforementioned driving method and will not be described here again.

For example, as shown in FIG. 42, the driving method of the display substrate includes: in a display period of one frame, enabling all rows of sub-pixels to enter a reset phase, a data writing phase and a light emitting phase row by row. For example, the signal timing corresponding to the reset phase, data writing phase and light emitting phase of each row of sub-pixels can be referred to the signal timing corresponding to the reset phase, data writing phase and light emitting phase shown in FIG. 35.

For example, in the reset phase of each row of sub-pixels, the reset control signal RS and the transmission control signal VT are inputted, the voltage control circuit C200 and the voltage transmission circuit C120 are turned on, and the reset voltage Vinit is applied to the first terminal T112 of the driving circuit C110 via the voltage control circuit C200 and the voltage transmission circuit C120, so as to reset the light emitting element L of the each row of sub-pixels. For example, specifically, in the reset phase, the voltage control circuit C200 is turned on by turning on the first control sub-circuit C210, and the reset voltage Vinit is applied to the first terminal T112 of the driving circuit C110 via the first control sub-circuit C210 and the voltage transmission circuit C120. For example, specific details can be referred to the related description of the reset phase S1 in the driving method of the pixel circuit described above, and will not be repeated here.

For example, in the data writing phase of each row of sub-pixels, the scan signal SN is inputted, the data writing circuit C130 is turned on, the data signal DATA is written to the control terminal T111 of the driving circuit C110 via the data writing circuit C130, and the data signal DATA being written is stored by the data writing circuit C130. For example, specific details can be referred to the related description of the data writing phase S2 in the driving method of the pixel circuit described above, and will not be repeated here.

For example, in the light emitting phase of each row of sub-pixels, the light emitting control signal EM and the transmission control signal VT are inputted, the voltage control circuit C200, the voltage transmission circuit C120 and the driving circuit C110 are turned on, the first power voltage VDD is applied to the first terminal T112 of the driving circuit C110 via the voltage control circuit C200 and the voltage transmission circuit C120, and the driving circuit C110 is caused to control the voltage Vs of the second terminal T113 of the driving circuit C110 according to the data signal DATA of the control terminal T111 of the driving circuit C110 and the first power voltage VDD of the first terminal T112 of the driving circuit C110, and generates a driving current based on the voltage Vs of the second terminal T113 of the driving circuit C110 to drive the light emitting element L of the each row of sub-pixels to emit light. For example, specifically, in the light emitting phase, the voltage control circuit C200 is turned on by turning on the second control sub-circuit C220, and the first power voltage VDD is applied to the first terminal T112 of the driving circuit C110 via the second control sub-circuit C220 and the voltage transmission circuit C120. For example, specific details can be referred to the related description of the light emitting phase S3 in the driving method of the pixel circuit described above, and will not be repeated here.

For example, as shown in FIG. 42, the driving method of the display substrate can further include: in the display period of one frame, enabling all rows of sub-pixels to enter the non-light emitting phase S4 row by row. For example, as shown in FIG. 41, the light emitting elements of each row of sub-pixels can enter the non-light emitting phase S4 from the light emitting phase to by stopping the input of the transmission control signal VT, and the embodiments of the present disclosure include but are not limited to such means of realizing the switching between the light emitting phase and the non-light emitting phase. For example, other means can be referred to the related description in the driving method of the pixel circuit described above.

For example, in the non-light emitting phase S4 of each row of sub-pixels, the input of the transmission control signal VT is stopped, and the voltage transmission circuit C120 is turned off, so that the first power voltage VDD cannot be applied to the first terminal T112 of the driving circuit C110 to stop the light emitting element L of the each row of sub-pixels from emitting light. For example, specific details can be referred to the related description of the non-light emitting phase S4 in the driving method of the pixel circuit described above, and will not be repeated here.

The driving method of the display substrate shown in FIG. 42 can realize a row-by-row black insertion within the display period of one frame, thereby effectively controlling the brightness of the entire screen when the display substrate is displaying.

Figure 43:
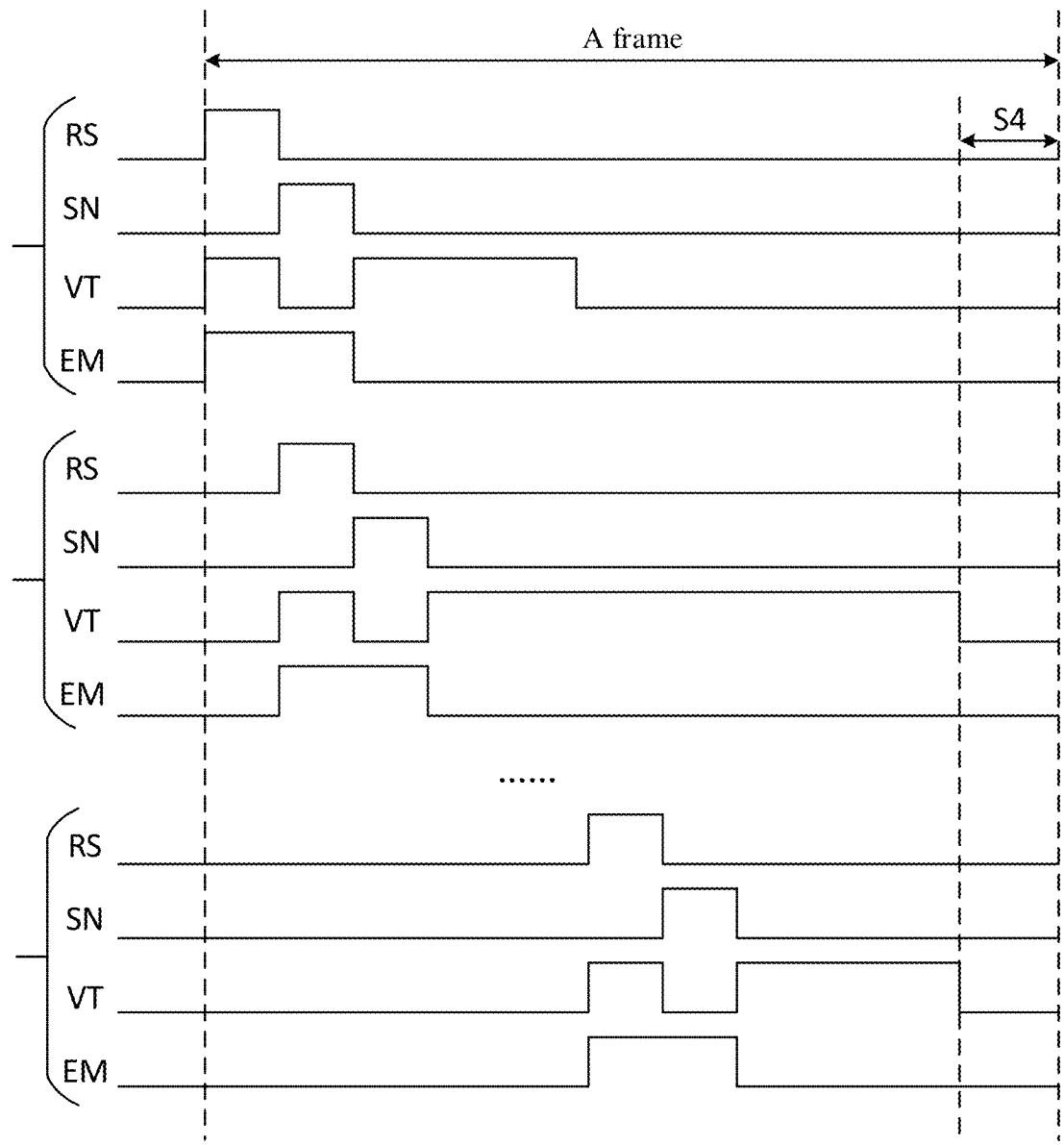
FIG. 43 is a signal timing chart of a driving method of a display substrate provided by at least one embodiment of the present disclosure.

FIG. 43 is a signal timing diagram of another driving method of a display substrate according to at least one embodiment of the present disclosure. For example, similar to the signal timing chart shown in FIG. 42, the signal timing chart shown in FIG. 43 can also be used to drive all rows of sub-pixels in the display substrate.

For example, as shown in FIG. 43, the signal timing corresponding to each row of sub-pixels (i.e., reset control signal RS, scan signal SN, transmission control signal VT, and light emitting control signal EM included in one brace) is basically the same as the signal timing shown in FIG. 35, that is, the operation principle of each row of sub-pixels alone can be referred to the related description of the aforementioned driving method and will not be described here again.

For example, similar to the driving method of the display substrate shown in FIG. 42, the driving method of the display substrate shown in FIG. 43 can also include: in a display period of one frame, enabling all rows of sub-pixels to enter a reset phase, a data writing phase and a light emitting phase row by row. For example, in the driving method of the display substrate shown in FIG. 43, the operation principles of the reset phase, the data writing phase and the light emitting phase of each row of sub-pixels can be referred to the operation principles of the reset phase, the data writing phase and the light emitting phase in the driving method of the display substrate shown in FIG. 42, and details will not be described here again.

For example, as shown in FIG. 43, the driving method of the display substrate can further include: in the display period of one frame, enabling all rows of sub-pixels to enter the non-light emitting phase S4 simultaneously. For example, as shown in FIG. 43, the light emitting elements of all rows of sub-pixels can enter the non-light emitting phase S4 simultaneously from the light emitting phase by stopping the input of the transmission control signal VT, and the embodiments of the present disclosure include but are not limited to such means of realizing the switching between the light emitting phase and the non-light emitting phase. For example, other means can be referred to the related description in the driving method described above.

For example, in the non-light emitting phase S4 of all rows of sub-pixels, the input of the transmission control signals VT to all row of sub-pixels is stopped at the same time, and the voltage transmission circuits C120 are turned off, so that the first power voltage VDD cannot be applied to the first terminals T112 of the driving circuits C110 to stop the light emitting elements L of all row of sub-pixels from emitting light at the same time. For example, specific details can be referred to the related description of the non-light emitting phase S4 in the driving method of the pixel circuit described above, and will not be repeated here.

The driving method of the display substrate shown in FIG. 43 can realize a full-screen black insertion within the display period of one frame, thereby alleviating the problem of motion blur in high frame rate display.

It should be noted that the signal timing charts shown in FIG. 42 and FIG. 43 are illustrative. For the display substrate provided by the embodiments of the present disclosure, the signal timing thereof during operation can be determined according to actual needs, without being limited in the embodiments of the present disclosure.

For example, the scan driving circuit 12*b* in the above embodiments can be connected to the data writing circuits in all rows of sub-pixels through a plurality of scan signal lines GL, so as to provide the scan signals SN; and the scan driving circuit 12*b* can also be connected to a plurality of voltage control circuits through a plurality of reset control signal lines RL and a plurality of light emitting control signal lines EL, respectively, so as to provide the reset control signals RS and the light emitting control signals EM. For example, the scan driving circuit can be directly integrated on the display substrate (e.g., the silicon-based base substrate) to form a GOA (Gate driver On Array). Of course, the scan driving circuit can also be implemented as a bonded integrated circuit driver chip.

For example, the data driving circuit 12*c* in the above embodiments can be connected to data writing circuits in all columns of sub-pixels through a plurality of data signal lines DL, so as to provide data signals DATA. For example, the above-mentioned data driving circuit 12*c* is directly formed on a silicon-based base substrate, and can also be realized by a bonded integrated circuit driver chip.

For example, the display device can also include other components, such as a timing controller, a signal decoding circuit, a voltage conversion circuit, etc. These components can adopt, for example, conventional components or structures, and details will not be described here.

For example, referring to the signal timing chart shown in FIG. 42 or FIG. 43, a progressive scanning process of the display device can be realized, and details of each phase of each row of pixel circuits can be referred to the related description in the embodiment shown in FIG. 42 or FIG. 43. It should be noted that in the progressive scanning process, control signals such as the reset control signal, the scan signal, the transmission control signal and the light emitting control signal are applied row by row according to the signal timing.

It should be noted that in the embodiments of the present disclosure, the array substrate, the display substrate, and the display device are mentioned. The display device may include the display substrate, and the display substrate may include the array substrate. Therefore, the repeated parts in various embodiments can be referred to each other.

Throughout the disclosure, it should be noted that the orientation or the positional relationship as indicated by the terms such as "top" and "bottom", are orientation or positional relationship based on the drawings, and serve only to facilitate and simplify the present description, and does not indicate or imply that the device or element must have a particular orientation, or it must be constructed or operated with particular orientation, and therefore it cannot be construed as limiting the disclosure. Unless otherwise clearly defined and limited, the term "connected," "connection," and "coupled" should be broadly interpreted, for example, it may be a fixed connection, it can be a removable connection, or an integral connection; it may be a mechanical connection, may be an electrical connection; it may be a direct connection, maybe be a connection through intermediaries, or an internal connection of two components. Those of ordinary skill in the art can understand the meanings of the aforementioned terms in disclosure according to the specific context.

In the description of the disclosure, numerous specific details are described. However, it can be understood that the embodiments of the disclosure may be implemented without these specific details. In some embodiments, well-known methods, structures and techniques are not described in details, so as not to obscure the comprehension to this description.

Similarly, it should be understood, that in order to simplify the disclosure and help the understanding of one or multiple aspects of the disclosure, in the description of the embodiments of the disclosure, various features of the disclosure are sometimes grouped together in a single embodiment, figure, or description thereof. However, it should not be interpreted as the methods of the disclosure reflecting the following intentions: that is, the disclosure requires more features than the features expressly described in each of the claims. More specifically, as reflected in the claims, inventive aspects are less than all features of a single embodiment disclosed above. Thus, the claims following the requirements of specific embodiments are hereby expressly incorporated into these particular embodiments, each claim itself is regarded as a separate embodiment of the disclosure.

It should be noted that the above embodiments of the disclosure are intended to describe rather than limit the disclosure, and that those skilled in the art can design alternative embodiments without departing from the scope of the claim. In the claims, any reference signs placed between parentheses should not be construed as limitations to the claims. The word "comprise(s)", "include(s)", "comprising" and "including" do not exclude components or steps that are not listed in the claims. The word "a" or "an" does not exclude the existence of a plurality of such components. The disclosure may be implemented by hardware comprising several distinct components and by means of a computer that is suitably programmed In a single claim that lists several apparatuses, several of these components may be implemented through a single hardware. The use of the word first, second, and third, etc. does not denote any order. These words can be interpreted as names.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display substrate comprising:
   a base substrate, comprising a monocrystalline silicon layer, a thickness of the monocrystalline silicon layer being less than that of the base substrate;
   an array circuit layer, disposed on the base substrate and comprising a plurality of transistors, each of which has an active layer inside the monocrystalline silicon layer;
   a plurality of light-emitting elements, located at a side of the array circuit layer away from the base substrate;
   a first reflective electrode, located at a side of each of the light-emitting elements close to the base substrate, wherein the light-emitting element comprises a first electrode layer, an organic light-emitting functional layer, and a second electrode layer that are sequentially stacked in a direction from a position close to the base substrate to a position away from the base substrate, an orthographic projection of the first reflective electrode on the base substrate is at least partially overlapped with an orthographic projection of the first electrode layer on the base substrate; and
a third insulating layer, located between the first reflective electrode and the first electrode layer, wherein the third insulating layer is a light transmission layer,
wherein the display substrate comprises a display area and a peripheral area located at a periphery of the display area, the peripheral area comprises a first peripheral area and a second peripheral area, and the array circuit layer comprises a scan driving circuit located in the first peripheral area and a data driving circuit located in the second peripheral area, and a plurality of pixel sub-circuits located in the display area, and the plurality of pixel sub-circuits are connected to the plurality of light-emitting elements, respectively, to form a plurality of sub-pixels,
the array circuit layer comprises a plurality of scan lines and a plurality of data lines, the scan driving circuit is connected to the plurality of pixel sub-circuits through the plurality of scan lines, and the data driving circuit is connected to the plurality of pixel sub-circuits through the plurality of data lines,
wherein the array circuit layer comprises the active layer in the monocrystalline silicon layer, and a first insulating layer, a first conductive layer, a second insulating layer, and a second conductive layer that are sequentially disposed on the base substrate, the first conductive layer comprises a gate electrode of each of the plurality of transistors, the second conductive layer comprises a source electrode of each of the plurality of transistors and a drain electrode of each of the plurality of transistors, a plurality of first vias are provided in the second insulating layer, and the source electrode and the drain electrode of each of the plurality of transistors are connected to the active layer in the monocrystalline silicon layer through the plurality of first vias, respectively.

2. The display substrate according to claim 1, wherein the base substrate is a monocrystalline silicon substrate, and the monocrystalline silicon layer is a portion of the monocrystalline silicon substrate at a side close to the plurality of light-emitting elements.

3. The display substrate according to claim 1, further comprising: a plurality of second reflective electrodes located in the peripheral area of the display substrate and a light-blocking layer located at a side of the plurality of second reflective electrodes away from the base substrate, wherein the second reflective electrode is provided in the same layer as the first reflective electrode.

4. The display substrate according to claim 1, wherein the third insulating layer comprises a first opening exposing the first reflective electrode, and at least a portion of the first electrode layer passes through the first opening to be electrically connected to the first reflective electrode; or the first reflective electrode is separated from the first electrode layer by the third insulating layer and is insulated from the first electrode layer.

5. The display substrate according to claim 3, wherein each of the first reflective electrode and the second reflective electrode comprise a metal layer and at least one protective layer that is stacked with the metal layer and is disposed at a side of the metal layer close to the base substrate.

6. The display substrate according to claim 1, wherein the third insulating layer is a silicon nitride layer, and the silicon nitride layer is in direct contact with the first reflective electrode.

7. The display substrate according to claim 6, wherein a deposition temperature of the silicon nitride layer is in a range of 70-100° C.

8. The display substrate according to claim 7, wherein the deposition temperature of the silicon nitride layer is in a range of 80-85° C.

9. The display substrate according to claim 6, wherein a thickness of the silicon nitride layer is in a range of 50-100 Å.

10. The display substrate according to claim 6, wherein a material of the first reflective electrode comprises a metal material containing silver or aluminum.

11. The display substrate according to claim 10, wherein a thickness of the first reflective electrode is in a range of 300-500 Å.

12. The display substrate according to claim 6, wherein a surface roughness of a structure including the first reflective electrode, the silicon nitride layer and the first electrode layer is less than 3.0 nm.

13. The display substrate according to claim 1, wherein the pixel sub-circuit comprises a driving circuit, a voltage transmission circuit and a data writing circuit;
the driving circuit comprises a control terminal, a first terminal and a second terminal;
the voltage transmission circuit is configured to apply a reset voltage and a first power voltage to the first terminal of the driving circuit respectively in response to a transmission control signal;
the data writing circuit is configured to write a data signal to the control terminal of the driving circuit in response to a scan signal and store the written data signal;
the driving circuit is configured to control a voltage on the second terminal of the driving circuit based on the data signal on the control terminal of the driving circuit and a voltage on the first terminal of the driving circuit, and generate a driving current for driving the light-emitting element to emit light based on the voltage on the second terminal of the driving circuit; and
the data writing circuit comprises two switching transistors of different types.

14. The display substrate according to claim 13, wherein the array circuit layer further comprises a voltage control circuit located in the peripheral area of the array substrate, and the voltage control circuit is configured to supply the reset voltage to the voltage transmission circuit in response to a reset control signal and supply the first power voltage to the voltage transmission circuit in response to a light-emitting control signal.

15. The display substrate according to claim 14, wherein the voltage control circuit comprises a first control sub-circuit and a second control sub-circuit,
the first control sub-circuit is configured to apply the reset voltage to the voltage transmission circuit in response to the reset control signal, and
the second control sub-circuit is configured to apply the first power voltage to the voltage transmission circuit in response to the light-emitting control signal.

16. The display substrate according to claim 15, wherein the first control sub-circuit comprises a first switching transistor, and the second control sub-circuit comprises a second switching transistor;
a gate electrode of the first switching transistor is connected to a reset control signal terminal to receive the reset control signal, a first electrode of the first switching transistor is connected to a reset voltage terminal to receive the reset voltage, and the second electrode of the first switching transistor is connected to a first node; and a gate electrode of the second switching transistor is connected to a light-emitting control signal terminal to receive the light-emitting control signal, a first electrode of the second switching transistor is connected to a first power supply terminal to receive the first power voltage, and the second electrode of the second switching transistor is connected to the first node.

17. The display substrate according to claim 16, wherein the voltage transmission circuit comprises a third switching transistor, a gate electrode of the third switching transistor is connected to a transmission control signal terminal to receive the transmission control signal, a first electrode of the third switching transistor is connected to the first node, and a second electrode of the third switching transistor is connected to a second node.

18. The display substrate according to claim 17, wherein the driving circuit further comprises the driving transistor, a gate electrode of the driving transistor is served as the control terminal of the driving circuit to be connected to a fourth node, a first electrode of the driving transistor is served as the first terminal of the driving circuit to be connected to the second node, and the second electrode of the driving transistor is served as the second terminal of the driving circuit to be connected to a third node.

19. The display substrate according to claim 18, wherein the two switching transistors of different types in the data writing circuit comprise a fourth switching transistor and a fifth transistor, and the data writing circuit further comprises a storage capacitor;

a gate electrode of the fourth switching transistor is connected to a scan signal terminal to receive the scan signal, a first electrode of the fourth switching transistor is connected to a data signal terminal to receive the data signal, and a second electrode of the fourth switching transistor is connected to the fourth node;

a gate electrode of the fifth switching transistor is configured to receive an inverted signal of the scan signal, a first electrode of the fifth switching transistor is connected to the data signal terminal to receive the data signal, and a second electrode of the fifth switching transistor is connected to the fourth node; and a first terminal of the storage capacitor is connected to the fourth node, and a second terminal of the storage capacitor is connected to a first voltage terminal to receive a first voltage.

20. The display substrate according to claim 19, wherein a first electrode layer of the light-emitting element is coupled to the third node, and a second electrode layer of the light-emitting element is connected to a second power supply terminal to receive a second power voltage.

21. The display substrate according to claim 19, wherein the pixel sub-circuit further comprises: a current transmission circuit, wherein the current transmission circuit is configured to transmit the driving current generated by the driving circuit to the light-emitting element.

22. The display substrate according to claim 21, wherein the current transmission circuit comprises a sixth switching transistor;

a gate electrode of the sixth switching transistor is connected to a second voltage terminal to receive a second voltage, a first electrode of the sixth switching transistor is connected to the third node, and a second electrode of the sixth switching transistor is coupled to a first electrode layer of the light-emitting element, and the second electrode layer of the light-emitting element is connected to a second power terminal to receive a second power supply voltage; and the sixth switching transistor is substantially maintained in an on state under control of the second voltage.

23. The display substrate according to claim 1, wherein the pixel sub-circuit comprises a driving transistor, a first transistor, and a second transistor;

the driving transistor comprises a control electrode, a first electrode, and a second electrode, and is configured to control a driving current passing through a first electrode of the driving transistor and a second electrode of the driving transistor for driving the light-emitting element to emit light based on a voltage on the control electrode of the driving transistor;

the first transistor is connected to the control electrode of the driving transistor, and is configured to write the data signal to the control electrode of the driving transistor in response to a first scan signal;

the second transistor is connected to the control electrode of the driving transistor, and is configured to write the data signal to the control electrode of the driving transistor in response to a second scan signal; and a direction from a first electrode of the first transistor to a second electrode of the first transistor is a first direction, and a direction from a first electrode of the second transistor to a second electrode of the second transistor is a second direction, a direction from the first electrode of the driving transistor to the second electrode of the driving transistor is a fourth direction, wherein at least one selected from the group consisting of the first direction and the second direction is intersected with the fourth direction.

24. The display substrate according to claim 23, wherein both the first direction and the second direction are intersected with the fourth direction.

25. The display substrate according to claim 24, wherein the first direction and the second direction are both perpendicular to the fourth direction.

26. The display substrate according to claim 23, wherein the pixel circuit further comprises a third transistor connected to the first electrode of the driving transistor and configured to apply a first power voltage to the first electrode of the driving transistor in response to a light-emitting control signal, and a direction from a first electrode of the third transistor to a second electrode of the third transistor is a third direction.

27. The display substrate according to claim 26, wherein the first direction, the second direction and the third direction are all perpendicular to the fourth direction.

28. The display substrate according to claim 26, wherein the first transistor comprises a first active region extending along the first direction, the second transistor comprises a second active region extending along the second direction, and the third transistor comprises a third active region extending along the third direction, and the driving transistor comprises a fourth active region extending along the fourth direction.

29. The display substrate according to claim 28, wherein the base substrate comprises a silicon-based base substrate, the first active region, the second active region, the third active region and the fourth active region are all doped regions in the silicon-based substrate.

30. The display device according to claim 29, wherein a doping type of the first active region is opposite to that of the second active region.

31. The display substrate according to claim 28, wherein
a line connecting one edge of the first active region in the first direction with one edge of the second active region in the second direction is parallel with the fourth direction; and
a line connecting the other edge of the first active region in the first direction with the other edge of the second active region in the second direction is parallel with the fourth direction.

32. The display substrate according to claim 23, wherein
the first transistor comprises a first doped region in contact with the first electrode of the first transistor and a second doped region in contact with the second electrode of the first transistor, and the first doped region of the first transistor and the second doped region of the first transistor are spaced apart from each other, have the same doping type, and are both located inside the monocrystalline silicon layer;
the first transistor further comprises a drift doped region in contact with the first doped region, and the drift doped region of the first transistor and the second doped region of the first transistor are spaced apart from each other, have the same doping type, and are both located inside the monocrystalline silicon layer;
an orthographic projection of the gate electrode of the first transistor on the base substrate is partially overlapped with an orthographic projection of the drift doped region of the first transistor on the base substrate, and the orthographic projection of the first doped region on the base substrate is located in the orthographic projection of the drift doped region of the first transistor on the base substrate; and
a doping concentration of the drift doped region of the first transistor is lower than that of the first doped region of the first transistor.

33. The display substrate according to claim 32, wherein the first insulating layer comprises a first portion close to the first doped region of the first transistor and a second portion away from the second doped region of the first transistor.

34. The display substrate according to claim 33, wherein a thickness of the first portion of the first insulating layer is greater than that of the second portion of the first insulating layer, and the thickness is a thickness in a direction perpendicular to the base substrate.

35. The display substrate according to claim 23, wherein the first transistor comprises a first active region, the second transistor comprises a second active region, the driving transistor comprises a fourth active region, and a doping concentration of a channel region of at least one selected from the group consisting of the first active region and the second active region is greater than that of a channel region of the fourth active region.

36. The display substrate according to claim 35, wherein a doping concentration of a channel region of each of the first active region and the second active region is greater than that of the channel region of the fourth active region.

37. The display substrate according to claim 35, wherein
the pixel sub-circuit further comprises a third transistor connected to the first electrode of the driving transistor and configured to apply a first power voltage to the first electrode of the driving transistor in response to a light-emitting control signal; and
the third transistor comprises a third active region, and a doping concentration of a channel region of the fourth active region is less than that of the channel region of the third active region.

38. The display substrate according to claim 37, wherein the channel region of the fourth active region has a doping concentration 4 orders of magnitude less than that of the channel region of the third active region.

39. The display substrate according to claim 38, wherein the doping concentration of the channel region of the third active region is in a range from $1 \times 10^{17}$ $cm^{-3}$ to $9 \times 10^{17}$ $cm^{-3}$, and the doping concentration of the channel region of the fourth active region is in a range from $1 \times 10^{13}$ $cm^{-3}$ to $9 \times 10^{13}$ $cm^{-3}$.

40. The display substrate according to claim 38, wherein the doping concentration of the channel region of each of the first active region and the second active region is three orders of magnitude greater than that of the third active region.

41. The display substrate according to claim 40, wherein the doping concentration of the channel region of the third active region is in a range from $1 \times 10^{17}$ $cm^{-3}$ to $9 \times 10^{17}$ $cm^{-3}$, and the doping concentration of the channel region of each of the first active region and the second active region is in a range from $1 \times 10^{20}$ $cm^{-3}$ to $9.9 \times 10^{20}$ $cm^{-3}$.

42. The display substrate according to claim 1, wherein each of the plurality of transistors has a channel width less than 5 nm.

43. The display substrate according to claim 1, further comprising a planarization layer covering the second conductive layer and the second insulating layer, the light-emitting elements are disposed a side of the planarization layer away from the base substrate, and an anode electrode of each of the light-emitting elements is connected to a source or drain electrode of at least one of the plurality of transistors through a second via in the planarization layer.

44. A display device, comprising the display substrate according to claim 1 and a cover plate at a side of the light-emitting elements away from the base substrate.

* * * * *